(12) United States Patent
Hidaka

(10) Patent No.: US 7,839,958 B2
(45) Date of Patent: Nov. 23, 2010

(54) SYSTEM AND METHOD FOR THE ADJUSTMENT OF COMPENSATION APPLIED TO A SIGNAL

(75) Inventor: Yasuo Hidaka, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 819 days.

(21) Appl. No.: 11/753,139

(22) Filed: May 24, 2007

(65) Prior Publication Data

US 2007/0280342 A1   Dec. 6, 2007

Related U.S. Application Data

(60) Provisional application No. 60/803,451, filed on May 30, 2006.

(51) Int. Cl.
*H04B 1/10* (2006.01)

(52) U.S. Cl. .................................................. 375/350

(58) Field of Classification Search ......... 375/229–236; 333/18, 28 R; 708/300, 322, 323; 379/340, 379/398

See application file for complete search history.

(56) References Cited

U.S. PATENT DOCUMENTS

| | | |
|---|---|---|
| 3,813,609 A | 5/1974 | Wilkes et al. |
| 3,864,632 A | 2/1975 | Chang |
| 4,186,384 A | 1/1980 | Acker |
| 4,389,636 A | 6/1983 | Riddle, Jr. |
| 4,550,415 A | 10/1985 | Debus, Jr. et al. |
| 4,577,329 A | 3/1986 | Brie et al. |
| 4,669,092 A | 5/1987 | Sari et al. |

(Continued)

FOREIGN PATENT DOCUMENTS

EP   0 213 309 A2   3/1987

(Continued)

OTHER PUBLICATIONS

Notice Requesting Submission of Opinion, (translation) from office communication from Lee International, Attorneys, Seoul, Korea, 2 pages, Sep. 29, 2006.

(Continued)

*Primary Examiner*—Sam K Ahn
(74) *Attorney, Agent, or Firm*—Baker Botts L.L.P.

(57) ABSTRACT

In one embodiment of the present invention, a method for adjusting a signal includes applying at least one of a loss compensation for frequency-dependent distortion and an offset compensation for DC-offset distortion to a signal before or after the distortion occurs to generate an output signal, the output signal comprising even phase and odd phase. The method also includes selecting either the even phase or the odd phase at which to begin sampling. The method further includes, using a clock signal, beginning at the selected phase, sampling the output signal to generate a plurality of data values and an error value, the error value indicating residue of the distortion based on the sampling of the output signal. The method also includes adjusting none, one, or more of the loss compensation and the offset compensation applied to the signal based on the sampled error value. The method further includes, after adjusting the at least one of the loss compensation and the offset compensation applied to the signal based on the sampled error value, selecting either the even phase or the odd phase at which to begin the next sampling.

44 Claims, 36 Drawing Sheets

U.S. PATENT DOCUMENTS

| | | | |
|---|---|---|---|
| 4,701,923 | A | 10/1987 | Fukasawa et al. |
| 4,825,174 | A | 4/1989 | Vella-Coleiro |
| 4,873,702 | A | 10/1989 | Chiu |
| 5,010,558 | A | 4/1991 | Yost et al. |
| 5,153,875 | A | 10/1992 | Takatori |
| 5,353,306 | A | 10/1994 | Yamamoto |
| 5,570,396 | A | 10/1996 | Bergman et al. |
| 5,598,432 | A | 1/1997 | Wei |
| 5,764,103 | A | 6/1998 | Burra et al. |
| 5,841,388 | A | 11/1998 | Yasuda et al. |
| 5,841,810 | A | 11/1998 | Wong et al. |
| 5,955,918 | A | 9/1999 | Uno |
| 6,087,897 | A | 7/2000 | Wang |
| 6,130,581 | A | 10/2000 | Nevin |
| 6,182,264 | B1 | 1/2001 | Ott |
| 6,185,251 | B1 | 2/2001 | Fertner |
| 6,243,841 | B1 | 6/2001 | Mydill |
| 6,263,018 | B1 | 7/2001 | Lee |
| 6,301,298 | B1 | 10/2001 | Kuntz et al. |
| 6,393,502 | B1 | 5/2002 | Meyer et al. |
| 6,449,320 | B1 | 9/2002 | Lindoff |
| 6,563,868 | B1 | 5/2003 | Zhang et al. |
| 6,704,059 | B2 | 3/2004 | Kim |
| 6,735,259 | B1 | 5/2004 | Roberts et al. |
| 6,756,924 | B2 | 6/2004 | Lee et al. |
| 6,757,334 | B1 | 6/2004 | Feher |
| 6,778,602 | B2 | 8/2004 | Agazzi et al. |
| 6,788,749 | B2 | 9/2004 | Voorman et al. |
| 6,834,035 | B1 | 12/2004 | Marukawa et al. |
| 6,897,700 | B1 | 5/2005 | Fu et al. |
| 6,904,084 | B2 | 6/2005 | Huang et al. |
| 6,934,345 | B2 | 8/2005 | Chu et al. |
| 6,944,244 | B2 | 9/2005 | Belotserkovsky |
| 6,952,444 | B1 | 10/2005 | Segal et al. |
| 6,956,917 | B2 | 10/2005 | Lenosky |
| 7,023,912 | B2 | 4/2006 | Orlik et al. |
| 7,034,608 | B2 | 4/2006 | Gai et al. |
| 7,092,676 | B2 | 8/2006 | Abdelgany et al. |
| 7,110,448 | B2 | 9/2006 | Bergmans et al. |
| 7,139,342 | B1 | 11/2006 | Phanse |
| 7,173,965 | B2 | 2/2007 | Koyanagi et al. |
| 7,289,555 | B2 | 10/2007 | Hidaka |
| 7,295,605 | B2 | 11/2007 | Gai et al. |
| 7,324,589 | B2 | 1/2008 | Hidaka |
| 7,339,990 | B2 | 3/2008 | Hidaka |
| 2001/0043649 | A1 | 11/2001 | Farjad-Rad |
| 2003/0026334 | A1 | 2/2003 | Chang et al. |
| 2004/0021595 | A1 | 2/2004 | Erdogan et al. |
| 2004/0047405 | A1* | 3/2004 | Boesel et al. ............... 375/219 |
| 2004/0114670 | A1 | 6/2004 | Cranford et al. |
| 2004/0151239 | A1 | 8/2004 | Koyanagi et al. |
| 2004/0151240 | A1 | 8/2004 | Hidaka |
| 2004/0151268 | A1 | 8/2004 | Hidaka |
| 2004/0153898 | A1 | 8/2004 | Hidaka |
| 2004/0156432 | A1 | 8/2004 | Hidaka |
| 2005/0008070 | A1 | 1/2005 | Wang et al. |
| 2005/0047500 | A1 | 3/2005 | Gupta et al. |
| 2005/0117679 | A1* | 6/2005 | Paul et al. ................... 375/354 |
| 2005/0175080 | A1 | 8/2005 | Bouillett |
| 2005/0184801 | A1 | 8/2005 | Gai et al. |
| 2005/0185710 | A1 | 8/2005 | Gai et al. |
| 2005/0226355 | A1 | 10/2005 | Kibune et al. |
| 2005/0238092 | A1 | 10/2005 | Ng |
| 2005/0254565 | A1 | 11/2005 | Sivadas et al. |
| 2006/0233291 | A1* | 10/2006 | Garlepp et al. .............. 375/355 |
| 2007/0110147 | A1 | 5/2007 | Koyanagi et al. |
| 2007/0280341 | A1 | 12/2007 | Hidaka |
| 2007/0280342 | A1 | 12/2007 | Hidaka |
| 2007/0280383 | A1 | 12/2007 | Hidaka |
| 2007/0280384 | A1 | 12/2007 | Hidaka |
| 2007/0280389 | A1 | 12/2007 | Hidaka |
| 2007/0280390 | A1 | 12/2007 | Hidaka |
| 2007/0280391 | A1 | 12/2007 | Hidaka |
| 2007/0297209 | A1 | 12/2007 | Hidaka |
| 2007/0297248 | A1 | 12/2007 | Hidaka |
| 2007/0300119 | A1 | 12/2007 | Hidaka |
| 2008/0056344 | A1 | 3/2008 | Hidaka |
| 2009/0175326 | A1* | 7/2009 | Stojanovic et al. .......... 375/229 |

FOREIGN PATENT DOCUMENTS

| | | |
|---|---|---|
| EP | 1 115 216 A1 | 7/2001 |
| KR | 0154782 | 11/1998 |
| WO | WO 92/14323 A1 | 8/1992 |
| WO | WO 02/09374 A2 | 1/2002 |

OTHER PUBLICATIONS

Wikipedia, "Phase (Waves)," http://en.wikipedia.org/wiki/Phase_(Waves), pp. 1-3, printed Jan. 8, 2007.

Johns et al. "Integrated Circuits for Data Transmission Over Twisted-Pair Channels", IEEE Journal of Solid-State Circuits, vol. 32, No. 3, Mar. 1997, pp. 398-406, Mar. 3, 1997.

Azadet et al., WA 18.3 "A Gigabit Transceiver Chip Set for UTP CAT-6 Cables in Digital CMOS Technology", 2000 IEEE International Solid-State Circuits Conference, 9 pages, 2000.

Shakiba et al, "An Integrated 200-MHz 3.3-V BiCMOS Class-IV Partial-Response Analog Viterbi Decoder", IEEE Journal of Solid-State Circuits, vol. 33, No. 1, Jan. 1998, pp. 61-75.

Hidaka, Method and System for Processing a Sampled Signal, filed Feb. 5, 2003, U.S. Appl. No. 10/359,361, pending.

Hidaka, "Method and System for Providing Error Compensation to a Signal Using Feedback Control," filed Feb. 5, 2003, U.S. Appl. No. 10/359,332, pending.

Hidaka, "Method and System for Signal Processing Using Vector Output from Scalar Data," filed Feb. 5, 2003, U.S. Appl. No. 10/359,379, pending.

Hidaka, "Processing a Received Signal at a Detection Circuit," filed Feb. 7, 2003, U.S. Appl. No. 10/360,103, pending.

Koyanagi, "Equalizing a Signal for Transmission", filed Feb. 3, 2003, U.S. Appl. No. 10/357,691, pending.

Gai et al., "Adaptive Equalizer with DC Offset Compensation," filed Feb. 20, 2004, U.S. Appl. No. 10/783,170, pending.

Hidaka, "System and Method for Adjusting Compensation Applied to a Signal," filed May 24, 2007, U.S. Appl. No. 11/753,021, pending.

Hidaka, "System and Method for Independently Adjusting Multiple Compensation Applied to a Signal," filed May 24, 2007, U.S. Appl. No. 11/753,026, pending.

Hidaka, "System and Method for Adjusting Compensation Applied to a Signal," filed May 24, 2007, U.S. Appl. No. 11/753,042, pending.

Hidaka, "System and Method for Asymmetrically Adjusting Compensation Applied to a Signal," filed May 24, 2007, U.S. Appl. No. 11/753,050, pending.

Hidaka, "System and Method for the Non-Linear Adjustment of Compensation Applied to a Signal," filed May 24, 2007, U.S. Appl. No. 11/753,060, pending.

Hidaka, "System and Method for the Adjustment of Compensation Applied to a Signal Using Filter Patterns," filed May 24, 2007, U.S. Appl. No. 11/753,087, pending.

Hidaka, "System and Method for Adjusting Offset Compensation Applied to a Signal," filed May 24, 2007, U.S. Appl. No. 11/753,093, pending.

Hidaka, "System and Method for Adjustment of Offset Compensation," filed May 24, 2007, U.S. Appl. No. 11/753,101, pending.

Hidaka, "System and Method for Independently Adjusting Multiple Offset Compensation Applied to a Signal," filed May 24, 2007, U.S. Appl. No. 11/753,116, pending.

Hidaka, System and Method for Decoupling Multiple Control Loops, filed May 24, 2007, U.S. Appl. No. 11/753,164, pending.

Koyanagi et al., "Equalizing a Signal for Transmission," filed Dec. 29, 2006, U.S. Appl. No. 11/618,189, pending.

European Patent Office, European Search Report Application No. 07010680.2-1246, Mar. 11, 2008, 6 pages.

European Patent Office, European Search Report Application No. 07010682.8-1246, Mar. 25, 2008, 6 pages.

European Patent Office, European Search Report Application No. 07010681.0-1246, Mar. 26, 2008, 6 pages.

European Patent Office, European Search Report Application No. 07010683.6-1246, Mar. 19, 2008, 6 pages.

European Patent Office, Office Action for Application No. 07010681.0-1246/1862776, Apr. 11, 2008, 1 page.

European Patent Office, Office Action for Application No. 07010682.0-1246/1862777, Apr. 11, 2008, 1 page.

European Patent Office, "Communication Pursuant to Article 94(3) EPC" for Application No. 07010680.2-1246/1862766, Dec. 15, 2008, 1 page.

European Patent Office, "Communication Pursuant to Article 94(3) EPC" for Application No. 07010683.6-1246/1862778, Dec. 15, 2008, 1 page.

European Patent Office, "Communication Pursuant to Article 94(3) EPC" for Application No. 07010684.4-1246/1862779, Dec. 18, 2008, 1 page.

* cited by examiner

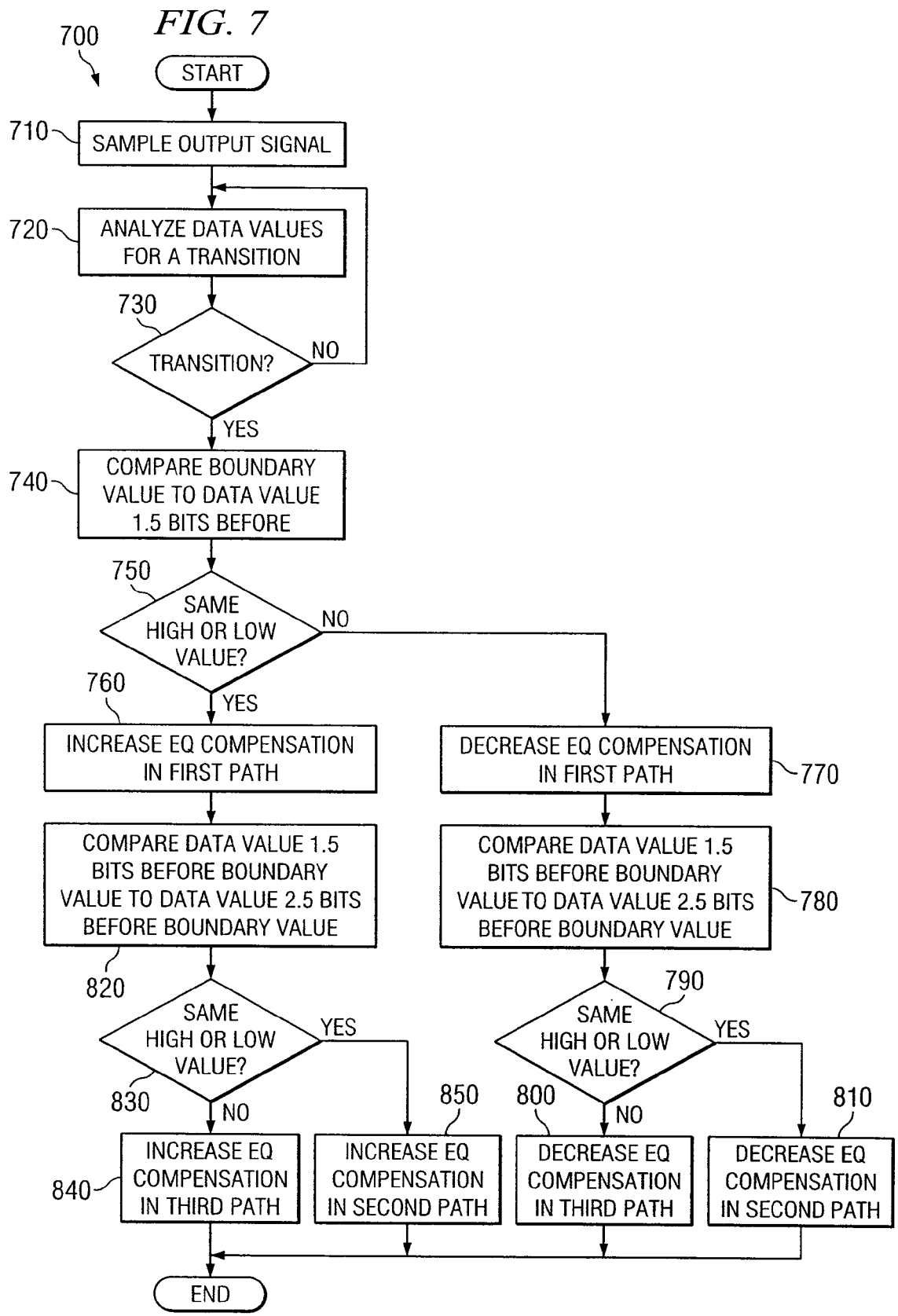

FIG. 8

| DATA PATTERN | | | | BOUNDARY VALUE AT E | UNMODIFIED COMPONENT | | FIRST-ORDER DERIVATIVE COMPONENT | | SECOND-ORDER DERIVATIVE COMPONENT | |
|---|---|---|---|---|---|---|---|---|---|---|
| D0 | D1 D2 E2 | E | D3 | | EQ LEVEL | ADAPTIVE EQ CONTROL ACTION | EQ LEVEL | ADAPTIVE EQ CONTROL ACTION | EQ LEVEL | ADAPTIVE EQ CONTROL ACTION |
| 0 | 0 0 E | E | 1 | 0 | LOW | INCREASE | LOW | INCREASE | | |
| 0 | 0 0 E | E | 0 | 1 | HIGH | DECREASE | HIGH | DECREASE | | |
| 0 | 0 1 E | E | 1 | 0 | LOW | INCREASE | LOW | INCREASE | | |
| 0 | 0 1 E | E | 0 | 1 | HIGH | DECREASE | HIGH | DECREASE | | |
| 1 | 0 0 E | E | 1 | 0 | LOW | INCREASE | | | LOW | INCREASE |
| 1 | 0 0 E | E | 0 | 1 | HIGH | DECREASE | | | HIGH | DECREASE |
| 0 | 1 1 E | E | 1 | 0 | LOW | INCREASE | | | LOW | INCREASE |
| 0 | 1 1 E | E | 0 | 1 | HIGH | DECREASE | | | HIGH | DECREASE |
| 1 | 0 1 E | E | 1 | 0 | LOW | INCREASE | | | HIGH | DECREASE |
| 1 | 0 1 E | E | 0 | 1 | HIGH | DECREASE | | | LOW | INCREASE |
| 0 | 1 0 E | E | 1 | 0 | LOW | INCREASE | | | HIGH | DECREASE |
| 0 | 1 0 E | E | 0 | 1 | HIGH | DECREASE | | | LOW | INCREASE |
| 1 | 1 0 E | E | 1 | 0 | HIGH | DECREASE | HIGH | DECREASE | | |
| 1 | 1 0 E | E | 0 | 1 | LOW | INCREASE | LOW | INCREASE | | |
| 1 | 1 1 E | E | 1 | 0 | HIGH | DECREASE | HIGH | DECREASE | | |
| 1 | 1 1 E | E | 0 | 1 | LOW | INCREASE | LOW | INCREASE | | |

FIG. 10

| DATA PATTERN | | | | BOUNDARY VALUE AT E | SECOND TAP COEFFICIENT | | THIRD TAP COEFFICIENT | |
|---|---|---|---|---|---|---|---|---|
| D0 | D1 | D2 | D3 | | COEFFICIENT | ADAPTIVE EQ CONTROL ACTION | COEFFICIENT | ADAPTIVE EQ CONTROL ACTION |
| 0 | 0 | E | 1 | 0 | HIGH | DECREASE | HIGH | DECREASE |
| 0 | 0 | E | 1 | 1 | LOW | INCREASE | LOW | INCREASE |
| 0 | 1 | E | 1 | 0 | HIGH | DECREASE | HIGH | DECREASE |
| 0 | 1 | E | 1 | 1 | LOW | INCREASE | LOW | INCREASE |
| 1 | 0 | E | 1 | 0 | | | LOW | INCREASE |
| 1 | 0 | E | 1 | 1 | | | HIGH | DECREASE |
| 1 | 1 | E | 1 | 0 | | | LOW | INCREASE |
| 1 | 1 | E | 1 | 1 | | | HIGH | DECREASE |
| 0 | 0 | E | 0 | 0 | | | HIGH | DECREASE |
| 0 | 0 | E | 0 | 1 | | | LOW | INCREASE |
| 0 | 1 | E | 0 | 0 | LOW | INCREASE | LOW | INCREASE |
| 0 | 1 | E | 0 | 1 | HIGH | DECREASE | HIGH | DECREASE |
| 1 | 0 | E | 0 | 0 | LOW | INCREASE | LOW | INCREASE |
| 1 | 0 | E | 0 | 1 | HIGH | DECREASE | HIGH | DECREASE |

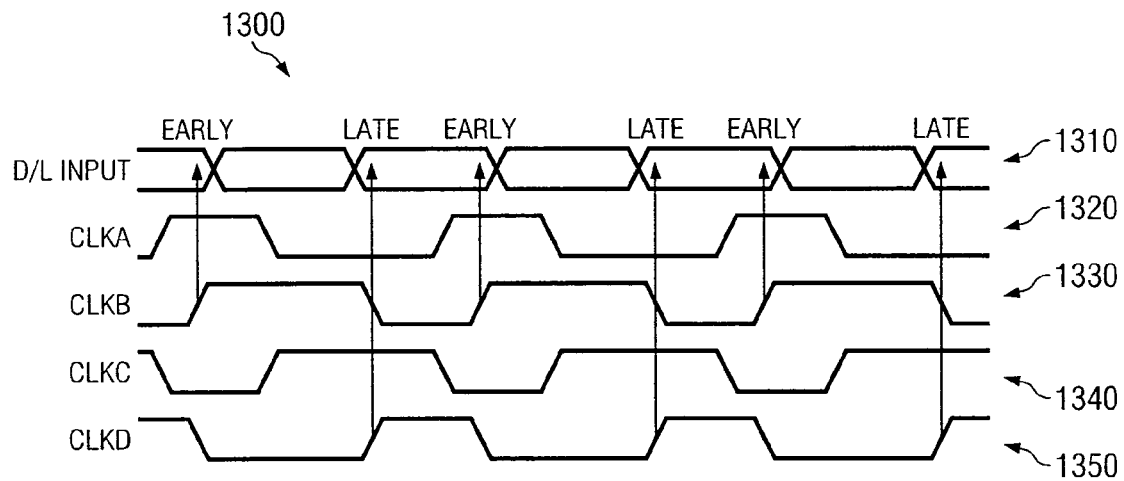

FIG. 11

| DATA PATTERN | | | | BOUNDARY VALUE AT E | DC-PATH OFFSET | | FIRST-ORDER PATH OFFSET | |
|---|---|---|---|---|---|---|---|---|
| D0 | D1 | E1 | D2 | | RESIDUAL OFFSET | CANCELLER ACTION | RESIDUAL OFFSET | CANCELLER ACTION |
| 0 | 0 | E | 1 | 0 | | | NEGATIVE | MAKE IT POSITIVE |
| 0 | 0 | E | 1 | 1 | | | POSITIVE | MAKE IT NEGATIVE |
| 1 | 0 | E | 1 | 0 | NEGATIVE | MAKE IT POSITIVE | NEGATIVE | MAKE IT POSITIVE |
| 1 | 0 | E | 1 | 1 | POSITIVE | MAKE IT NEGATIVE | POSITIVE | MAKE IT NEGATIVE |
| 0 | 1 | E | 0 | 0 | NEGATIVE | MAKE IT POSITIVE | NEGATIVE | MAKE IT POSITIVE |
| 0 | 1 | E | 0 | 1 | POSITIVE | MAKE IT NEGATIVE | POSITIVE | MAKE IT NEGATIVE |
| 1 | 1 | E | 0 | 0 | | | NEGATIVE | MAKE IT POSITIVE |
| 1 | 1 | E | 0 | 1 | | | POSITIVE | MAKE IT NEGATIVE |

FIG. 32

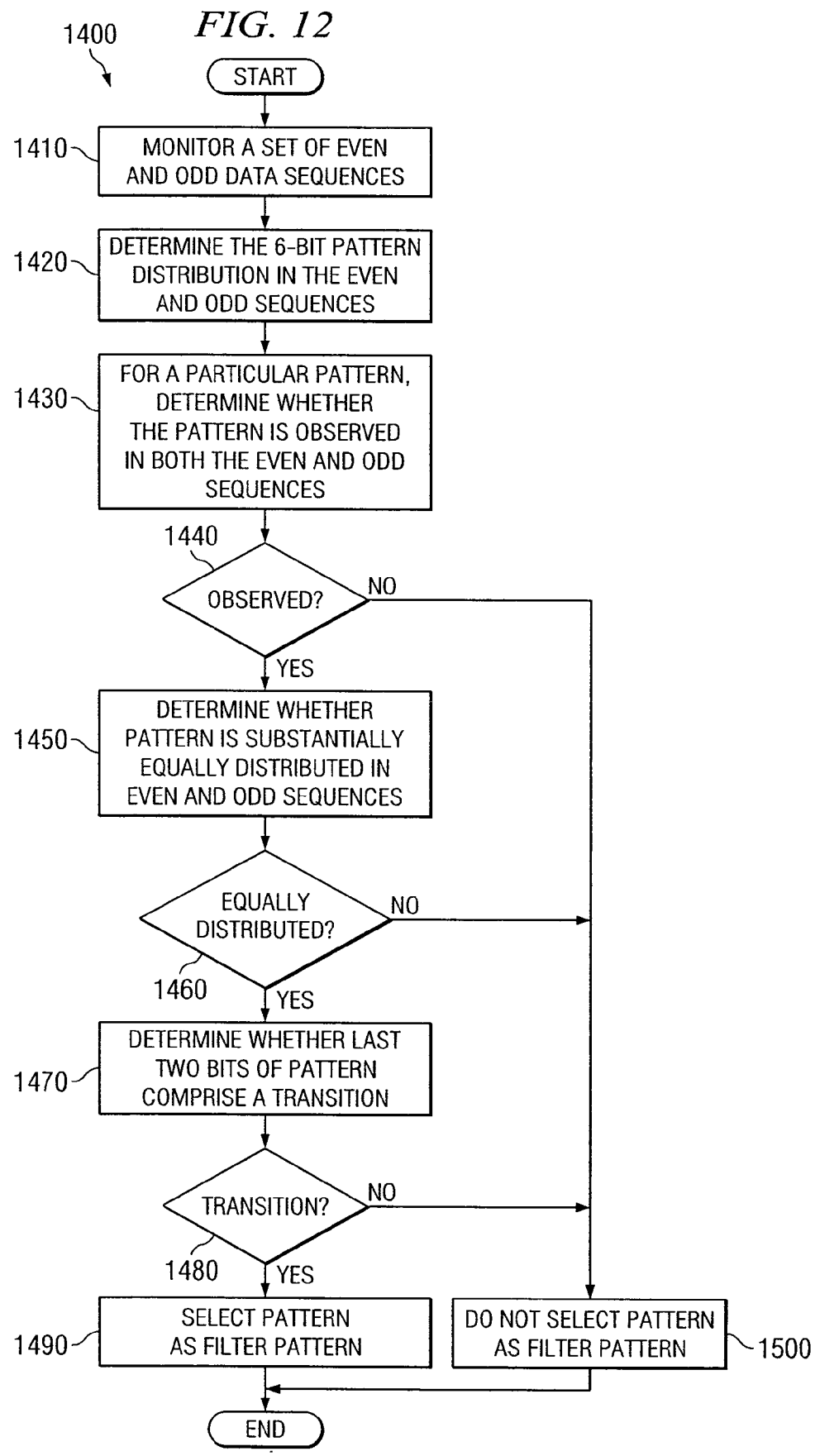

| PATTERN | EVEN | ODD |
|---|---|---|
| 000011 | 5.612% | |
| 100011 | | |
| 010011 | 4.796% | |
| 110011 | 0.408% | |
| 001011 | 4.796% | |
| 101011 | 4.796% | |
| 011011 | | |
| 111011 | | |
| 000111 | | 5.204% |
| 100111 | | 5.204% |
| 010111 | | 4.796% |
| 110111 | | |
| 001111 | 10.408% | |
| 101111 | 4.796% | |
| 011111 | | 4.796% |
| 111111 | | |
| SUB TOTAL | 35.612% | 20.000% |

| PATTERN | EVEN | ODD |
|---|---|---|
| 000001 | 4.796% | |
| 100001 | | 10.408% |
| 010001 | | |
| 110001 | | |
| 001001 | | 4.796% |
| 101001 | | |
| 011001 | | |
| 111001 | | 0.408% |
| 000101 | 4.796% | 4.796% |
| 100101 | | |
| 010101 | | |
| 110101 | | 4.796% |
| 001101 | | |
| 101101 | | |
| 011101 | 4.796% | |
| 111101 | | 4.796% |
| SUB TOTAL | 14.388% | 30.000% |

| PATTERN | EVEN | ODD |
|---|---|---|
| 000010 | 4.796% | 4.796% |
| 100010 | | |
| 010010 | | |
| 110010 | | 4.796% |
| 001010 | | |
| 101010 | | 4.796% |
| 011010 | | |
| 111010 | 4.796% | 4.796% |
| 000110 | | 0.408% |
| 100110 | | |
| 010110 | | 4.796% |
| 110110 | | |
| 001110 | | |
| 101110 | | |
| 011110 | 4.796% | |
| 111110 | | 10.408% |
| SUB TOTAL | 14.388% | 30.000% |

1610 PATTERN, 1620 EVEN, 1630 ODD

| PATTERN | EVEN | ODD |
|---|---|---|
| 000000 | | |
| 100000 | | 4.796% |
| 010000 | 4.796% | |
| 110000 | 10.408% | |
| 001000 | | 4.796% |
| 101000 | | 5.204% |
| 011000 | | 5.204% |
| 111000 | | |
| 000100 | 4.796% | |
| 100100 | 4.796% | |
| 010100 | 0.408% | |
| 110100 | 4.796% | |
| 001100 | | |
| 101100 | | |
| 011100 | | |
| 111100 | 5.612% | |
| SUB TOTAL | 35.612% | 20.000% |

FIG. 14

| DATA PATTERN | | | | | | | BOUNDARY VALUE AT E | UNMODIFIED COMPONENT | | FIRST-ORDER COMPONENT | | SECOND-ORDER COMPONENT | |
|---|---|---|---|---|---|---|---|---|---|---|---|---|---|
| D0 | D1 | D2 | D3 | D4 | E4 | D5 | | EQ LEVEL | ADAPTIVE ACTION | EQ LEVEL | ADAPTIVE ACTION | EQ LEVEL | ADAPTIVE ACTION |
| 0 | 0 | 0 | 0 | 1 | E | 0 | 0 | LOW | INCREASE | LOW | INCREASE | | |
| 1 | 1 | 1 | 1 | 0 | E | 1 | 1 | HIGH | DECREASE | HIGH | DECREASE | | |
| 0 | 0 | 0 | 1 | 0 | E | 1 | 0 | HIGH | DECREASE | HIGH | DECREASE | | |
| 1 | 1 | 1 | 0 | 1 | E | 0 | 1 | LOW | INCREASE | LOW | INCREASE | | |
| | | | | | | | 0 | HIGH | DECREASE | | | HIGH | DECREASE |
| | | | | | | | 1 | LOW | INCREASE | | | LOW | INCREASE |
| | | | | | | | 0 | LOW | INCREASE | | | LOW | INCREASE |
| | | | | | | | 1 | HIGH | DECREASE | | | HIGH | DECREASE |

| PATTERN | EVEN | ODD |
|---|---|---|
| 000000 | | |
| 100000 | 0.372% | |
| 010000 | | 0.372% |
| 110000 | 0.053% | 7.021% |
| 001000 | 0.372% | |
| 101000 | | 0.426% |
| 011000 | 14.415% | 7.021% |
| 111000 | | 0.372% |
| 000100 | | |
| 100100 | | |
| 010100 | | |
| 110100 | 0.851% | |
| 001100 | 0.053% | |
| 101100 | 0.426% | |
| 011100 | 7.021% | 7.340% |
| 111100 | | 7.074% |
| SUB TOTAL | 23.564% | 29.628% |

1810 → PATTERN
1820 → EVEN
1830 → ODD

| PATTERN | EVEN | ODD |
|---|---|---|
| 000010 | 0.426% | |
| 100010 | 0.372% | 0.053% |
| 010010 | 0.479% | |
| 110010 | 0.053% | |
| 001010 | 0.106% | |
| 101010 | 21.277% | 0.106% |
| 011010 | | 0.745% |
| 111010 | | 0.053% |
| 000110 | | |
| 100110 | | 0.957% |
| 010110 | | 7.394% |
| 110110 | | |
| 001110 | 7.340% | |
| 101110 | | |
| 011110 | 7.074% | |
| 111110 | | 0.372% |
| SUB TOTAL | 37.128% | 9.681% |

| PATTERN | EVEN | ODD |
|---|---|---|
| 000001 | | 0.372% |
| 100001 | 7.021% | 0.053% |
| 010001 | | |
| 110001 | 7.394% | 7.394% |
| 001001 | | |
| 101001 | | 0.851% |
| 011001 | | 0.053% |
| 111001 | | |
| 000101 | 0.053% | 0.798% |
| 100101 | | 0.160% |
| 010101 | | 21.383% |
| 110101 | | |
| 001101 | | |
| 101101 | 0.532% | |
| 011101 | 0.372% | |
| 111101 | 0.372% | |
| SUB TOTAL | 15.745% | 31.064% |

1800

| PATTERN | EVEN | ODD |
|---|---|---|
| 000011 | | 7.021% |
| 100011 | 7.021% | 7.340% |
| 010011 | 0.372% | |
| 110011 | | |
| 001011 | 0.851% | 0.053% |
| 101011 | 0.106% | |
| 011011 | | 0.426% |
| 111011 | | |
| 000111 | 14.362% | 6.968% |
| 100111 | | 0.372% |
| 010111 | 0.053% | |
| 110111 | 0.426% | |
| 001111 | | 6.968% |
| 101111 | | 0.479% |
| 011111 | 0.372% | |
| 111111 | | |
| SUB TOTAL | 23.564% | 29.628% |

| DATA PATTERN | | | | | | BOUNDARY VALUE AT E | UNMODIFIED COMPONENT | | FIRST-ORDER COMPONENT | | SECOND-ORDER COMPONENT | |
|---|---|---|---|---|---|---|---|---|---|---|---|---|
| D0 | D1 | D2 | D3 | D4 E4 | D5 | | EQ LEVEL | ADAPTIVE ACTION | EQ LEVEL | ADAPTIVE ACTION | EQ LEVEL | ADAPTIVE ACTION |
| 1 | 1 | 0 | 0 | E | 1 | 0 | LOW | INCREASE | LOW | INCREASE | | |
|   |   |   |   |   |   | 1 | HIGH | DECREASE | HIGH | DECREASE | | |
| 0 | 0 | 1 | 1 | E | 0 | 0 | HIGH | DECREASE | HIGH | DECREASE | | |
|   |   |   |   |   |   | 1 | LOW | INCREASE | LOW | INCREASE | | |
| 0 | 0 | 0 | 1 | E | 1 | 0 | HIGH | DECREASE | | | HIGH | DECREASE |
|   |   |   |   |   |   | 1 | LOW | INCREASE | | | LOW | INCREASE |
| 1 | 1 | 1 | 0 | E | 0 | 0 | LOW | INCREASE | | | LOW | INCREASE |
|   |   |   |   |   |   | 1 | HIGH | DECREASE | | | HIGH | DECREASE |

*FIG. 16*

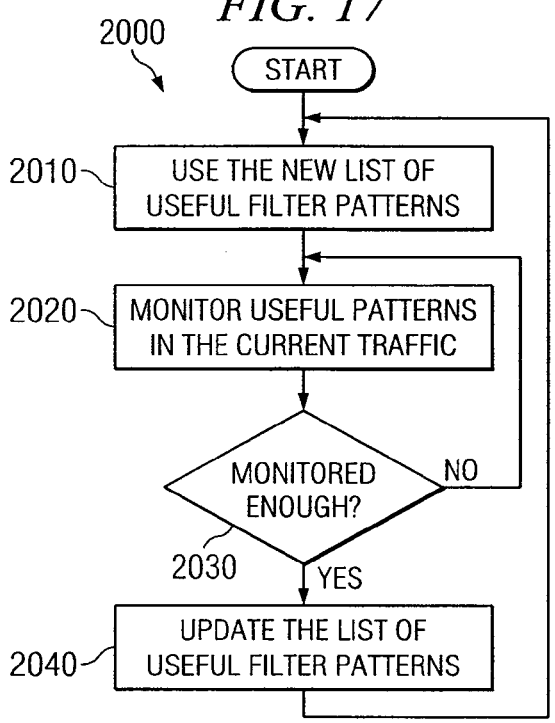
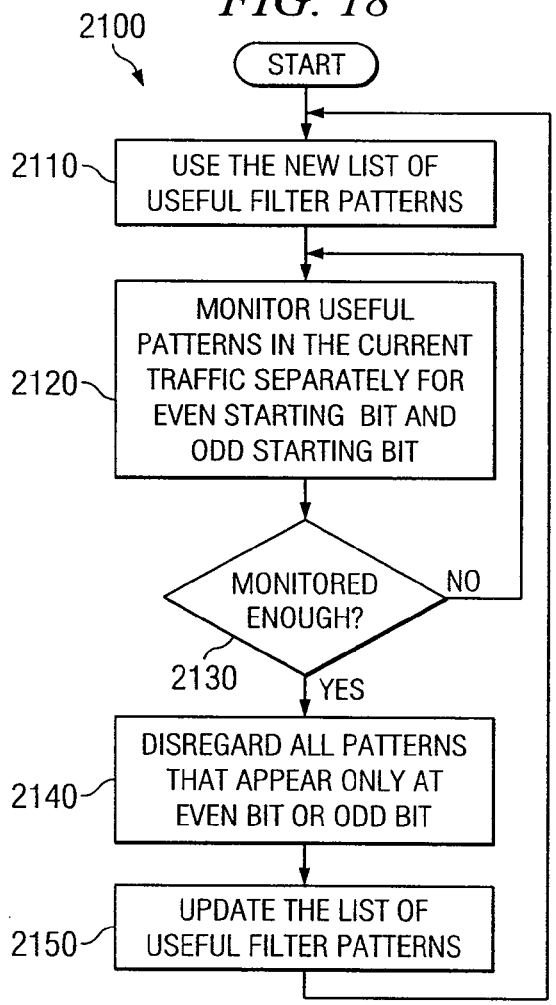

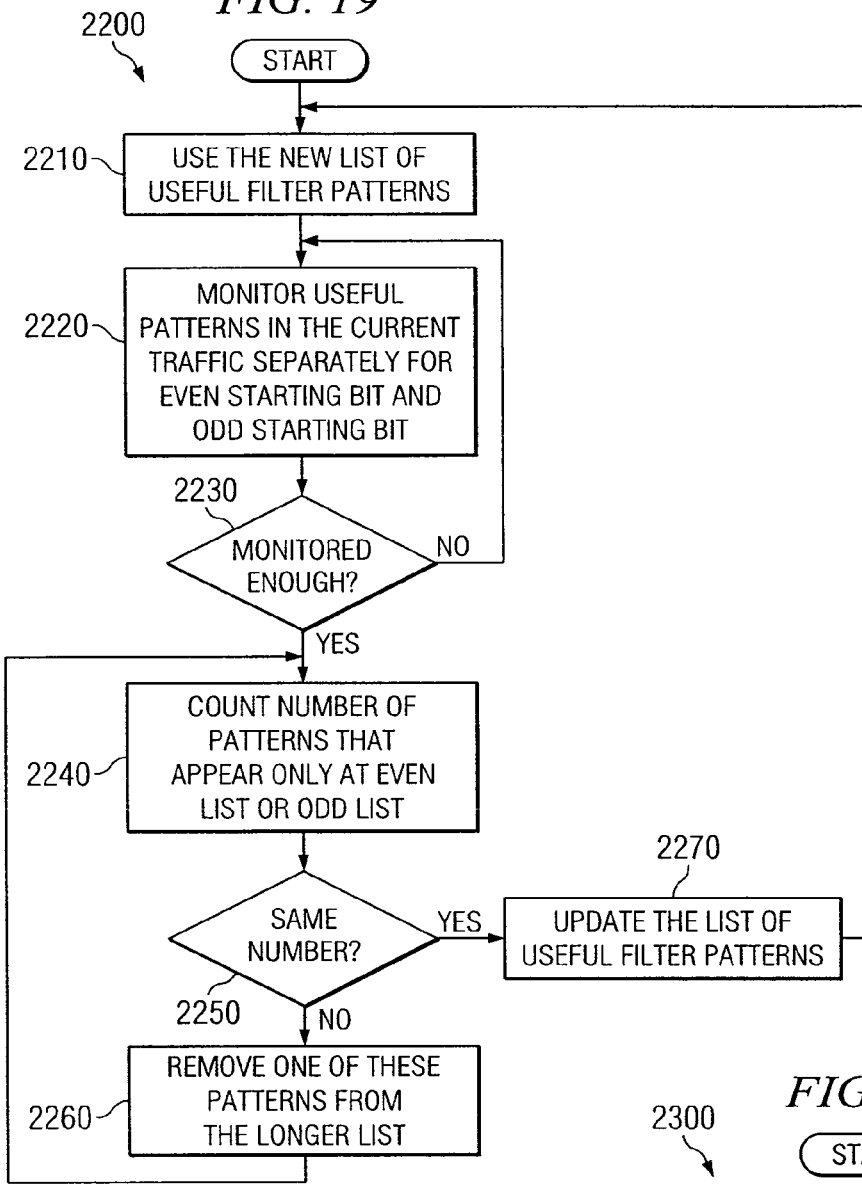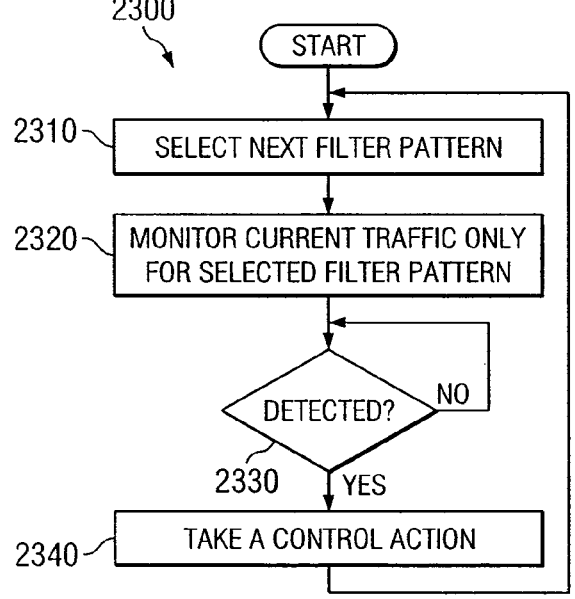

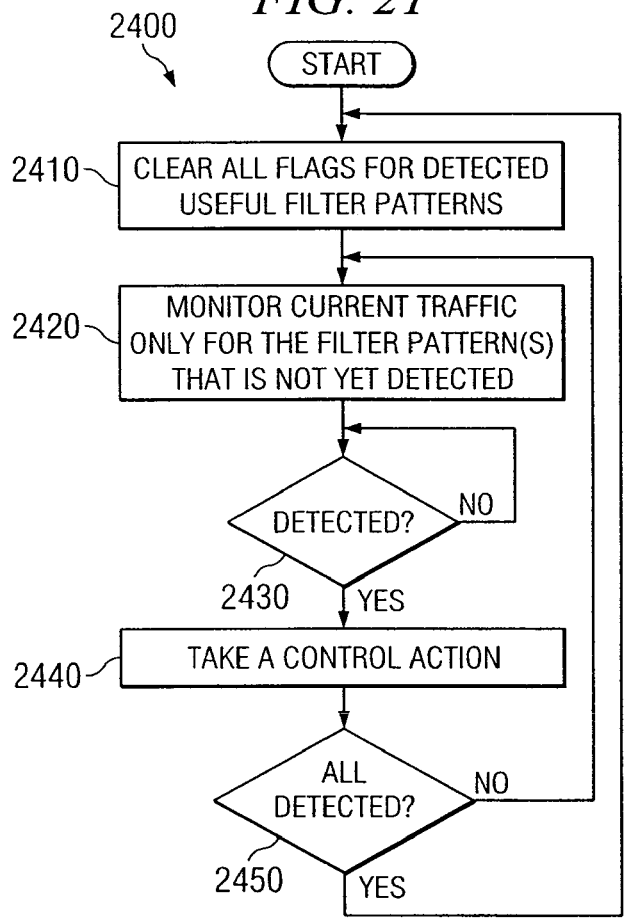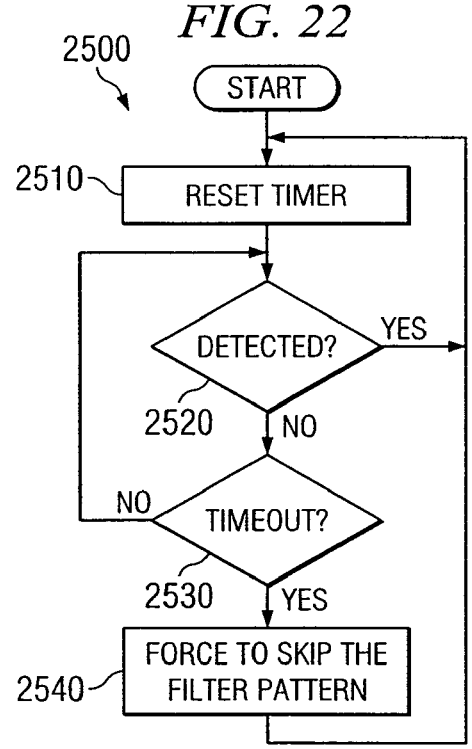

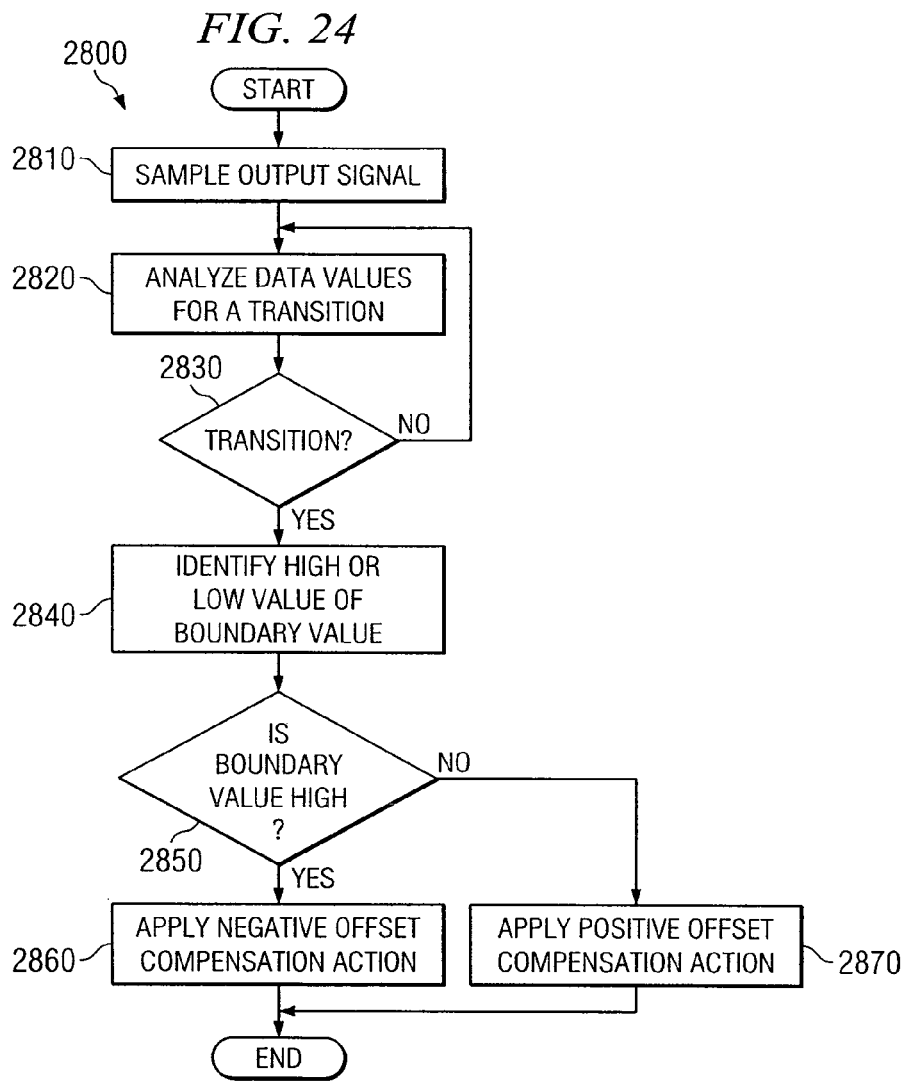

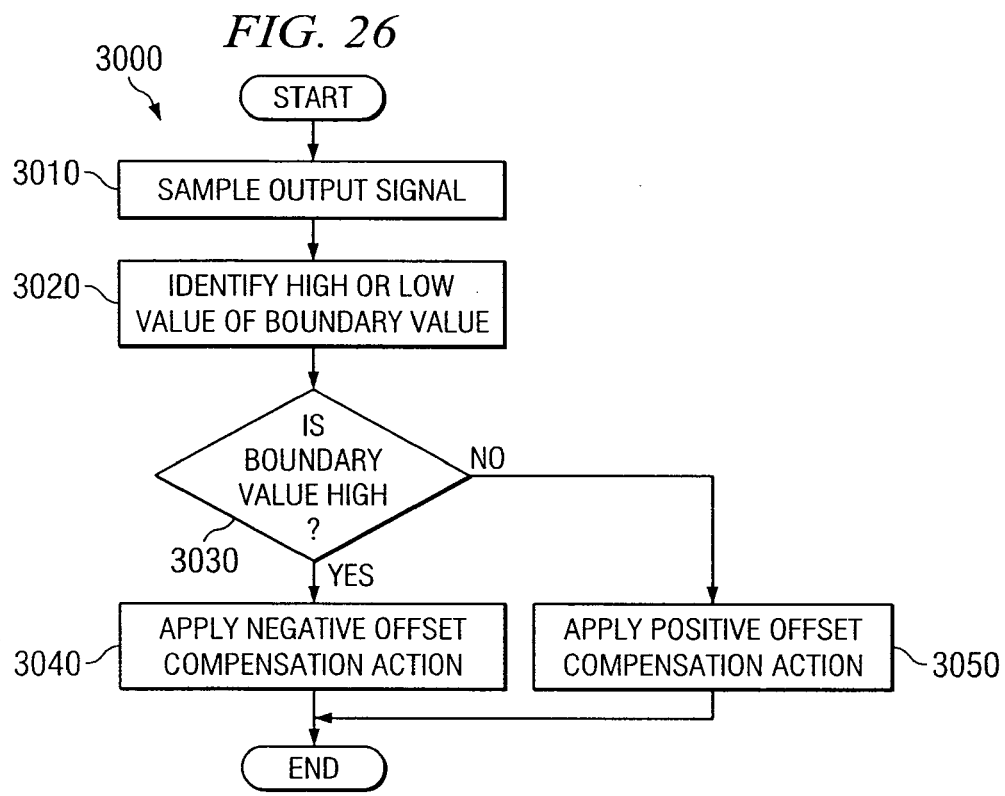

| DATA PATTERN | | | BOUNDARY VALUE AT E | RESIDUAL OFFSET | OFFSET CANCELLER ACTION |
|---|---|---|---|---|---|
| D1 | E1 | D2 | | | |
| 0 | E | 1 | 0 | NEGATIVE | MAKE IT A LITTLE POSITIVE |
| | | | 1 | POSITIVE | MAKE IT A LITTLE NEGATIVE |
| 1 | E | 0 | 0 | NEGATIVE | MAKE IT A LITTLE POSITIVE |
| | | | 1 | POSITIVE | MAKE IT A LITTLE NEGATIVE |
| 0 | E | 0 | 0 | NEGATIVE | MAKE IT A LITTLE POSITIVE |
| | | | (1) | (POSITIVE) | (MAKE IT A LITTLE NEGATIVE) |
| 1 | E | 1 | (0) | (NEGATIVE) | (MAKE IT A LITTLE POSITIVE) |
| | | | 1 | POSITIVE | MAKE IT A LITTLE NEGATIVE |

FIG. 29

| DATA PATTERN | | | BOUNDARY VALUE AT E | RESIDUAL OFFSET | OFFSET CANCELLER ACTION |
|---|---|---|---|---|---|
| D1 | E1 | D2 | | | |
| 0 | E | 1 | 0 | NEGATIVE | MAKE IT A LITTLE POSITIVE |
| 0 | E | 1 | 1 | POSITIVE | MAKE IT A LITTLE NEGATIVE |
| 1 | E | 0 | 0 | NEGATIVE | MAKE IT A LITTLE POSITIVE |
| 1 | E | 0 | 1 | POSITIVE | MAKE IT A LITTLE NEGATIVE |
| 0 | E | 0 | X | MAYBE NEGATIVE | UPDATE "0" COUNT; IF "0" COUNT >> "1" COUNT, MAKE IT A LITTLE POSITIVE |
| 1 | E | 1 | X | MAYBE POSITIVE | UPDATE "1" COUNT; IF "1" COUNT >> "0" COUNT, MAKE IT A LITTLE NEGATIVE |

FIG. 34

| DATA PATTERN | | | | BOUNDARY VALUE AT E | DC-PATH OFFSET | | FIRST-ORDER PATH OFFSET | |
|---|---|---|---|---|---|---|---|---|
| D0 | D1 | E1 | D2 | | RESIDUAL OFFSET | CANCELLER ACTION | RESIDUAL OFFSET | CANCELLER ACTION |
| 0 | 0 | E | 1 | 0 | | | NEGATIVE | MAKE IT POSITIVE |
| 0 | 0 | E | 1 | 1 | | | POSITIVE | MAKE IT NEGATIVE |
| 1 | 0 | E | 1 | 0 | NEGATIVE | MAKE IT POSITIVE | | |
| 1 | 0 | E | 1 | 1 | POSITIVE | MAKE IT NEGATIVE | | |
| 0 | 1 | E | 0 | 0 | NEGATIVE | MAKE IT POSITIVE | | |
| 0 | 1 | E | 0 | 1 | POSITIVE | MAKE IT NEGATIVE | | |
| 1 | 1 | E | 0 | 0 | | | NEGATIVE | MAKE IT POSITIVE |
| 1 | 1 | E | 0 | 1 | | | POSITIVE | MAKE IT NEGATIVE |

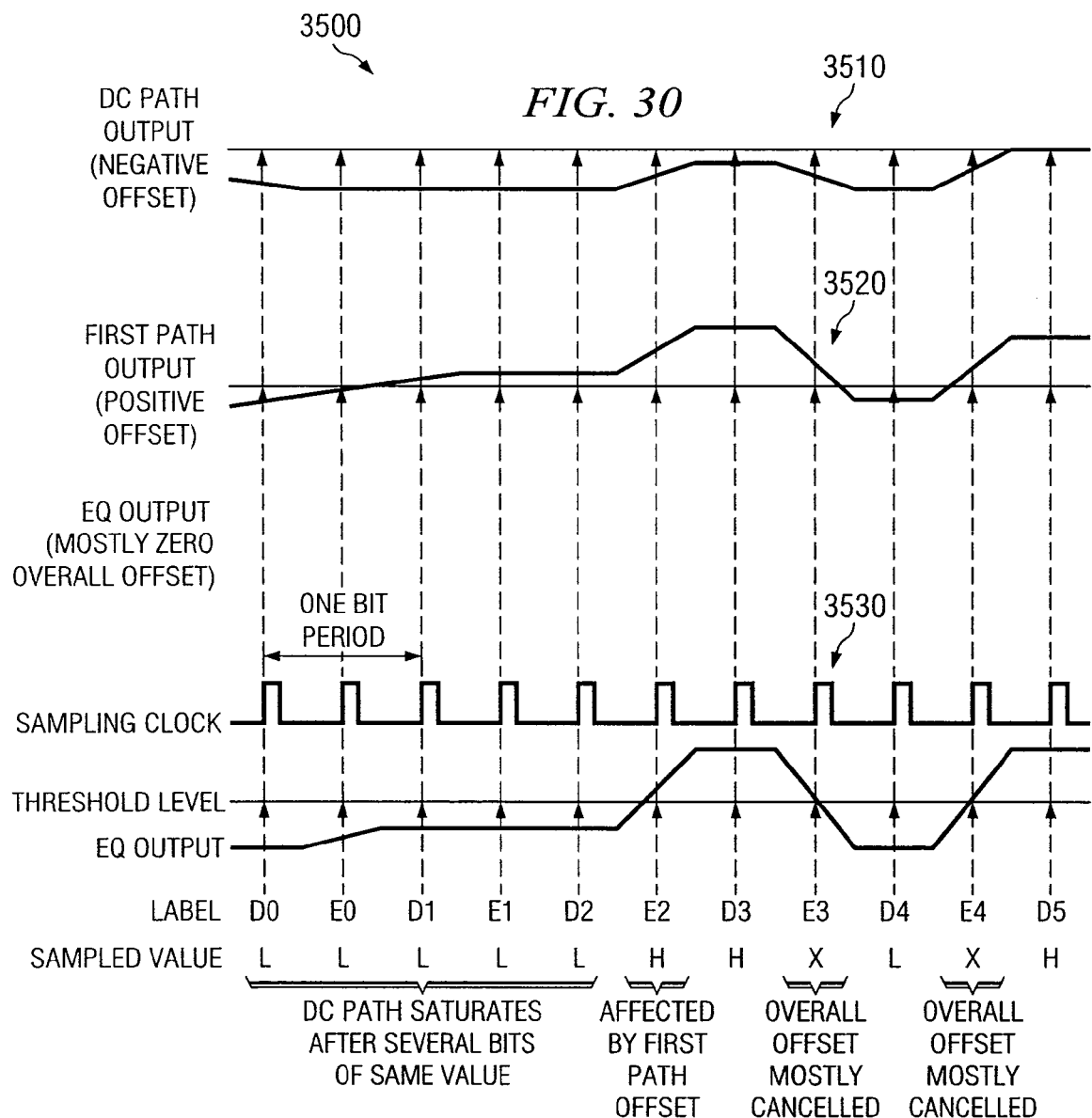

| DATA PATTERN | | | | BOUNDARY VALUE AT E | DC-PATH OFFSET | | FIRST-ORDER PATH OFFSET | |
|---|---|---|---|---|---|---|---|---|
| D0 | D1 | E1 | D2 | | RESIDUAL OFFSET | CANCELLER ACTION | RESIDUAL OFFSET | CANCELLER ACTION |
| 0 | 0 | E | 1 | 0 | | MAKE IT NEGATIVE | NEGATIVE | MAKE IT POSITIVE |
| 0 | 0 | E | 1 | 1 | | MAKE IT POSITIVE | POSITIVE | MAKE IT NEGATIVE |
| 1 | 0 | E | 1 | 0 | NEGATIVE | MAKE IT POSITIVE | | |
| 1 | 0 | E | 1 | 1 | POSITIVE | MAKE IT NEGATIVE | | |
| 0 | 1 | E | 0 | 0 | NEGATIVE | MAKE IT POSITIVE | | |
| 0 | 1 | E | 0 | 1 | POSITIVE | MAKE IT NEGATIVE | | |
| 1 | 1 | E | 0 | 0 | | MAKE IT NEGATIVE | NEGATIVE | MAKE IT POSITIVE |
| 1 | 1 | E | 0 | 1 | | MAKE IT POSITIVE | POSITIVE | MAKE IT NEGATIVE |

| DATA PATTERN | | | | BOUNDARY VALUE AT E | DC-PATH OFFSET | | FIRST-ORDER PATH OFFSET | |
|---|---|---|---|---|---|---|---|---|
| D0 | D1 | E1 | D2 | | RESIDUAL OFFSET | CANCELLER ACTION | RESIDUAL OFFSET | CANCELLER ACTION |
| 0 | 0 | E | 1 | 0 | | SMALL++ | NEGATIVE | BIG++ |
| 0 | 0 | E | 1 | 1 | | SMALL-- | POSITIVE | BIG-- |
| 1 | 0 | E | 1 | 0 | NEGATIVE | BIG++ | NEGATIVE | SMALL++ |
| 1 | 0 | E | 1 | 1 | POSITIVE | BIG-- | POSITIVE | SMALL-- |
| 0 | 1 | E | 0 | 0 | NEGATIVE | BIG++ | NEGATIVE | SMALL++ |
| 0 | 1 | E | 0 | 1 | POSITIVE | BIG-- | POSITIVE | SMALL-- |
| 1 | 1 | E | 0 | 0 | | SMALL++ | NEGATIVE | BIG++ |
| 1 | 1 | E | 0 | 1 | | SMALL-- | POSITIVE | BIG-- |

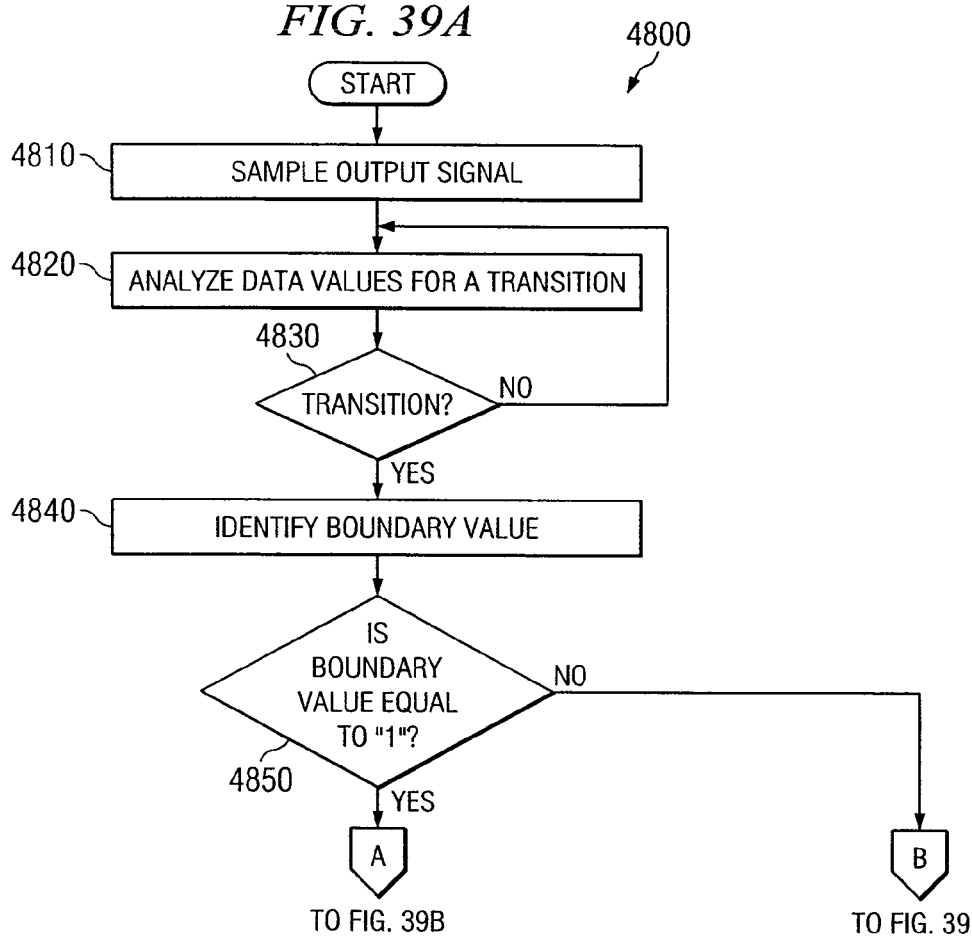

*FIG. 39A*

| DATA PATTERN 5010 | | | | BOUNDARY VALUE AT E 5012 | DC-PATH OFFSET 5014 | | FIRST-ORDER PATH OFFSET 5016 | | SECOND-ORDER PATH OFFSET 5018 | |
|---|---|---|---|---|---|---|---|---|---|---|
| D0 | D1 | D2 E2 | D3 | | RESIDUAL OFFSET | CANCELLER ACTION | RESIDUAL OFFSET | CANCELLER ACTION | RESIDUAL OFFSET | CANCELLER ACTION |
| 0 | 0 | 0 E | 1 | 0 | | | | | NEGATIVE | MAKE POSITIVE |
| 0 | 0 | 0 E | 1 | 1 | | | | | POSITIVE | MAKE NEGATIVE |
| 1 | 0 | 0 E | 1 | 0 | | | NEGATIVE | MAKE POSITIVE | NEGATIVE | MAKE POSITIVE |
| 1 | 0 | 0 E | 1 | 1 | | | POSITIVE | MAKE NEGATIVE | POSITIVE | MAKE NEGATIVE |
| X | 1 | 0 E | 1 | 0 | NEGATIVE | MAKE POSITIVE | NEGATIVE | MAKE POSITIVE | NEGATIVE | MAKE POSITIVE |
| X | 1 | 0 E | 1 | 1 | POSITIVE | MAKE NEGATIVE | POSITIVE | MAKE NEGATIVE | POSITIVE | MAKE NEGATIVE |
| X | 0 | 1 E | 0 | 0 | NEGATIVE | MAKE POSITIVE | NEGATIVE | MAKE POSITIVE | NEGATIVE | MAKE POSITIVE |
| X | 0 | 1 E | 0 | 1 | POSITIVE | MAKE NEGATIVE | POSITIVE | MAKE NEGATIVE | POSITIVE | MAKE NEGATIVE |
| 0 | 1 | 1 E | 0 | 0 | | | NEGATIVE | MAKE POSITIVE | NEGATIVE | MAKE POSITIVE |
| 0 | 1 | 1 E | 0 | 1 | | | POSITIVE | MAKE NEGATIVE | POSITIVE | MAKE NEGATIVE |
| 1 | 1 | 1 E | 0 | 0 | | | | | NEGATIVE | MAKE POSITIVE |
| 1 | 1 | 1 E | 0 | 1 | | | | | POSITIVE | MAKE NEGATIVE |

*FIG. 40*

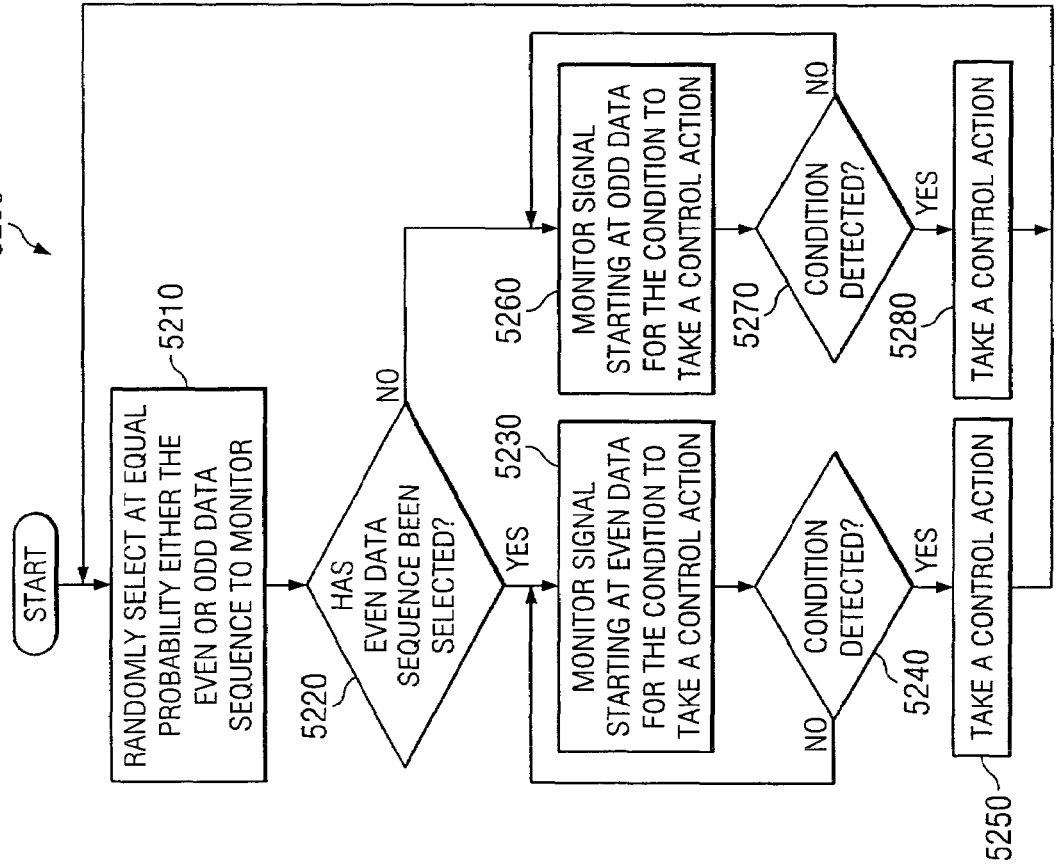
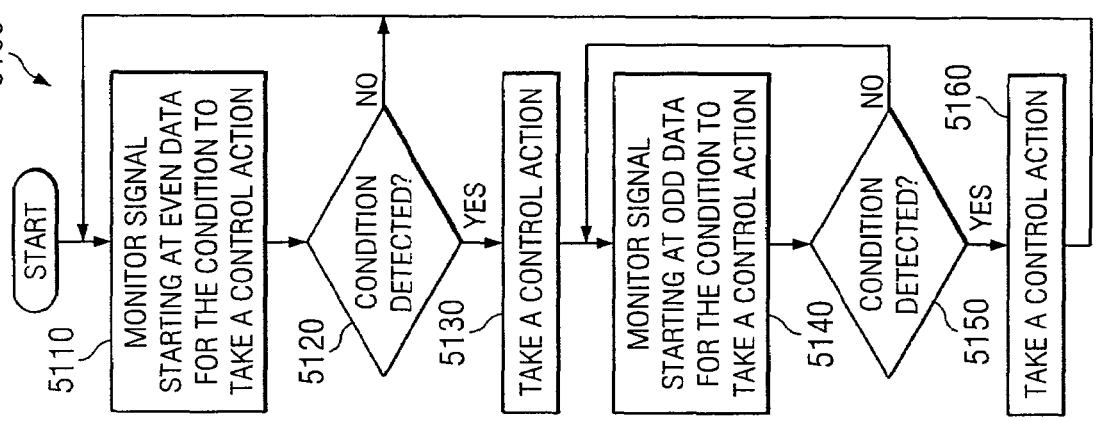

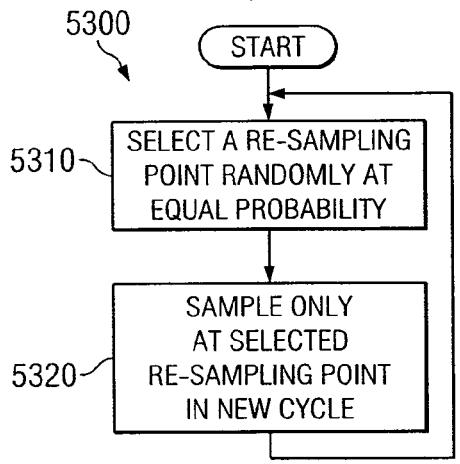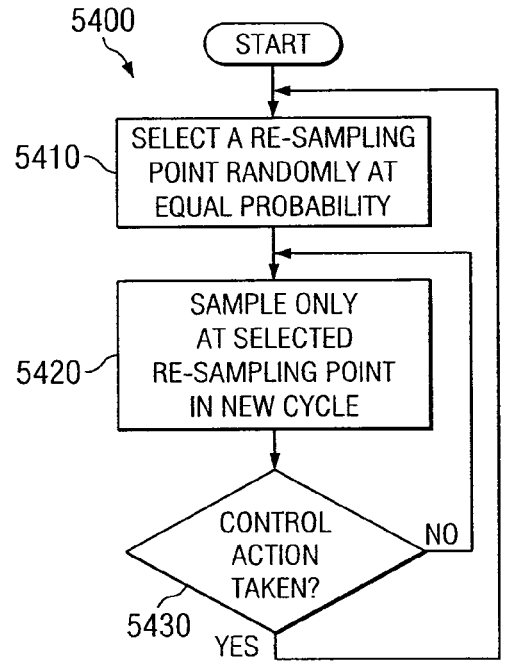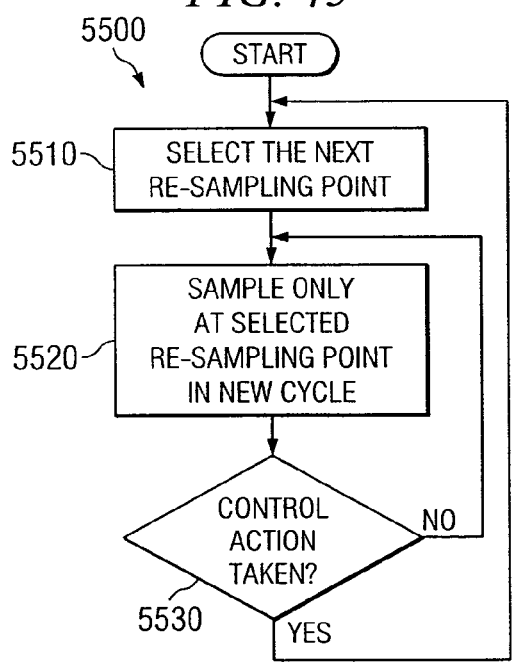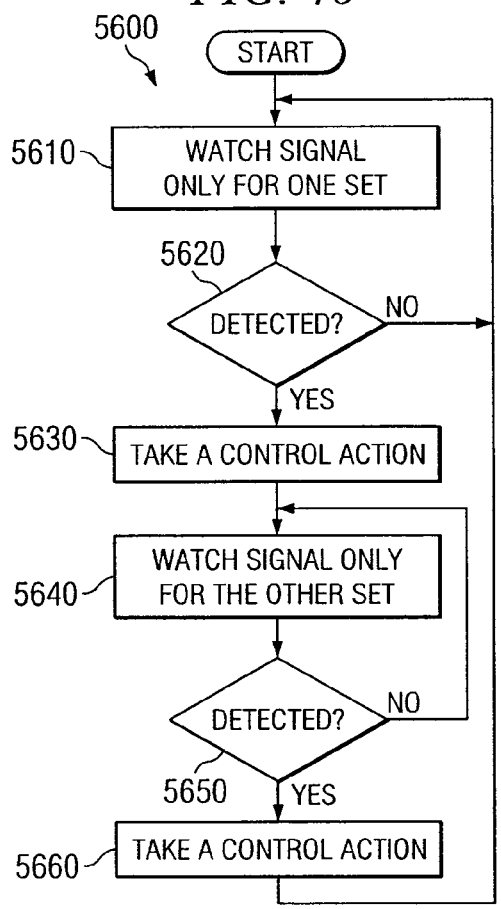

*FIG. 51*
| HIGH-FREQUENCY GAIN CODE (G) | DC-PATH GAIN CODE ($G_0$) | FIRST-ORDER-PATH GAIN CODE ($G_1$) |
|---|---|---|
| 0 | $G_0$MAX | 0 |
| 1 ~ 62 | $G_0$MAX | G |
| 63 | $G_0$MAX | 63 |
| 64 ~ 62+$G_0$MAX | $G_0$MAX-(G-63) ($G_0$MAX-1 ~ 1) | 63 |
| 63+$G_0$MAX ~ | 0 | 63 |
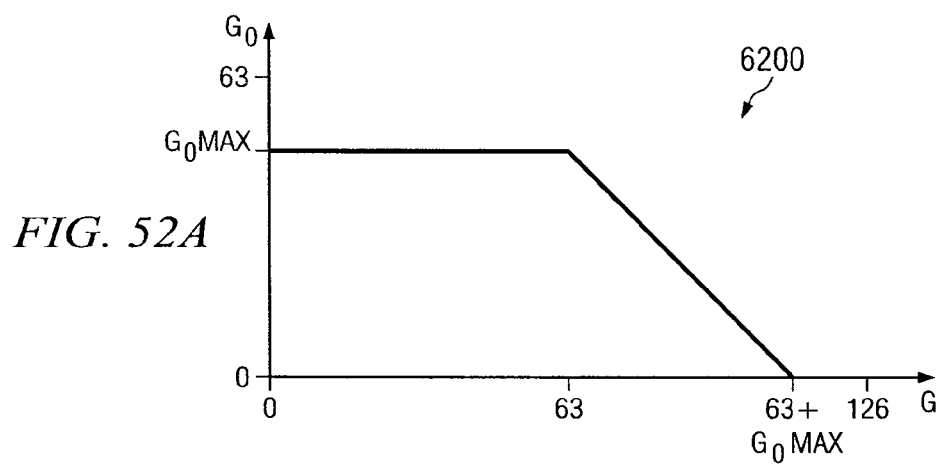
*FIG. 52A*
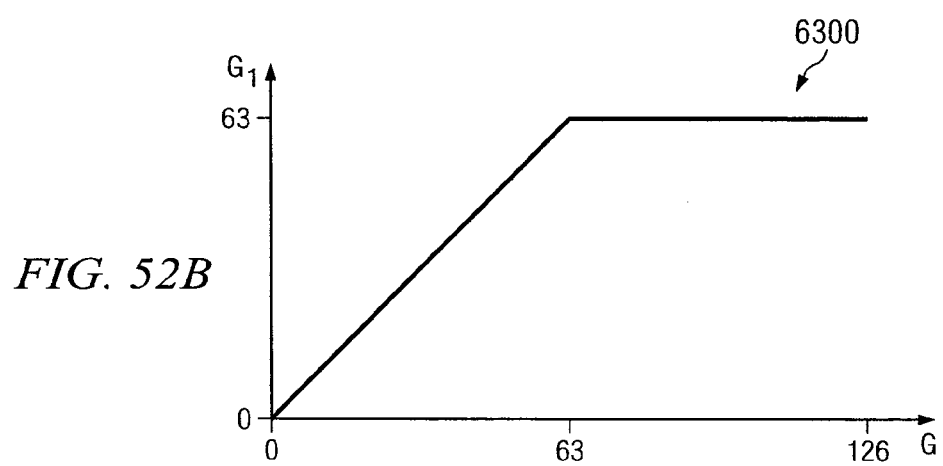
*FIG. 52B*

SYSTEM AND METHOD FOR THE ADJUSTMENT OF COMPENSATION APPLIED TO A SIGNAL

CROSS-REFERENCE TO RELATED APPLICATION

This application claims the benefit of priority under 35 U.S.C. §119(e) of U.S. Provisional Application entitled "Adaptive Equalizer," Ser. No. 60/803,451 filed May 30, 2006.

TECHNICAL FIELD OF THE INVENTION

This invention relates generally to signal communication and, more particularly, to a system and method for the adjustment of compensation applied to a signal.

BACKGROUND OF THE INVENTION

When signals are communicated over communication media, the signals may suffer attenuation from phenomena such as skin effect and dielectric absorption. Signal receivers may include equalizers that compensate for this attenuation in order to improve the accuracy and efficiency of signal communication. It is desirable for the amount of compensation applied by equalizers to match the level of attenuation due to the media as closely as possible, in order to keep the output characteristics of the signal consistent independently of the particular communication path used to communicate the signal.

SUMMARY OF THE INVENTION

In one embodiment of the present invention, a method for adjusting a signal includes applying at least one of a loss compensation for frequency-dependent distortion and an offset compensation for DC-offset distortion to a signal before or after the distortion occurs to generate an output signal, the output signal comprising even phase and odd phase. The method also includes selecting either the even phase or the odd phase at which to begin sampling. The method further includes, using a clock signal, beginning at the selected phase, sampling the output signal to generate a plurality of data values and an error value, the error value indicating residue of the distortion based on the sampling of the output signal. The method also includes adjusting none, one, or more of the loss compensation and the offset compensation applied to the signal based on the sampled error value. The method further includes, after adjusting the at least one of the loss compensation and the offset compensation applied to the signal based on the sampled error value, selecting either the even phase or the odd phase at which to begin the next sampling.

One technical advantage of certain embodiments is equalizing output signals. Certain embodiments compensate for signal attenuation resulting from the communication media used to communicate the signal. This allows the output characteristics of the signal to remain consistent independently of the communication path used to communicate the signal. Advantages associated with consistent output characteristics may include improved component response, as the signal level can be selected to fall within the dynamic range of system components. Furthermore, the signal can be maintained at a sufficient level to prevent information from being lost.

Other technical advantages of certain embodiments include adaptability to different communication media. Certain embodiments use variable gain amplifiers to adjust the degree of compensation applied to an incoming signal. Such embodiments may allow the amount of compensation to be adjusted for different media, thus increasing the versatility of equalizers embodying such techniques. Furthermore, such embodiments may also adapt to changes in media characteristics associated with process, voltage, and temperature variations.

Still another technical advantage of certain embodiments is improving the maximum operation speed of the equalizer and/or reducing the power consumed by the equalizer. Certain embodiments use existing clock and data recovery (CDR) functionality to generate output signal values used to monitor residual gain error and/or residual DC offset in the output signal. By using existing CDR functionality to generate the output signal values, a dedicated monitor circuit need not be used. By not using a dedicated monitor circuit, the loading on the equalizer output may be reduced, improving maximum operation speed of the equalizer and/or reducing the power consumed by the equalizer. In addition, chip area may be reduced and existing equalizer components and/or functionality may be reused in particular embodiments. Also, by not using a dedicated monitor circuit, design effort for the equalizer may also be reduced.

Still another technical advantage of certain embodiments is increased flexibility regarding data patterns usable by the equalizer. Particular embodiments may use data patterns with a single transition and are not limited to high frequency data patterns and/or data patterns having at least two transitions. Such flexibility may have several advantages, including, for example, allowing additional filter patterns (i.e., those having a single transition) to be applied to an output signal to counteract duty cycle distortion, discussed below.

Yet another technical advantage of particular embodiments is the ability to adjust more than one independent control parameter associated with an input signal using only output signal values. As discussed above, using output signal values provides several advantages over using a monitor circuit. In addition, adjusting more than one independent control parameter may increase the effectiveness of an equalizer in compensating for signal attenuation.

Still another technical advantage of particular embodiments is controlling gain in an adaptive equalizer consistently for periodic, quasi-periodic, and well-randomized data sequences. Another technical advantage of particular embodiments is reducing the negative effects of duty-cycle distortion and quasi-periodic and periodic signals by applying filter patterns to the signals before adjusting gain. The filter patterns may correspond to patterns of values that arise substantially equally in the sequences that start at even or odd data in the signals. Applying filter patterns to the signals may avoid unacceptable results in the gain control by balancing the adaptive action biases (duty cycle distortion) in the sequences that start at even or odd data.

A further technical advantage of particular embodiments is using a list of useful filter patterns in a balanced manner in conjunction with (quasi-) periodic signals to reduce the negative effects of duty-cycle distortion and the (quasi-) periodic signals. In these embodiments, the list of useful filter patterns associated with the (quasi-) periodic signals may be predetermined and fixed. In alternative embodiments, the list of useful filter patterns may be adaptable to the incoming (quasi-) periodic signals. The filter patterns in a list may be used in a balanced manner to enhance their applicability to the (quasi-) periodic signals. Filter patterns may be used in a balanced manner by being selected from the list sequentially, randomly, or simultaneously. Timers may be used in particular embodiments to skip over an undetected filter pattern, thereby increasing the frequency of adaptive control actions.

Another technical advantage of certain embodiments is adjusting for residual DC offset observed in output signals. Adjusting DC offset compensation allows for improved component response (e.g., increased sensitivity). In particular embodiments, DC offset compensation may be adjusted using output signal values and without generating data errors in a signal. As discussed above, using output signal values (generated using existing CDR functionality) provides several advantages over using a monitor circuit. In addition, because data errors are not generated in a signal, adjustments to DC offset compensation may be made during receipt of a signal comprising real data traffic and not only during receipt of a signal carrying only test traffic. By making adjustments to DC offset compensation during receipt of a signal comprising real data traffic (and not test traffic only), component sensitivity may be improved during receipt of the real data traffic.

Yet another technical advantage of particular embodiments is correcting for a potential false locking problem in conjunction with adjusting for residual DC offset observed in output signals. The false locking problem arises when a clock recovery and an offset canceller interact improperly, leading to the sampled boundary and data values to be interchanged. Particular embodiments correct for the false locking problem by adjusting DC offset compensation based on the high or low value of each boundary value, regardless of whether the boundary value is between successive data values comprising a transition. To correct for the false locking problem in (quasi-) periodic signals where re-sampling is used, particular embodiments first monitor data DC imbalance (a proxy for the false locking problem) using output signal values. If an imbalance is detected, DC offset compensation is adjusted based on the detected imbalance. If an imbalance is not detected, DC offset compensation is adjusted based on the high or low values of only those boundary values between successive data values comprising transitions. In this way, data DC imbalance may vary within an acceptable range, even if re-sampling is used for a (quasi-) periodic data sequence.

Still another technical advantage of particular embodiments is using output signal values to cancel offsets in each path of a multi-path equalizer. In particular embodiments, offsets in each path may be cancelled without using any additional circuitry to monitor internal residual offset in the equalizer. In addition, in particular embodiments, the offset cancel control may be used during operation of the equalizer (i.e., without turning off any part of the equalizer circuit) and during receipt of a signal comprising real data traffic (and not only during receipt of a signal carrying only test traffic). By making adjustments to DC offset compensation during receipt of a signal comprising real data traffic (and not test traffic only), component sensitivity may be improved during receipt of the real data traffic.

Another technical advantage of particular embodiments where re-sampling is used is avoiding any locking of the re-sampling period with the period of a (quasi-) periodic signal. When locking occurs, the data patterns observed in re-sampled data may be different than the data patterns in the entire (quasi-) periodic signal, potentially skewing the control actions performed by the equalizer controller. Particular embodiments may avoid locking by varying the point at which the (quasi-) periodic signal is re-sampled in each re-sampling cycle.

Yet another technical advantage of particular embodiments is decoupling multiple control loops, such as, for example, the adaptive equalizer control and the offset canceller. Decoupling the multiple control loops may avoid delay in convergence time and potential instability in the control loops. Particular embodiments may decouple multiple control loops by making the loops insensitive to each other. For example, the adaptive equalizer control may be made insensitive to residual offset, and the offset canceller may be made insensitive to residual inter-symbol interference (ISI). To make the adaptive equalizer control and offset canceller insensitive to each other, in particular embodiments, two sets of complementary data patterns may be used in a balanced manner by the adaptive equalizer control and the offset canceller.

Still another technical advantage of particular embodiments is generating a particular average value of a binary objective variable (e.g., ISI level, equalization level, or other suitable objective variable) in an equilibrium state in a bang-bang control system that does not necessarily converge to zero, as is the case in typical bang-bang control systems. The binary objective variable may be, for example, the inverted correlation function applied to a boundary value between opposite data values and to the data value 1.5 bits (or symbols) before the boundary value. In particular circumstances, the optimal average value of a binary objective variable (e.g., ISI level, equalization level, or other suitable objective variable) in equilibrium may be greater or less than zero depending on various conditions, such as, for example, channel loss and the incoming signal itself. Thus, embodiments that generate an average value of the binary objective variable that converges closer to the optimal average value (than does zero) may be advantageous.

Another technical advantage of particular embodiments is dynamically generating a control target for an average value of a binary objective variable (e.g., ISI level, equalization level, or other suitable objective variable) in an equilibrium state. In particular embodiments, the optimal average ISI level is likely to be high for a high loss channel and low for a low loss channel. Thus, embodiments comprising a control target for the average value of a binary objective variable that dynamically varies with the value of the control variable may be advantageous.

Other technical advantages will be readily apparent to one skilled in the art from the attached figures, description, and claims. Moreover, while specific advantages have been enumerated above, particular embodiments may include some, all, or none of the enumerated advantages.

BRIEF DESCRIPTION OF THE DRAWINGS

FIG. 7 is a flowchart illustrating an example method for interpreting output signal values for multiple independent control parameters in an analog second-order derivative equalizer according to a particular embodiment of the invention;

FIG. 8 is a table illustrating an example gain control scheme associated with the method of FIG. 7;

FIG. 10 is a table illustrating an example gain control scheme associated with the method of FIG. 9;

FIG. 11 illustrates example boundary information affected by duty-cycle distortion;

FIG. 12 is a flowchart illustrating an example method for selecting a filter pattern to reduce the negative effect of duty-cycle distortion according to a particular embodiment of the invention;

FIG. 13 is a table illustrating an example distribution of 6-bit data patterns in even and odd 8B10B idle data sequences;

FIG. 14 is a table illustrating an example gain control scheme associated with using the example filter patterns derived from the table of FIG. 13 to adjust the gain applied to unmodified, first-order derivative, and second-order derivative components of an input signal;

FIG. 15 is a table illustrating an example distribution of 6-bit data patterns in even and odd 8B10B CJPAT data sequences;

FIG. 16 is a table illustrating an example gain control scheme associated with using the example filter patterns derived from the table of FIG. 15 to adjust the gain applied to unmodified, first-order derivative, and second-order derivative components of an input signal;

FIG. 17 is a flowchart illustrating an example method for generating a list of useful filter patterns dynamically according to a particular embodiment of the invention;

FIG. 18 is a flowchart illustrating another example method for generating a list of useful filter patterns dynamically according to a particular embodiment of the invention;

FIG. 19 is a flowchart illustrating yet another example method for generating a list of useful filter patterns dynamically according to a particular embodiment of the invention;

FIG. 20 is a flowchart illustrating an example method for using filter patterns in a balanced manner according to a particular embodiment of the invention;

FIG. 21 is a flowchart illustrating another example method for using filter patterns in a balanced manner according to a particular embodiment of the invention;

FIG. 22 is a flowchart illustrating an example method for skipping an undetected filter pattern after a period of time according to a particular embodiment of the invention;

FIG. 24 is a flowchart illustrating a method for interpreting output signal values to cancel residual DC offset according to a particular embodiment of the invention;

FIG. 25 is a table illustrating an example offset control scheme associated with the method of FIG. 24;

FIG. 26 is a flowchart illustrating a method for correcting for false locking in canceling residual DC offset according to a particular embodiment of the invention;

FIG. 27 is a table illustrating an example offset control scheme associated with the method of FIG. 26;

FIG. 29 is a table illustrating an example offset control scheme associated with the method of FIG. 28;

FIG. 30 illustrates examples of a DC path output exhibiting negative residual DC offset, a first-order derivative path output exhibiting positive residual DC offset, and an equalizer output signal exhibiting mostly zero residual DC offset of an example first-order derivative equalizer in comparison with a clock signal;

FIG. 32 is a table illustrating an example offset control scheme associated with the method of FIG. 31;

FIG. 34 is a table illustrating an example offset control scheme associated with the method of FIG. 33;

FIG. 36 is a table illustrating an example offset control scheme associated with the method of FIG. 35;

FIG. 38 is a table illustrating an example offset control scheme associated with the method of FIG. 37;

FIG. 40 is a table illustrating an example offset control scheme associated with the method of FIG. 39;

FIG. 41 is a flowchart illustrating an example method for reducing the effects of duty-cycle distortion according to a particular embodiment of the invention;

FIG. 42 is a flowchart illustrating another example method for reducing the effects of duty-cycle distortion according to a particular embodiment of the invention;

FIG. 43 is a flowchart illustrating an example method for varying the point at which re-sampling occurs in each re-sampling cycle according to a particular embodiment of the invention;

FIG. 44 is a flowchart illustrating another example method for varying the point at which re-sampling occurs in each re-sampling cycle according to a particular embodiment of the invention;

FIG. 45 is a flowchart illustrating yet another example method for varying the point at which re-sampling occurs in each re-sampling cycle according to a particular embodiment of the invention;

FIG. 46 is a flowchart illustrating an example method for decoupling multiple control loops according to a particular embodiment of the invention;

FIG. 51 is a table illustrating an example scheme for converting a high-frequency gain code into a DC-path gain code and a first-order-path gain code according to a particular embodiment of the invention; and FIGS. 52A and 52B are graphs illustrating the results of applying the example scheme of FIG. 51 for converting a high-frequency gain code into a DC-path gain code and a first-order-path gain code according to a particular embodiment of the invention.

DETAILED DESCRIPTION OF THE INVENTION

Figure 1:
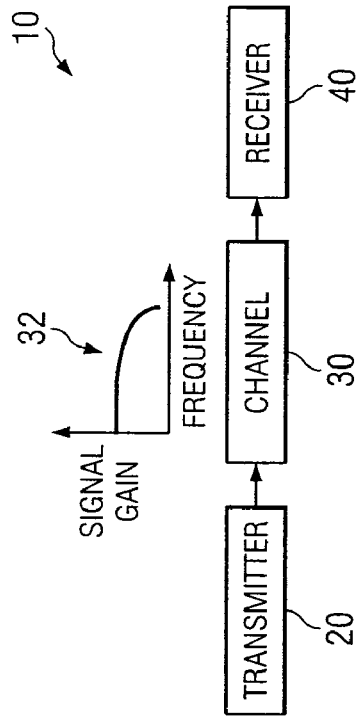
FIG. 1 is a block diagram illustrating an example digital signal transmission system.

FIG. 1 is a block diagram illustrating an example digital signal transmission system 10. Digital signal transmission system 10 comprises transmitter 20, communication channel 30, and receiver 40. Transmitter 20 may comprise any suitable transmitter operable to transmit signals carrying digital information to receiver 40 over channel 30. In particular embodiments, transmitter 20 may communicate information at relatively fast rates. Channel 30 may comprise any suitable channel or other communication medium. Channel 30 may include, for example, a cable carrying a signal, an insulator insulating the cable, packaging around the cable, and/or connectors. Channel 30 is operable to receive signals from transmitter 20 and forward these signals to receiver 40. Receiver 40 may comprise any suitable receiver operable to receive signals from transmitter 20 over channel 30 and process the digital information in the received signals suitably.

In typical digital signal transmission systems, such as, for example, high-speed communication systems, the signal received by receiver 40 is typically distorted due to frequency-dependent attenuation, as illustrated in graph 32. Generally, there are two significant causes for signal attenuation in conductive communication media. The first significant cause is skin effect from conduction of the signal along the communication medium. The second significant cause is dielectric absorption of the signal by the communication medium. In general, the amount of signal loss in decibels due to skin effect is the product $\alpha_s \cdot x \cdot \sqrt{f}$ where $\alpha_s$ is the coefficient of skin effect for the material, x is the length traveled along the material, and f is the frequency of the signal. The amount of loss due to dielectric absorption is the product $\alpha_d \cdot x \cdot f$, where $\alpha_d$ is the coefficient of dielectric absorption of the material.

The relative significance of the effects can vary widely depending on the material and the frequency of the signal. Thus, for example, cables may have a coefficient of dielectric absorption that is much smaller than the coefficient of skin effect, so that loss due to skin effect dominates except at high frequencies. On the other hand, backplane traces may have higher coefficients of dielectric absorption, so that the loss due to dielectric absorption is comparable to or greater than the amount of loss due to skin effect. Furthermore, changes in operating conditions, such as temperature variations, may also affect signal characteristics.

A signal processed by receiver 40 may also exhibit residual DC offset distortion. Residual DC offset may be caused, for example, by fabrication technology, such as device geometry mismatch or threshold voltage mismatch, and/or by receiver components themselves. As described further below in conjunction with FIGS. 2 and 3, equalizers may be used to compensate for frequency-dependent attenuation, and offset cancellers may be used to cancel residual DC offset.

Figure 2:
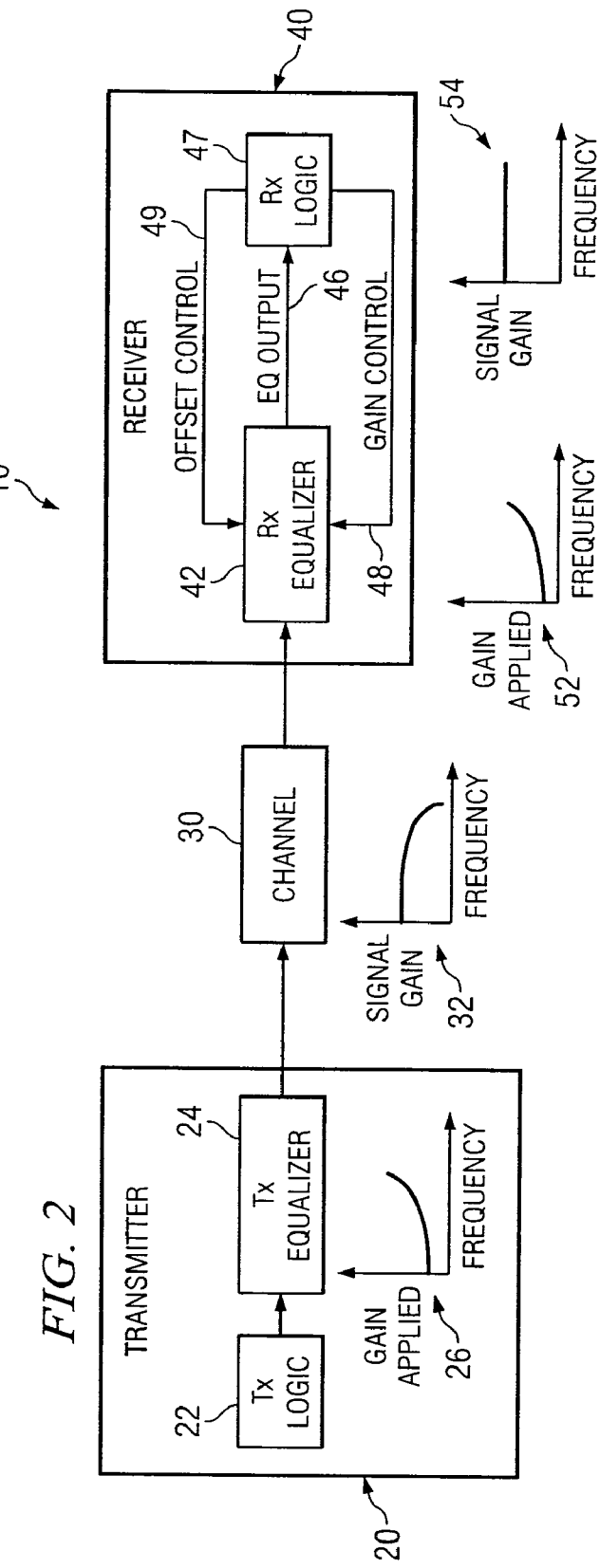
FIG. 2 is a block diagram illustrating the example digital signal transmission system of FIG. 1 in more detail.

FIG. 2 is a block diagram illustrating the example digital signal transmission system of FIG. 1 in more detail. As can be observed, transmitter 20 comprises transmitter logic 22 and transmitter equalizer 24. Transmitter logic 22 may comprise any suitable logic operable to encode and transmit information. Transmitter equalizer 24 may comprise any suitable equalizer operable to compensate for distortion that the transmitted signals may experience over channel 30 due to frequency-dependent attenuation (for example, by adjusting the gain of signals to be transmitted). As an example only, in particular embodiments, the gain may be compensated as illustrated in graph 26. In this manner, equalizer 24 may apply pre-compensation (or equalization) to a signal before distortion occurs (using, e.g., transmitter pre-emphasis equalization). In particular embodiments, transmitter equalizer 24 may operate analogously to receiver equalizer 42, described below in conjunction with FIG. 3, based on feedback from receiver logic 47 However, it should be noted that equalizer 24 may apply compensation to the signal before the distortion occurs whereas equalizer 42 may apply compensation to the signal after the distortion occurs. It should also be noted that some or all of the logic in logic 47 (described below) may reside in transmitter 20 or in any other suitable location and not necessarily entirely in receiver 40.

Receiver 40 comprises receiver equalizer 42, equalizer output 46, receiver logic 47, gain control signal 48, and offset control signal 49. Receiver equalizer 42 may comprise any suitable equalizer operable to receive, at an input port, an input signal comprising an input data signal and apply a gain and/or offset to the received input data signal. Receiver logic 47 may comprise any suitable component or set of components, such as a sampler, operable to receive a clock signal. The clock signal may comprise any suitable clock signal, such as, for example, a recovered clock signal, which may be recovered from the input signal by a clock and data recovery (CDR) circuit. Using the received clock signal, receiver logic 47 is operable to sample the equalizer output 46, and based on the sampling, adjust the gain control signal 48 and/or offset control signal 49 applied to the input data signal to compensate for signal distortion, as described further below in conjunction with FIG. 3. As an example only, in particular embodiments, the gain may be compensated as illustrated in graph 52. Compensating the gain may produce, in particular embodiments, an equalizer output 46 that is completely compensated for frequency-dependent distortion, as illustrated in graph 54. In alternative embodiments, the equalizer output 46 may not be completely compensated. In particular embodiments, receiver 40 may be operable to communicate the information in equalizer output 46 downstream in any suitable manner and to any suitable number of one or more components.

As described in more detail below, receiver 40 compensates for signal distortions without using a dedicated monitor circuit to detect the distortions. By not using a dedicated monitor circuit, receiver 40 may achieve one or more technical advantages. These advantages may include, for example, improving the maximum operation speed of equalizer 42 and/or reducing the power consumed by receiver 40. In addition, chip area may be reduced, existing equalizer components and/or functionality may be reused, and/or the design effort necessary to design receiver 40 may be reduced (by not having to design a dedicated monitor circuit).

It should be noted that, in particular embodiments, pre-compensation may not be applied and transmitter 20 may not include an equalizer 24. In these embodiments, receiver 40 may compensate for distortion using equalizer 42. In alternative embodiments, transmitter 20 may include equalizer 24, and pre-compensation may be applied (i.e., transmitter pre-emphasis). In some of these embodiments, receiver 40 may also compensate for distortion using equalizer 42. In others of these embodiments, receiver 40 may not compensate for distortion using equalizer 42, and receiver 40 may not include an equalizer 42.

It should be noted that, in particular embodiments, the components applying compensation to a signal for distortion (e.g., logic 47 and equalizer 42, logic 47 and equalizer 24, and/or logic 47 and multiple equalizers) may be referred to as being part of an adaptive equalizer. It should also be noted that an adaptive equalizer may apply compensation in the manner described herein in contexts other than in a signal transmission system (as described). For example, an adaptive equalizer may apply compensation in the manner described herein (or in an analogous manner) in a recording channel, such as, for example, a magnetic recording channel or an optical recording channel. Also, compensation may be applied as described herein using any suitable type of equalizer, including, for example, a linear equalizer and a decision feedback equalizer.

Figure 3:
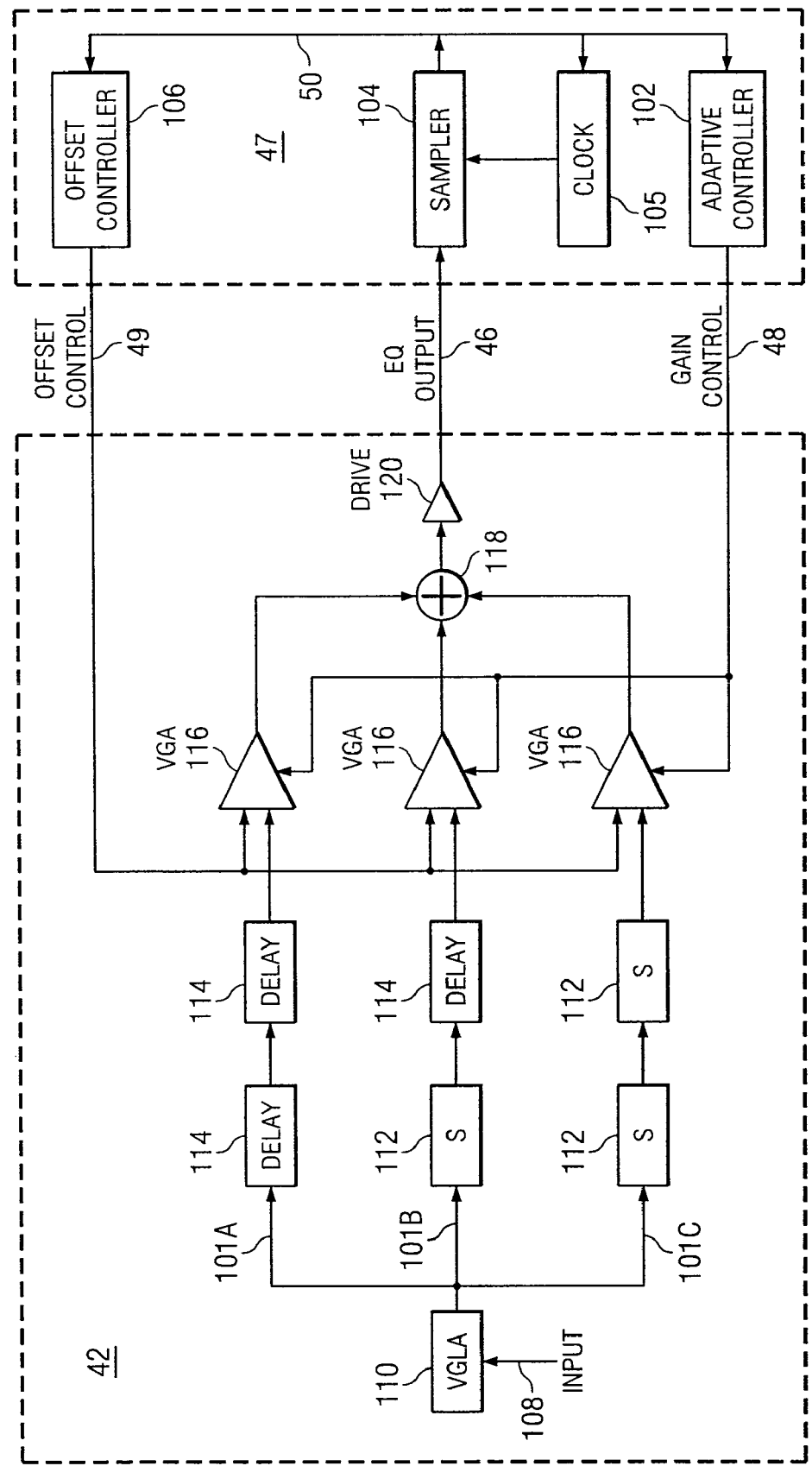
FIG. 3 is a block diagram illustrating an example receiver in the example digital signal transmission system of FIG. 2 according to a particular embodiment.

FIG. 3 is a block diagram illustrating an example receiver 40 in the example digital signal transmission system 10 of FIG. 2 according to a particular embodiment. Equalizer 42 is operable to compensate for attenuation in a signal communicated to equalizer 42 using a communication medium 30. In the depicted embodiment, receiver logic 47 includes an adaptive controller 102 that adjusts the amount of gain applied to each of three signal paths 101A, 101B, and 101C based on the output signal sampled by sampler 104. Performance of equalizer 42 may suffer from residual DC offset. Receiver logic 47 may thus also include an offset controller 106 that adjusts the amount of DC offset compensation applied to an incoming signal based on the DC offset of the output signal sampled by sampler 104. Other components of equalizer 42 include variable gain limiting amplifier 110, mathematical operators (S) 112, delay generators 114, variable gain amplifiers 116, mixer 118, and drive amplifier 120. Other components of receiver logic 47 include the sampler 104 and clock 105. The output signal from sampler 104 is illustrated as output 50.

In order to compensate for frequency-dependent distortion, equalizer 42 may divide (using any suitable divider) the received input signal 108 among three signal paths 101A, 101B, and 101C, and selectively amplify the portion of the signal on each path using variable gain amplifiers 116. The first path 101A applies no mathematical operation to the received portion of the input signal. The second path 101B applies a first-order mathematical operation, such as, for example, a derivative operation, to the signal. This operation may be based on the frequency of the signal and is illustrated as mathematical operator (S) 112. As also described below, the third path 101C applies a second-order mathematical operation, such as, for example, a second-order derivative operation, to the signal. This operation may also be based on the frequency of the signal and is illustrated by the application of two mathematical operators (S) 112. By selectively amplifying the first- and second-order components of the signal, equalizer 42 approximately compensates for the frequency-dependent loss effects in channel 30 of FIG. 2. In alternative embodiments, equalizer 42 may have any suitable number of paths, including, for example, only one path. Equalizer 42 may be an example of an equalizer that applies compensation for distortion in parallel. It should be noted that compensation for distortion may be applied in parallel in any suitable manner (e.g., before and/or after distortion occurs) using any suitable equalization technique (e.g., transmitter pre-emphasis equalization and/or receiver equalization) and any suitable equalizer (e.g., an analog continuous-time first-order derivative filter, an analog continuous-time second-order derivative filter, a multi-tap finite-impulse-response filter, and/or a multi-tap decision-feedback equalizer). It should also be noted that, in alternative embodiments, compensation for distortion may be applied in series in any suitable manner (e.g., before and/or after distortion occurs) using any suitable equalization technique (e.g., transmitter pre-emphasis equalization and/or receiver equalization) and any suitable equalizer (e.g., a linear equalizer and/or a decision-feedback equalizer).

Adaptive controller 102 may comprise any suitable component or combination of components for analyzing information about the output signal of equalizer 42 and for adjusting the respective gain of each of the variable gain amplifiers 116. Adaptive controller 102 may include analog and/or digital electronic components, such as transistors, resistors, amplifiers, constant current sources, or other similar components. Adaptive controller 102 may also include suitable components for converting signals from analog signals to digital signals or vice versa. According to a particular embodiment, adaptive controller 102 includes a digital processor, such as a microprocessor, microcontroller, embedded logic, or other information-processing component.

In particular embodiments, adaptive controller 102 receives data and boundary value information associated with the output signal from sampler 104. This value information may include, for example, a high or low value (such as a "1" or a "0") associated with each sampled data and/or boundary value. As described further below, based on this value information, adaptive controller 102 is operable to make suitable adjustments to the gain applied to the input data signal. To adjust the gain, in particular embodiments, adaptive controller 102 may adjust the bias current applied to each variable gain amplifier 116 to adjust the gain applied. One advantage of using bias currents to control amplifiers 116 is that it may adjust the amount of gain applied by the amplifier without changing the bandwidth of the amplifier, so that the amplifier can maintain its dynamic range even when the gain is increased.

Sampler 104 may comprise any suitable component configured to receive the equalizer output 46 from, for example, drive amplifier 120 and a clock signal from, for example, clock 105, and to sample the equalizer output 46 at set intervals defined by the clock signal. The sampling may be of data values and/or boundary values associated with the equalizer output 46 and may indicate a high or low value for each of these values. Sampler 104 may be further operable to forward sampled data values and boundary values to adaptive controller 102 and/or offset controller 106. In particular embodiments, sampler 104 may comprise a decision latch that performs sampling and 1-bit analog-to-digital conversion. In alternative embodiments, sampler 104 may comprise an analog sample and hold (S/H) circuit to sample and forward analog information for analog signal processing. In yet alternative embodiments, sampler 104 may comprise a multiple-bit analog-to-digital converter (ADC) and forward digital information for digital signal processing.

Offset controller 106 may comprise any suitable component or combination of components for analyzing information about the equalizer output 46 of equalizer 42 and for adjusting the amount of DC offset compensation applied at one or more stages of variable gain amplifier 116. In particular embodiments, offset controller 106 may include a microprocessor, microcontroller, embedded logic, and/or any other suitable component or combination of components.

In particular embodiments, offset controller 106 receives data and boundary value information associated with the equalizer output 46 from sampler 104. This value information may include, for example, a high or low value for each sampled data and/or boundary value. As described further below, based on this value information, offset controller 106 is operable to make suitable adjustments to the compensation (i.e., correction) voltage applied to the input data signal to correct or compensate (i.e., cancel) for any residual DC offset.

DC offset compensation may be imparted to the signal by various components of equalizer 42, and in particular, by variable gain amplifiers 116. In multi-stage variable gain amplifiers, the DC offset may be cumulative between stages. To correct the offset, offset controller 106 may apply a DC voltage to the signal being amplified by variable gain amplifier 116. According to a particular embodiment, offset controller 106 applies the compensation (i.e., correction) voltage in steps, wherein each step is applied at a different stage of variable gain amplifier 116. In such an embodiment, the amount of voltage applied at each step may be determined in any suitable manner. For example, the total correction voltage may be divided evenly between the steps, or it may be distributed in an amount proportional to the gain of the respective stages. It should be noted that some or all of the tasks performed by offset controller 106 may alternatively be performed by any other suitable component such as, for example, sampler 104.

Variable gain limiting amplifier (VGLA) 110 represents a component or collection of components for conditioning input signals 108 received by equalizer 42. The conditioning process adjusts the overall level of the input signal 108 to keep the signal within the dynamic range of mathematical operator (S) 112 and delay generator 114. In a particular embodiment, the amount of amplification applied by VGLA 110 is controlled by a bias current applied to VGLA 110.

Mathematical operator (S) 112 represents any component or collection of components that produces an output that is linearly proportional to the derivative of the incoming signal with respect to time, referred to as a "first-order operation." Mathematical operator S 112 may include any suitable electronic components or circuitry such as, for example, a high-pass filter for performing the desired mathematical operation. According to a particular embodiment, the operation is a derivative operation, which takes the derivative of the incoming signal with respect to time, such as, for example, the voltage change of the incoming signal per 100 pico-seconds. Mathematical operator S 112 may be applied to a signal once or multiple times, resulting in an output signal that is proportional to the first, second, third, or higher order derivative of the incoming signal with respect to time based on the number of times S 112 is applied.

Delay generator 114 represents any component or collection of components that introduces a time delay in the communication of a signal. Delay generator 114 may include any suitable electronic components or circuitry. According to a particular embodiment, the delay introduced to a signal by delay generator 114 is approximately equal to the amount of time required for mathematical operator S 112 to be applied to a signal. Thus, delay generators 114 may be used to equalize the amount of time required for each portion of the input signal to travel down the corresponding path 101A, 101B, or 101C. In this way, the respective portions of the signals may be synchronized when they arrive at mixer 118.

Variable gain amplifiers 116 represent any component or components for amplifying a signal. Variable gain amplifiers 116 may include any suitable electronic components, and in a particular embodiment, each variable gain amplifier 116 is controlled by a bias current applied to the particular variable gain amplifier 116. In some cases, the response time of particular components performing the amplification may be too high, so that the amplifier cannot effectively amplify high-frequency signals that change rapidly between high and low values. Accordingly, variable gain amplifier 116 may include a series of stages, each of which performs part of the overall amplifications. Because no stage has the burden of performing all of the amplification, the time required for each stage to apply its respective gain is also less. This allows the multi-stage variable gain amplifier 116 to respond to higher frequency signals.

Variable gain amplifiers 116 may also impart a DC offset compensation to the signal. In multi-stage amplifiers, each stage may impart a DC offset compensation. One method of correcting the DC offset is to apply a correction voltage to correct the DC offset in the signal. The correction voltage may be applied entirely to the initial signal before it is amplified. However, applying the voltage entirely at one point may take the signal out of the dynamic range of one or more stages of amplifier 116. Furthermore, the voltage applied is recalculated and adjusted every time a new stage is added, and if the gain is variable in each stage, the DC offset may be unevenly distributed among the stages. In order to deal with this difficulty, particular embodiments may include applying a correction voltage at multiple stages of amplifier 116. This allows the DC offset for each stage to be corrected at that stage, reducing the chance that a correction will take the signal out of the dynamic range of the amplifier and removing the need to recalculate the DC offset for the entire array each time a stage is added. Furthermore, applying the correction voltage at each stage facilitates correcting the DC offset when the gain of each stage is independently variable, so that different stages may have different gains and may impart different DC offsets.

Mixer 118 represents a component or collection of components for recombining the signals on communications paths 101A, 101B, and 101C into a single signal. Mixer 118 may include any suitable electronic components. Mixer 118 provides the combined signal to drive amplifier 120. Drive amplifier 120 represents any component or collection of components for amplifying the combined signal. Drive amplifier 120 performs any suitable amplification on the combined signal to produce equalizer output 46 from equalizer 42 that has a sufficiently high signal level to allow effective communication of the output signal to sampler 104.

In operation, equalizer 42 receives an input signal 108 comprising an input data signal that has been attenuated by communication through a communication medium. VGLA 110 conditions the signal so that the signal level is within the dynamic range of mathematical operator (S) 112 and delay generator 114. Equalizer 42 divides the input signal among three paths 101A, 101B, and 101C. The signal on path 101A is delayed twice by delay generators 114 to synchronize the signal on path 10A with the signal on path 10B, which is subject to mathematical operator 112 once and delayed once by delay generator 114, and with the signal on path 101C, which is subject to mathematical operators 112 twice. Thus, the input signal components on the three paths 101A, 101B, and 101C correspond to the input signal subject to no mathematical operation, a first-order operation, and a second-order operation, respectively, and the three components are synchronized (using delay generators 114) to arrive at mixer 118 at approximately the same time.

Equalizer 42 then amplifies the signal on each path using the respective variable gain amplifier 116. The gain of each amplifier 116 is controlled by adaptive controller 102, and the gain may be different for each path 101A, 101B, and 101C. This allows equalizer 42 to provide different degrees of compensation for loss effects that have different proportionality relationships with the frequency of the signal. In general, the amount of compensation for a particular effect relative to the base signal is proportional to the ratio of the amplification of the corresponding path to the amplification of the unmodified signal on path 101A. Accordingly, path 101A may apply no gain or a slightly negative gain (in dB) in order to increase the relative effect of the compensation applied to other paths. Offset controller 106 corrects any DC offset imparted to the respective signals on each path 101A, 101B, and 101C by the corresponding amplifier 116 and/or by any other suitable component.

The amplified signals from each path are combined into a single signal by mixer 118. Drive amplifier 120 amplifies this output signal to allow effective communication of the output signal to another destination. Sampler 104 receives the equalizer output signal 46 from drive amplifier 120 and a clock signal from clock 105. Sampler 104 samples the equalizer output signal 46 at set intervals defined by the clock signal to generate data values and boundary values associated with the equalizer output signal 46. Alternatively, sampler 104 may sample the equalizer output signal 46 to generate only data values and forward the sampled data values and other suitable phase information to adaptive controller 102 and offset controller 106. Adaptive controller 102 and offset controller 106 may then derive one or more boundary values using the forwarded data values and phase information. Generally, if the phase is early, the high or low value of the boundary value is the same as the high or low value of the immediately preceding data value. If the phase is late, the high or low value of the boundary value is the same as the high or low value of the immediately following data value.

As described in further detail below, adaptive controller 102 analyzes sampled data and boundary values associated with the equalizer output signal 46 to adjust the amount of gain applied to one or more paths 101A, 101B, and 101C to suitably compensate for residual frequency-dependent attenuation. Offset controller 106 analyzes sampled data and boundary values associated with the equalizer output signal 46 to adjust the amount of correction voltage applied to one or more paths 101A, 101B, and 101C to suitably cancel residual DC offset.

One advantage of not using a dedicated monitor circuit (used in many typical systems) in the adaptive equalizer described above is that the loading on the equalizer output 46 may be reduced in particular embodiments. Especially in high-speed electrical circuits, reducing the loading on equalizer output 46 may improve maximum operation speed of equalizer 42 and/or reduce the power consumed by equalizer 42. Not using a dedicated monitor circuit may also reduce chip area, may efficiently reuse existing receiver components (i.e., clock 105), and may reduce the design effort necessary to design dedicated monitor circuits.

Although particular embodiments of equalizer 42 have been described in detail, there are numerous other possible embodiments. Possible variations include, for example, applying different or additional mathematical operations to paths 101A, 101B, and 101C in order to compensate for different loss properties, increasing or decreasing the number of paths, using manual control for controllers 102 and 106 rather than automatic feedback control, using single-stage amplifiers 116, receiving (and suitably adjusting) a signal comprising differential sequences such as in, for example, low-voltage differential signaling (LVDS), and other variations suggested by the description above. In general, components may be rearranged, modified or omitted in any suitable manner, and the functions performed by components may be distributed among different or additional components or consolidated within single components in any suitable way. Accordingly, it should be understood that implementations of receiver 40, equalizer 42, and receiver logic 47 may include any such variations and that particular embodiments of the present invention may be used in any suitable equalizer context. Reference is made to the Non-Provisional Application entitled "Adaptive Equalizer with DC Offset Compensation," Ser. No. 10/783,170, filed Feb. 20, 2004, for greater detail about particular example equalizer components that may be used.

As discussed above, a signal transmitted over channel 30 and received at receiver 40 may experience frequency-dependent attenuation. At receiver 40, equalizer 42 may apply a gain to the received input signal to compensate for the attenuation exhibited by the signal. Receiver logic 47 may analyze the adjusted equalizer output signal 46 for residual attenuation and adjust the gain applied by equalizer 42 to the input signal based on this feedback. Specifically, sampler 104 may receive the equalizer output signal 46 (the adjusted input signal) and a clock signal and sample the output signal at particular points determined by the clock signal to generate data values and boundary values. Sampler 104 may then forward these data and boundary values to adaptive controller 102 for suitable analysis (as described below). Based on this analysis, adaptive controller 102 may adjust the gain applied to the incoming input signal.

Figure 4A:
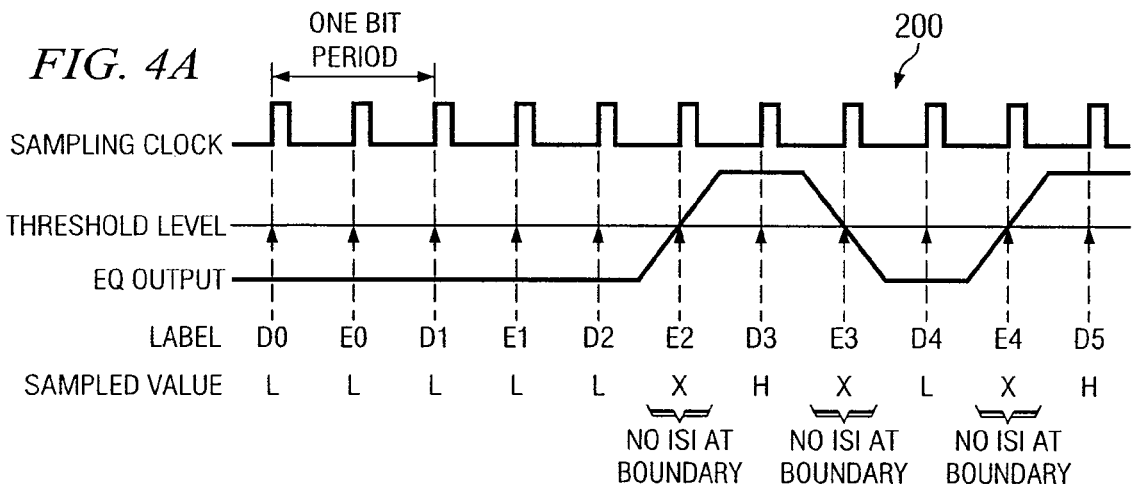
FIGS. 4A, 4B, and 4C illustrate examples of a clock signal in comparison with an equalizer output signal exhibiting types of inter-symbol interference effects.
Figure 4B:
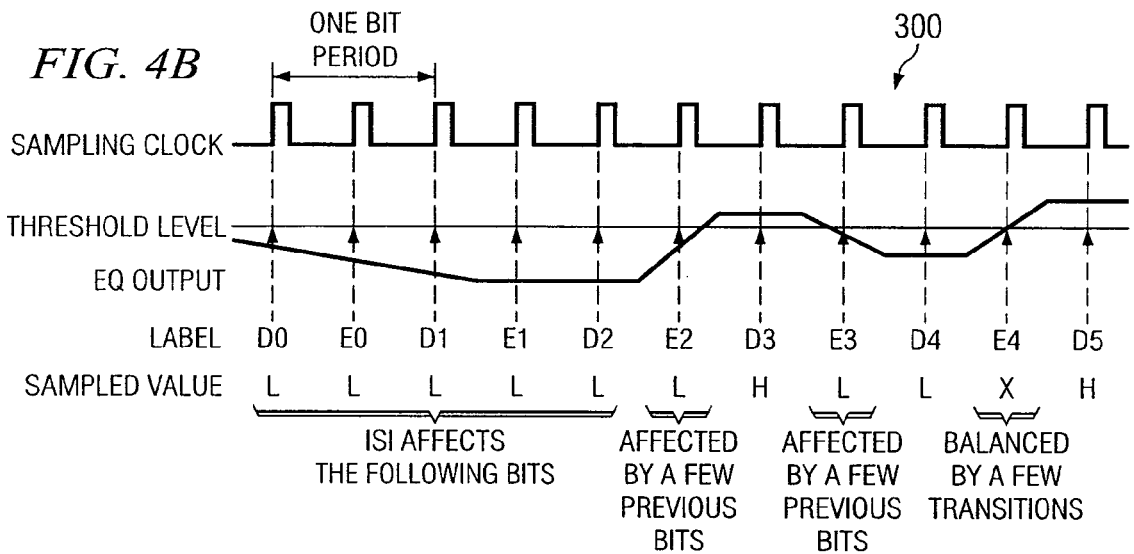
Figure 4C:
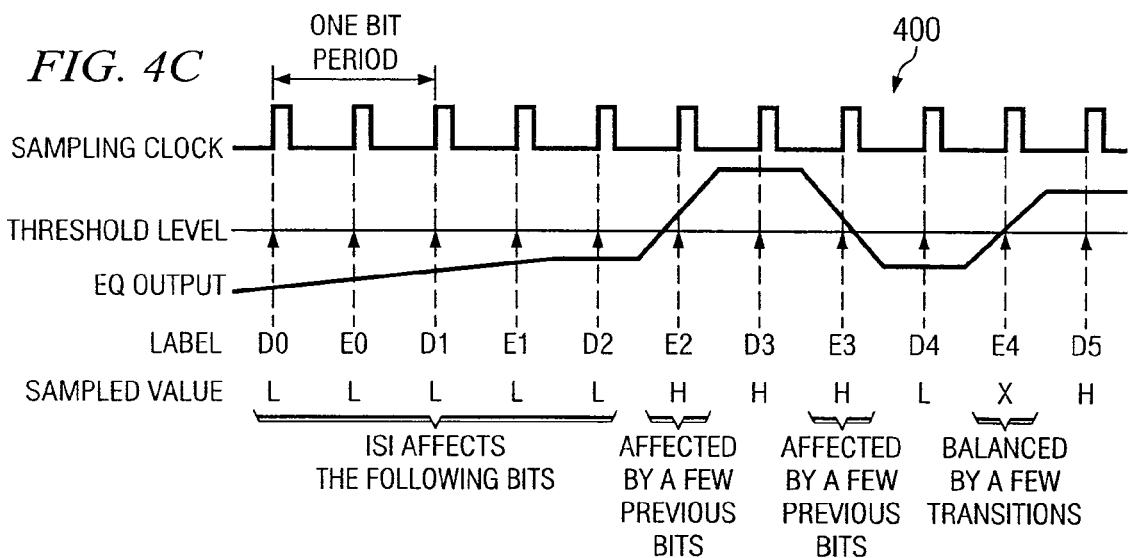

FIGS. 4A, 4B, and 4C illustrate examples of a clock signal in comparison with an equalizer output signal exhibiting types of inter-symbol interference effects. In particular embodiments, sampler 104 may receive signals such as those illustrated in these figures and sample the output signal according to a 2× over-sampling clock and data recovery (CDR) scheme. In such a scheme, sampler 104 may sample the received signal two times per data bit period, which may be defined by the clock signal. For one data bit period, sampler 104 may, for example, sample the output signal once at a point in the output signal that should correspond to a data value and once at a point in the output signal that should correspond to a boundary value. Based on an analysis of particular data and boundary values, as described further below, adaptive controller 102 may adjust the gain applied to the signal received by equalizer 42.

FIG. 4A illustrates an example 200 of a clock signal in comparison with an equalizer output signal 46 that is in-phase with the clock signal and that exhibits no inter-symbol-interference effects. The clock signal defines data points (illustrated as arrows corresponding to D0-D5) and boundary points (illustrated as arrows corresponding to E0-E4). Sampler 104 may sample the equalizer output signal 46 at a data point to generate a data value (i.e., D0-D5) and at a boundary point to generate a boundary value (i.e., E0-E4). Each sampled data value and boundary value may comprise a low value (illustrated as "L"), a high value (illustrated as "H"), or an random value (illustrated as "X") that takes either a high value or a low value randomly. In particular embodiments, a low value may comprise a "0," a high value may comprise a "1," a random value may randomly comprise either a "0" or a "1," and an average of random values may comprise "0.5." In alternative embodiments, a low value may comprise a "−1," a high value may comprise a "1," a random value may randomly comprise either a "−1" or a "1," and an average of random values may comprise "0." Sampler 104 may forward sampled data values and boundary values to adaptive controller 102 for suitable processing and adjustment of gain.

A change from a high to a low value or from a low to a high value between two successive data values is referred to as a transition. In the illustrated example 200, transitions occur between low data value D2 and high data value D3, between high data value D3 and low data value D4, and between low data value D4 and. high data value D5. In a signal exhibiting no residual inter-symbol interference effects, such as in example 200, each boundary value between two successive data values comprising opposite values (e.g., boundary values E2, E3, and E4) typically comprises a random value (illustrated as "X"). For such a signal, adaptive controller 102 may adjust the gain applied to the input signal up or down randomly, as inter-symbol interference effects are already being fully compensated or do not exist. If the numbers of up adjustments and down adjustments are substantially equal, the gain applied to the input signal remains on average at the same level. If the numbers of up adjustments and down adjustments are not substantially equal, the gain applied to the input signal may drift slightly from the initial level. Such drift of the gain level may produce slight residual inter-symbol interference. The equalizer receiver may detect this interference and correct the gain back to the average initial level, as illustrated below.

FIG. 4B illustrates an example 300 of a clock signal in comparison with an equalizer output signal 46 that is in-phase with the clock signal but that exhibits under-compensated residual inter-symbol interference effects. In this case, the equalizer has not compensated the signal sufficiently, and the signal is low-frequency oriented. In a low-frequency oriented signal, if a data pulse (e.g., the data pulse at D3) occurs after several successive data values of the same high or low value have passed (e.g., D0-D2), the data pulse height may be lowered by the lack of high-frequency component. Also, the boundary values before (e.g., E2) and after (e.g., E3) the data pulse will likely be the same as the high or low value of the data value (e.g., D2) before the pulse (i.e., they will not comprise a random value). Thus, as described further below, upon analyzing particular data values and boundary values, adaptive controller 102 may increase the gain applied to the input signal to compensate for the low-frequency distortion. It should be noted, however, that in particular embodiments and as described below, adaptive controller 102 may not be able to compensate for the low-frequency distortion exhibited by the output signal until a transition (e.g., between D2 and D3) occurs. The boundary value after a few successive transitions (e.g., at E4) may comprise a random value "X" because such successive transitions may increase a high-frequency component and decrease a low-frequency component in the signal, and hence, may reduce the sensitivity of the boundary value to the residual inter-symbol interference.

FIG. 4C illustrates an example 400 of a clock signal in comparison with an equalizer output signal 46 that is in-phase with the clock signal but that exhibits over-compensated residual inter-symbol interference effects. In this case, the equalizer has applied too much compensation to the input signal, and the signal is high-frequency oriented. In a high-frequency oriented signal, if a data pulse (e.g., the data pulse at D3) occurs after several successive data values of the same high or low value have passed (e.g., D0-D2), the pulse height may be raised by the emphasized high-frequency component. Also, the boundary values before (e.g., E2) and after (e.g., E3) the data pulse will likely be the opposite of the high or low value of the data value (e.g., D2) before the data pulse (i.e., they will not comprise a random value). Thus, as described further below, upon analyzing particular data values and boundary values, adaptive controller 102 may reduce the gain applied to the input signal to compensate for the high-frequency distortion. It should be noted, however, that in particular embodiments and as described below, adaptive controller 102 may not be able to compensate for the high-frequency distortion exhibited by the output signal until a transition (e.g., between D2 and D3) occurs. The boundary value after a few successive transitions (e.g., at E4) may comprise a random value "X" because such successive transitions may increase a high-frequency component and decrease a low-frequency component in the signal, and hence, may reduce the sensitivity of the boundary value to the residual inter-symbol interference.

Figures 5, 6:
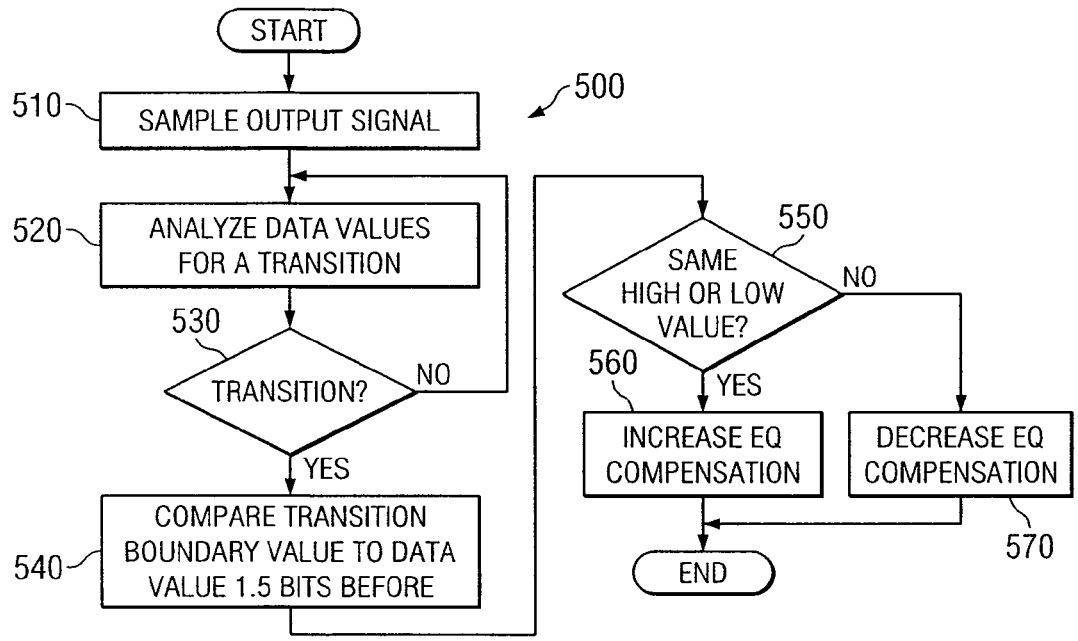
FIG. 5 is a flowchart illustrating a method for interpreting output signal values to compensate for residual inter-symbol interference according to a particular embodiment of the invention.
FIG. 6 is a table illustrating an example gain control scheme associated with the method of FIG. 5.

FIG. 5 is a flowchart illustrating a method 500 for interpreting output signal values to compensate for residual inter-symbol interference according to a particular embodiment of the invention. The method begins at step 510, in which an output signal is sampled using a clock signal. The output signal may be the output of an equalizer, and the output signal may be sampled according to a clock signal, as described above in conjunction with FIG. 3.

In particular embodiments, the output signal may be sampled at reference data points and boundary points determined by the clock signal. Alternatively, the output signal may not be sampled at boundary points, and boundary values corresponding to these non-sampled points may be derived. In particular embodiments, adaptive controller 102 may derive boundary values from sampled data values and other phase information (i.e., whether the phase of the output signal is early or late). For example, if the phase of the output signal is early, adaptive controller 102 may determine that the high or low value of the boundary value is the same as the high or low value of the data value immediately preceding the boundary value. If the phase of the output signal is late, adaptive controller 102 may determine that the high or low value of the boundary value is the same as the high or low value of the data value immediately after the boundary value.

At step 520, after the output signal is sampled, the sampled data values may be analyzed to determine if a transition has occurred in the values. This analysis may be performed, for example, by adaptive controller 102. At step 530, if a transition is not detected, the method returns to step 520. If a transition is detected between successive data values, the method proceeds to step 540. It should be noted that, in particular embodiments, a transition may be detected by comparing the received data values to each other directly. In alternative embodiments, a transition may be detected by comparing the received data values and boundary values to pre-defined value patterns that comprise a transition (and that correspond to particular adaptive control actions). It should further be noted that, in particular embodiments, adaptive action may take place after detecting only one transition.

If a transition is detected, at step 540, the boundary value between the successive data values comprising the transition is compared to the data value 1.5 bits (or symbols) before the boundary value. In particular embodiments, the relationship between the boundary value and the data value 1.5 bits (or symbols) before the boundary value may determine the adaptive equalizer action response. For example, in particular embodiments, an exclusive-OR (XOR) operation (or an exclusive-NOR (XNOR) operation) may be applied to the two values. In such embodiments, the result of the XOR operation (or XNOR operation) may correspond to a particular type of inter-symbol interference exhibited by the output signal and, thus, may be used to determine the adaptive equalizer action response. In alternative embodiments, an inverted correlation function (or a correlation function) may be applied to the two values. In such embodiments, the result of the inverted correlation function (or correlation function) may correspond to a particular type of inter-symbol interference exhibited by the output signal and, thus, may be used to determine the adaptive equalizer action response. In yet alternative embodiments, the boundary value and the data value 1.5 bits (or symbols) before the boundary value may be compared by comparing the received data values and boundary values to pre-defined value patterns (that correspond to particular adaptive control actions). Also, in alternative embodiments, data values closer or farther from the boundary value may be used, and not necessarily the data value 1.5 bits (or symbols) before the boundary value. It should be noted that although some of the discussion herein is phrased in terms of bits, such discussion may alternatively be interpreted to refer to symbols, if appropriate.

It should also be noted that the analysis of boundary values described above (and below) is an example only. More generally, error values, such as, for example, the particular boundary values described, may indicate residue of distortion (frequency-dependent distortion and/or DC-offset distortion, discussed further below) based on a sampling of an output signal. Based on the error value generated, the loss compensation (and/or the offset compensation) applied to a data signal may be adjusted. In particular embodiments, for example, the error value may comprise a pulse-width value (wide, narrow, or typical), and the pulse-width value may be derived from two successive boundary values and an in-between data value in three successive data values with two transitions. The pulse-width value may be used to adjust the loss compensation applied.

At step 550, a determination is made whether the boundary value and the data value 1.5 bits (or symbols) before the boundary value have the same high or low value. In particular embodiments, the two values may be compared in the XOR (or XNOR) operation, as described above. In alternative embodiments, an inverted correlation function (or correlation function) may be applied to the two values. In yet alternative embodiments, the two values may be compared by comparing them to pre-defined patterns. If the two values have the same high or low value (e.g., if the XOR result equals "0", if the inverted correlation function result equals "−1", or if the values correspond to a particular pre-defined value pattern), the method proceeds to step 560. At step 560, the equalizer increases the gain applied to the signal. The increase in gain compensates, in particular embodiments, for the under-compensated residual inter-symbol interference exhibited by the signal. Such interference is suggested by the "0" XOR result, as illustrated in FIG. 4B.

It should be noted that, in alternative embodiments, the adaptive control action may be any suitable adaptive control action in various conventional adaptive control algorithms. For instance, the adaptive control action may be based on conventional adaptive control algorithms, such as the Least-Mean-Square (LMS) algorithm, the Sign-Sign-Least-Mean-Square (SS-LMS) algorithm, the Zero-Forcing (ZF) algorithm, and so on.

If, at step 550, a determination is made that the boundary value and the data value 1.5 bits (or symbols) before the boundary value have the opposite high or low value (e.g., if the XOR result equals "1", if the inverted correlation function result equals "+1", or if the values correspond to a particular pre-defined value pattern), the method proceeds to step 570. At step 570, the equalizer decreases the gain applied to the signal. The decrease in gain compensates, in particular embodiments, for the over-compensated residual inter-symbol interference exhibited by the signal. Such interference is suggested by the "1" XOR result, as illustrated in FIG. 4C.

It should be noted that, in particular embodiments, steps 550, 560, and 570 may be performed by adaptive controller 102, and the applied gain may be adjusted using variable gain amplifiers 116. Also, in particular embodiments, if gain is applied to more than one signal path (e.g., to paths 101 in example equalizer 42), the applied gain may be adjusted in one path and fixed for the other paths. In alternative embodiments, an independent control variable may be mapped to the plurality of paths using a particular function, and gain may be applied to the paths according to the mapping. Alternatively, gain may be adjusted independently for each path, as discussed further below in conjunction with FIGS. 7-10.

FIG. 6 is a table 600 illustrating an example gain control scheme associated with the method 500 of FIG. 5. Each row 602 corresponds to a particular pattern of values for which a particular adaptive equalizer control action is performed. Columns 610 include a high or low value ("+1" or "−1" in this particular example, although it may be "1" or "0," or any other suitable values, in other examples) for each of a series of sampled data and boundary values. Column "D1" includes a first sampled data value of an output signal, column "D2" includes a second sampled data value of the output signal, column "D3" includes a third sampled data value of the output signal, and column "E2" includes the boundary value between the second and third data values. These values are similar to those illustrated in FIGS. 4A-4C. As can be observed, a transition occurs between data values in columns "D2" and "D3" in each pattern.

It should be noted that the pattern of values in each row 602 may be sampled by sampler 104 and sent to adaptive controller 102. In particular embodiments, adaptive controller 102 may receive a greater number of values than that illustrated, including, for example, the boundary value between data values in columns "D1" and "D2." Alternatively, as discussed above, adaptive controller 102 may receive only sampled data values and other phase information, and particular boundary values (including, for example, boundary values in column E2) may be derived from the data values and phase information (and may not be sampled by sampler 104).

Column 612 includes ISI levels. An ISI level is derived from particular values associated with an output signal. For example, an ISI level may be the result of an inverted correlation function applied to a boundary value between two data values comprising a transition and the data value 1.5 bits before the boundary value. In particular embodiments, the ISI level may be calculated as the inverted value of the product of the boundary value and the data value using "+1/−1" values corresponding to "high/low" values. In table 600, an ISI level in column 612 is the result of an inverted correlation function applied to the boundary value in column E2 and the data value in column D1 (1.5 bits before the boundary value) in the same row 602. The ISI level may be calculated as the inverted value of the product of E2 and D1 using "+1/−1" values corresponding to "high/low" values. As illustrated in columns 614 and 616, an ISI level of "−1" is associated with an under-compensated equalization level and an increase in equalizer compensation. An ISI level of "+1" is associated with an over-compensated equalization level and a decrease in equalizer compensation. Thus, based on the ISI level, a particular adaptive equalizer action is applied. In alternative embodiments, the received data and boundary values may be compared to pre-defined value patterns, and these pre-defined value patterns may correspond to particular adaptive control actions.

It should be noted that, in particular embodiments, adaptive controller 102 may receive a stream of sampled values and select appropriate ones of these values (e.g., the boundary value between two data values comprising a transition and the data value 1.5 bits before the boundary value). Adaptive controller 102 may then, for example, derive ISI levels from these selected values by applying an inverted correlation function to these selected values. Adaptive controller 102 may then apply a suitable adaptive control action based on the result of the inverted correlation function. Alternatively, adaptive controller 102 may compare the sampled values to pre-defined patterns of values (that correspond to particular adaptive control actions). Based on the particular pre-defined pattern of values to which the sampled values corresponds, adaptive controller 102 may apply the corresponding adaptive control action.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

In particular embodiments, an equalizer, such as equalizer 42 of FIG. 3, may control more than one independent parameter, such as, for example, the unmodified, first-order, and second-order components of a signal. Examples of multi-parameter (multi-dimensional) equalizers include second-order derivative equalizers and 3-tap finite impulse response (FIR) filters. As discussed above, method 500 may be used in multi-dimensional equalizers if, for example, the applied gain is adjusted for one parameter and fixed for the other parameters. Alternatively, method 500 may be used in multi-dimensional equalizers if the applied gain is adjusted according to a particular function that incorporates the plurality of independent parameters (but does not adjust gain independently for each independent parameter). In the alternative, the applied gain may be adjusted independently for each independent control parameter. In a 3-tap FIR filter, for example, the second and third tap coefficients may be adjusted independently, and each of these adjustments may comprise an adjustment to compensation for distortion, as described further below.

Compensation, such as, for example, gain, may be adjusted independently for each independent control parameter based on particular relationships between one or more sampled data values and the sampled data value 1.5 bits before a boundary value that is between successive data values that comprise a transition. Particular relationships may, for example, correspond to particular types of inter-symbol interference for particular independent control parameters. When, for example, adaptive controller 102 detects such relationships among a plurality of sampled data values (e.g., using pre-defined data value patterns), adaptive controller 102 may apply particular adaptive equalizer control actions to adjust the particular one or more independent control parameters.

The pre-defined data value patterns used by adaptive controller 102 to compare to the incoming stream of sampled data values may be particularly sensitive to inter-symbol interference for particular independent control parameters. These patterns may be selected, for example, based on the sensitivity of the boundary value between the data values comprising a transition to the independent control parameter being adjusted. In particular, these patterns may be selected based on the partial derivative of the equalized-channel impulse response with respect to that independent control parameter (e.g., on the sign and magnitude of the partial derivative). This is because equalizer output signal 46 is represented as a convolution of the transmit data sequence and the equalized-channel impulse response.

For example, in an analog, second-order derivative equalizer, the partial derivative of the equalized-channel impulse response with respect to the first-order derivative gain may be assumed to be negative at 1.5 and 2.5 bits after the peak. Hence, if the first-order derivative gain is too high, a correlation between a boundary value and a data value 1.5 and 2.5 bits before the boundary value will be likely both negative. On the other hand, if the first-order derivative gain is too low, a correlation between a boundary value and a data value 1.5 and 2.5 bits before the boundary value will be likely both positive. This is because the data corresponds to the peak of the impulse response and the boundary corresponds to the tail after the peak in the impulse response. The partial derivative of the equalized-channel impulse response with respect to the second-order derivative gain may be assumed to be negative at 1.5 bits after the peak and positive at 2.5 bits after the peak. Hence, if the second-order derivative gain is too high, a correlation between a boundary value and a data value 1.5 bits before the boundary value will be likely negative, and a correlation between a boundary value and a data value 2.5 bits before the boundary value will be likely positive. On the other hand, if the second-order derivative gain is too low, a correlation between a boundary value and a data value 1.5 bits before the boundary value will be likely positive, and a correlation between a boundary value and a data value 2.5 bits before the boundary value will be likely negative. Using these relationships, various techniques (e.g., method 700, described below) may be used to adjust the gain applied to a first-order derivative component of an input signal and the gain applied to a second-order derivative component of the input signal.

As another example, in a 3-tap finite impulse response (FIR) filter equalizer where the main tap is the first tap, the partial derivative of the equalized-channel impulse response with respect to the second tap coefficient may be assumed to be positive at 1.5 and 2.5 bits after the peak. The partial derivative of the equalized-channel impulse response with respect to the third tap coefficient may be assumed to be zero at 1.5 bits after the peak and positive at 2.5 bits after the peak. Using these relationships, various techniques (e.g., method 1000, described below) may be used to adjust the second tap coefficient and the third tap coefficient. In this manner, the FIR filter equalizer may apply multi-tap FIR-filter equalization in parallel. It should be noted that different relationships may be used for different types of equalizers. For example, different relationships may be used for a multi-tap decision-feedback equalizer applying multi-tap decision-feedback equalization in parallel.

FIG. 7 is a flowchart illustrating an example method 700 for interpreting output signal values for multiple independent control parameters in an analog second-order derivative equalizer according to a particular embodiment of the invention. For an analog second-order derivative equalizer, three independent control parameters may be controlled, including, for example, the gain applied to an unmodified portion of an input signal, the gain applied to a portion of the input signal modified to be the first-order derivative of the input signal, and the gain applied to a portion of the input signal modified to be the second-order derivative of the input signal. Parallel compensation may be applied, for example, by analog continuous-time first-order derivative-filter equalization and/or by analog continuous-time second-order derivative filter equalization.

Method 700 begins at step 710. Steps 710-770 may be the same as steps 510-570 in method 500 described above and thus will not be described in detail again. It should be noted, however, that in steps 710-770, the first independent parameter may be controlled for a first path. For example, steps 710-770 may be used to adjust the gain applied to an unmodified portion of an input signal in a first path (such as path 101A of equalizer 42). In particular embodiments, increasing equalizer compensation in the first path may be implemented by decreasing the gain applied to an unmodified portion of an input signal in a first path, and decreasing equalizer compensation in the first path may be implemented by increasing the gain applied to an unmodified portion of an input signal in a first path. This is because the amount of equalizer compensation may depend on the relative gain of the second and third paths to the first path, and thus, increasing the gain of the first path will effectively decrease the relative gain of the second and third paths to the first path. In steps 780-850, the second and third independent parameters may be controlled for a second path and third path, respectively. For example, steps 780-850 may be used to adjust the gain applied to a portion of the input signal modified to be the first-order derivative of the input signal in a second path (such as path 101B of equalizer 42) and to adjust the gain applied to a portion of the input signal modified to be the second-order derivative of the input signal in a third path (such as path 101C of equalizer 42).

At steps 780 and 790, if the boundary value between the data values that comprise the transition and the data value 1.5 bits before the boundary value have a different value (high or low), a determination is made whether the value (high or low) of the data value 1.5 bits before the boundary value is the same as or opposite of the value of the data value 2.5 bits before the boundary value. This determination may be made, for example, by performing a suitable operation or by comparing the received data values and boundary values to pre-defined value patterns (that correspond to particular adaptive control actions). If the two values are different (opposite), method 700 proceeds to step 800, and the gain applied to the second-order derivative component of the input signal in the third path is decreased. If the two values are the same, method 700 proceeds to step 810, and the gain applied to the first-order derivative component of the input signal in the second path is decreased.

At steps 820 and 830, if the boundary value between the data values that comprise the transition and the data value 1.5 bits before the boundary value have the same value (high or low), a determination is made whether the value (high or low) of the data value 1.5 bits before the boundary value is the same as or opposite of the value of the data value 2.5 bits before the boundary value. Again, this determination may be made, for example, by performing a suitable operation or by comparing the received data values and boundary values to pre-defined value patterns (that correspond to particular adaptive control actions). If the two values are different (opposite), method 700 proceeds to step 840, and the gain applied to the second-order derivative component in the third path is increased. If the two values are the same, method 700 proceeds to step 850, and the gain applied to the first-order derivative component in the second path is increased.

It should be noted that, as described above in method 700, the number of independent control parameters may be the same as the number of adjusted parameters in particular embodiments. In alternative embodiments, the number of independent control parameters may be less than the number of adjusted parameters. For example, in an analog 2nd-order derivative equalizer, there may be two independent control parameters (i.e., a first gain applied to the first-order derivative component of the input signal and a second gain applied to the second-order derivative component of the input signal), and there may be three adjusted parameters (i.e., a third, fixed gain applied to the unmodified component of the input signal). As another example, a first independent control variable may control the relationship between the gain applied to the unmodified component and the gain applied to the first-order derivative component, and a second control variable may control the relationship between the gain applied to the second-order derivative component and the greater of the gain applied to the unmodified component and the gain applied to the first-order derivative component. Method 700 may be modified, as appropriate, to satisfy these different situations.

FIG. 8 is a table 900 illustrating an example gain control scheme associated with the method 700 of FIG. 7. Each row 902 corresponds to a particular pattern of values for which a particular adaptive equalizer control action is performed. Column 910 includes patterns of sampled data and boundary values, where a value may have a high ("1") or a low ("0") value. Column "D0" includes a zeroeth sampled data value of an output signal, column "D1" includes a first sampled data value of the output signal, column "D2" includes a second sampled data value of the output signal, column "D3" includes a third sampled data value of the output signal, and column "E2" includes the boundary value between the second and third data values. These values are similar to those illustrated in FIGS. 4A-4C. As can be observed, a transition occurs between data values in columns "D2" and "D3" in each pattern.

It should be noted that the values in each row 902 may be sampled by sampler 104 and sent to adaptive controller 102. Adaptive controller 102 may compare the sampled values to one or more pre-determined patterns of values. In particular embodiments, upon detecting a match, adaptive controller 102 may take an associated set of one or more adaptive equalizer actions. In such embodiments, particular relationships among the values may already be known (e.g., because a pre-determined pattern of values is being used), and thus one or more of the steps described above in method 700 need not be performed (e.g., steps 780, 790, 820, and 830).

It should further be noted that in particular embodiments, adaptive controller 102 may receive a greater number of values than that illustrated, including, for example, the boundary value between data values in columns "D0" and "D1" and the boundary value between data values in columns "D1" and "D2." Alternatively, as discussed above, adaptive controller 102 may receive only sampled data values and other phase information, and particular boundary values (including, for example, boundary values in column E2) may be derived from the data values and other phase information (and may not be sampled by sampler 104).

Column 920 includes alternative boundary values at column "E2" for each row 902. Column 924 includes, for particular patterns, particular compensation levels and adaptive equalizer actions associated with the unmodified component of the input signal. The adaptive equalizer actions may be applied as discussed above in method 700. Column 930 includes, for particular patterns, particular compensation levels and adaptive equalizer actions associated with the first-order derivative component of the input signal. These adaptive equalizer actions may also be applied as discussed above in method 700. Column 940 includes, for particular patterns, particular compensation levels and adaptive equalizer actions associated with the second-order derivative component of the input signal. These adaptive equalizer actions may also be applied as discussed above in method 700.

Figure 9:
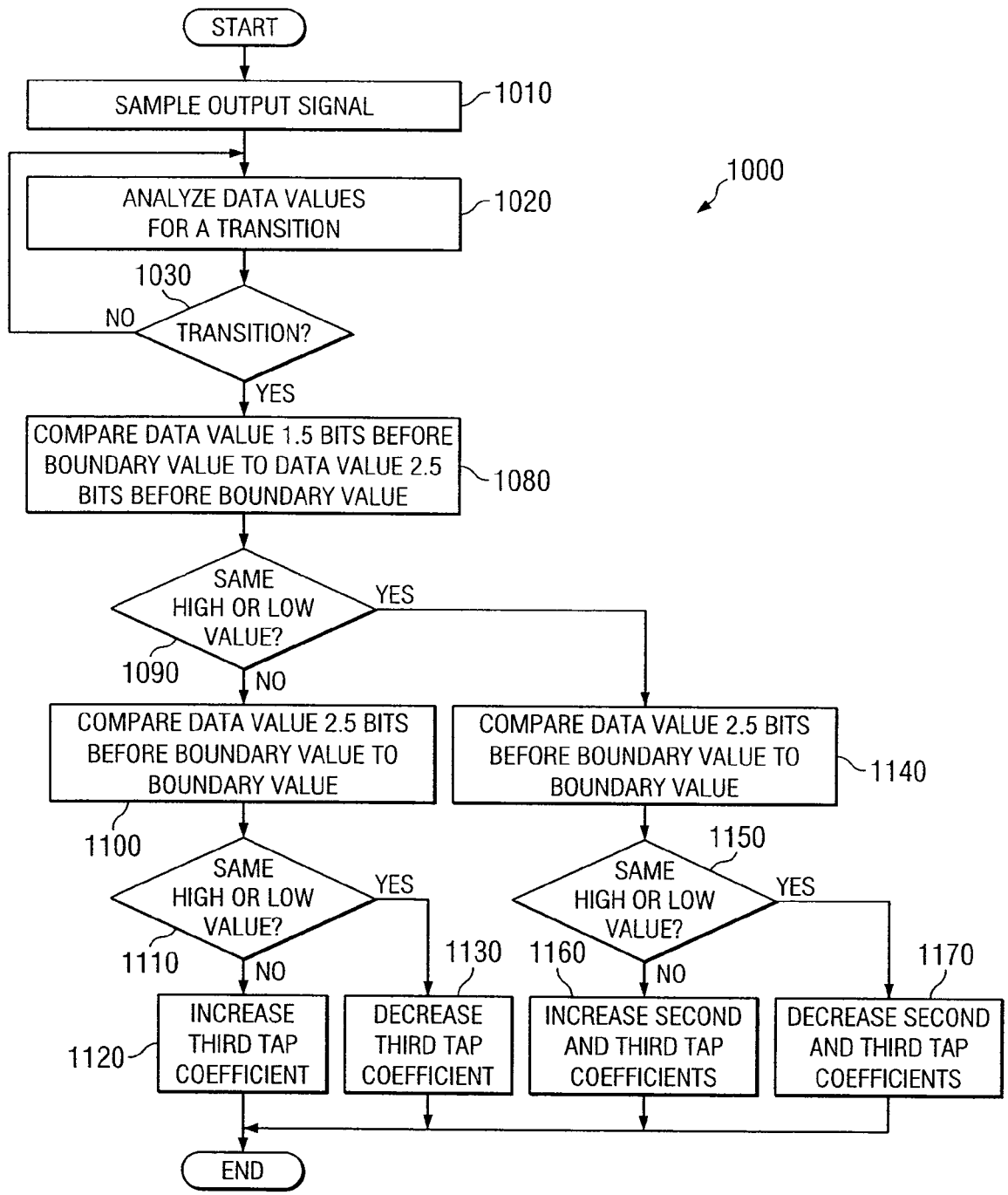
FIG. 9 is a flowchart illustrating an example method for interpreting output signal values for multiple equalizer parameters in a 3-tap FIR filter according to a particular embodiment of the invention.

FIG. 9 is a flowchart illustrating an example method 1000 for interpreting output signal values for multiple equalizer parameters in a 3-tap FIR filter according to a particular embodiment of the invention. Method 1000 begins at step 1010. Steps 1010-1030 may be similar to steps 510-530 in method 500 described above and thus will not be described again in detail. In particular embodiments, the first tap coefficient may be fixed and not adjusted by the adaptive control. Steps 1080-1170 may adjust the second and third tap coefficients. It should be noted that, in a 3-tap FIR filter, the second and third tap coefficients may be adjusted independently, as described further below, and each of these adjustments may comprise an adjustment to compensation for distortion. In general, whether in the context of the 3-tap FIR filter equalizer, the analog derivative filter equalizer, or any other suitable equalizer, even if each path performs only part of the compensation and the compensation occurs only in the aggregate when the outputs from all the paths are combined together, the action performed on each path may be referred to as an application of or adjustment to compensation for distortion.

At steps 1080 and 1090, a determination is made whether the value (high or low) of the data value 1.5 bits before the boundary value that is between the data values that comprise the transition is the same as or opposite of the value of the data value 2.5 bits before the boundary value. This determination may be made, for example, by performing a suitable operation or by comparing the received data values and boundary values to pre-defined value patterns (that correspond to particular adaptive control actions). If the two values are different (opposite), method 1000 proceeds to step 1100. If the two values are the same, method 1000 proceeds to step 1140.

At steps 1100 and 1110, a determination is made whether the value (high or low) of the data value 2.5 bits before the boundary value that is between the data values that comprise the transition is the same as or opposite of the value of the boundary value. This determination may be made, for example, by performing a suitable operation or by comparing the received data values and boundary values to pre-defined value patterns (that correspond to particular adaptive control actions). If the two values are different (opposite), method 1000 proceeds to step 1120, and the third tap coefficient is increased. If the two values are the same, method 1000 proceeds to step 1130, and the third tap coefficient is decreased.

At steps 1140 and 1150, a determination is made whether the value (high or low) of the data value 2.5 bits before the boundary value that is between the data values that comprise the transition is the same as or opposite of the value of the boundary value. Again, this determination may be made, for example, by performing a suitable operation or by comparing the received data values and boundary values to pre-defined value patterns (that correspond to particular adaptive control actions). If the two values are different (opposite), method 1000 proceeds to step 1160, and the second and third tap coefficients are increased. If the two values are the same, method 1000 proceeds to step 1170, and the second and third tap coefficients are decreased.

FIG. 10 is a table 1200 illustrating an example gain control scheme associated with the method of FIG. 9. Each row 1202 corresponds to a particular pattern of values for which a particular adaptive equalizer control action is performed. Column 1210 includes patterns of sampled data and boundary values, where a value may be a high ("1") or a low ("0") value. Column "D0" includes a zeroeth sampled data value of an output signal, column "D1" includes a first sampled data value of the output signal, column "D2" includes a second sampled data value of the output signal, column "D3" includes a third sampled data value of the output signal, and column "E2" includes the boundary value between the second and third data values. These values are similar to those illustrated in FIGS. 4A-4C. As can be observed, a transition occurs between data values in columns "D2" and "D3" in each pattern.

It should be noted that the pattern of values in each row 1202 may be sampled by sampler 104 and sent to adaptive controller 102. Adaptive controller 102 may compare the sampled values to one or more pre-determined patterns of values. In particular embodiments, upon detecting a match, adaptive controller 102 may take an associated set of one or more adaptive equalizer actions. In such embodiments, particular relationships among the values may already be known (e.g., because a pre-determined pattern of values is being used), and thus one or more of the steps described above in method 1000 need not be performed (e.g., step 1080).

It should further be noted that in particular embodiments, adaptive controller 102 may receive a greater number of values than that illustrated, including, for example, the boundary value between data values in columns "D0" and "D1" and the boundary value between data values in columns "D1" and "D2." Alternatively, as discussed above, adaptive controller 102 may receive only sampled data values and other phase information, and particular boundary values (including, for example, boundary values in column E2) may be derived from data values and other phase information (and may not be sampled by sampler 104).

Column 1220 includes alternative boundary values at column "E2" for each row 1202. Column 1230 includes, for particular patterns, particular coefficient levels and adaptive equalizer actions associated with the second tap coefficient. These adaptive equalizer actions may also be applied as discussed above in method 1000. Column 1240 includes, for particular patterns, particular coefficient levels and adaptive equalizer actions associated with the third tap coefficient. These adaptive equalizer actions may also be applied as discussed above in method 1000.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

As discussed above in conjunction with FIG. 5, the relationship between a boundary value between successive data values comprising a transition and the data value 1.5 bits before the boundary value may correlate to particular equalization levels of a signal. The correlation may be particularly accurate for a signal having well-randomized data sequences. However, if a signal has periodic or quasi-periodic data sequences, the correlation may be affected by the periodicity of the sequences. In particular, the correlation may be even more heavily affected by the periodicity of the sequences, if the incoming signal or the clock signal has duty cycle distortion.

In general, the periodic or quasi-periodic data sequence has strong correlation between data values such as adjacent data values, and affects the frequency spectrum of the signal. For instance, if adjacent data values are more likely the same value than different values, the signal is low-frequency oriented, and if adjacent data values are more likely different values than the same value, the signal is high-frequency oriented. Such distortion in the frequency spectrum of the signal may affect an adaptive equalizer's ability to make the spectrum of the signal flat. In general, the periodic or quasi-periodic data sequences have such negative effect on an equalizer's adaptive gain control, even if there is no duty cycle distortion.

Duty cycle distortion may emphasize such negative effect of periodic and quasi-periodic sequences on an equalizer's adaptive gain control. For example, suppose an incoming data may be labeled as even data and odd data in turn. Boundary between data may also be labeled as even boundary and odd boundary in turn. Here, even boundary may refer to boundary after even data and before odd data, and odd boundary may refer to boundary after odd data and before even data. The duty cycle distortion may cause the receiver logic's even and odd boundary values heavily biased to "early" phase (i.e., same as the previous data value) or "late" phase (i.e., same as the next data value). For instance, even boundary value may be biased to "early" phase, and odd boundary value may be biased to "late" phase.

If the period of periodic or quasi-periodic data sequence is a multiple of two data values, the number of transitions at even boundary and the number of transitions at odd boundary may be biased as well. For instance, transitions may occur more frequently at even boundary than odd boundary in a periodic or quasi-periodic data sequence. The equalizer control may be affected by how the boundary value is biased (i.e., whether "early" phase or "late" phase) due to duty-cycle distortion at the even or odd boundary which dominates transitions in the periodic or quasi-periodic data sequence. Such effect may not be deterministic until the recovered clock locks to the incoming periodic or quasi-periodic incoming data sequence, because the correspondence between the bias of boundary values having "early or late" phase due to duty-cycle distortion and the bias of boundary having "dominant or non-dominant" transition due to periodic or quasi-periodic data sequence may depend on how the recovered clock with duty-cycle distortion locks to the incoming periodic or quasi-periodic data sequence.

Due to such bias of boundary value, either "early" phase or "late" phase, at the "even" or "odd" boundary which dominates transitions in the periodic or quasi-periodic data sequence, equalizer control actions may also be biased. An unbalanced bias toward a particular equalizer control action may produce an unacceptable result in the equalizer control.

FIG. 11 illustrates example boundary information 1300 affected by duty-cycle distortion. A signal 1310 is received at the receiver logic and sampled using a four-phase half-rate clock with duty-cycle distortion. Even data values may be sampled at rising edges of clock A (CLKA) 1320, odd data values may be sampled at rising edges of clock C (CLKC) 1340, even boundary values may be sampled at rising edges of clock B (CLKB) 1330, and odd boundary values may be sampled at rising edges of clock D (CLKD) 1350. In the example, the duty cycle of clock B 1330 is more than 50%, and the duty cycle of clock D 1350 is less than 50%. As a result, the even boundary values sampled at the rising edge of clock B 1330 are heavily biased to an "early" phase, and the odd boundary values sampled at the rising edge of clock D 1350 are heavily biased to a "late" phase. The clock recovery loop can lock in this phase position if it takes the average of "early" counts and "late" counts. If the incoming periodic or quasi-periodic signal has biased transitions between even and odd boundary, biased phase at the boundary that dominates transitions will bias the adaptive control actions. For example, if even boundary being sampled at rising edges of clock B (CLKB) 1330 has more transitions than odd boundary being sampled at rising edges of clock D (CLKD) 1350, the adaptive control actions are biased to "early" phase at the even boundary. If these biases are not accounted for in the adaptive gain controller of the equalizer, the result of the equalizer's adaptive operation may be affected.

One way of accounting for opposite biases in even and odd boundary values is by balancing the biases. This balance may be achieved by applying adaptive equalizer actions only when the controller detects particular data patterns that are distributed substantially equally (having substantially equal probabilities of occurrence) in the two phases. These particular data patterns (which may be referred to as filter patterns) may be used to balance biases arising in (quasi-) periodic data sequences and may also be used, without a problem, with well-randomized data sequences. In this way, the characteristics of the adaptive equalizer control may be made consistent for (quasi-) periodic data sequences and well-randomized data sequences. If more than one independent control parameter exists, the adaptive equalizer control may use particular filter patterns to control the gain applied to each particular independent control parameter. In particular embodiments, the filter patterns used to control the gain applied to a particular control parameter may be selected from the set of substantially equally occurring patterns and according to the partial gradient of the equalized-channel impulse response for the parameter, as discussed above in conjunction with FIGS. 7-10.

FIG. 12 is a flowchart illustrating an example method 1400 for selecting a filter pattern to reduce the negative effect of duty-cycle distortion according to a particular embodiment of the invention. Method 1400 may be used to select filter patterns for use with periodic or quasi-periodic data sequences such as, for example, the 8B10B idle sequences and the 8B10B CJPAT test sequences defined by the Institute of Electrical and Electronics Engineers (IEEE) 802.3ae standard.

Method 1400 begins at step 1410 where a set of even and odd data sequences are monitored. The set of even data sequences comprise data sequences that start from even data (i.e., at even phase), and then are followed by odd data, even data, odd data, and so on. The set of odd data sequences comprises data sequences that start from odd data (i.e., at odd phase), and then are followed by even data, odd data, even data, and so on. At step 1420, the distribution of data patterns in the even and odd data sequences is determined. In particular embodiments, the data patterns may include six bits. In alternative embodiments, the data patterns may include five bits. In yet alternative embodiments, the data patterns may include any other suitable number of bits. At steps 1430 and 1440, only those patterns that are observed in both the even and odd data sequences are further analyzed. Those patterns that are not observed in both sequences are not selected as filter patterns at step 1500.

At steps 1450 and 1460, for those patterns that are observed in the data pattern distributions of both even and odd data sequences, a determination is made whether any of these patterns are equally (or substantially equally) distributed in both the even and odd data sequences. As discussed above, selecting substantially equally distributed data patterns as filter patterns may cancel the biases produced by duty-cycle distortion. For those patterns that are equally (or substantially equally) distributed, method 1400 proceed to step 1470. Any patterns that are not substantially equally distributed are not selected as filter patterns at step 1500.

At steps 1470 and 1480, a determination is made whether any of the remaining patterns has a transition between the last two bits. As discussed above, the relationship between a boundary value that is between successive data values that comprise a transition and one or more of the data values preceding the boundary value is used to determine the adaptive equalizer action that is to be applied. Thus, particular embodiments may select only those data patterns that have a transition between the last two bits. In such embodiments, any patterns not having a transition between the last two bits are thus not selected as filter patterns at step 1500.

At step 1490, those patterns that are observed in both sequences, are (substantially) equally distributed in both sequences, and have a transition between the last two bits are selected as filter patterns. It should be noted, however, that even these patterns may be further analyzed before being selected as filter patterns. For example, as described further below, a particular pattern(s) among these may be selected for controlling a particular independent control parameter if the particular pattern(s) is better suited for controlling the particular independent control parameter. These filter patterns may then be used as discussed herein to make equalizer control adjustments.

FIG. 13 is a table illustrating an example distribution 1600 of 6-bit data patterns in even and odd 8B10B idle data sequences. Column 1610 includes the 6-bit data patterns, column 1620 includes the probability of observing a particular pattern in the even 8B10B idle data sequence, and column 1630 includes the probability of observing a particular pattern in the odd 8B10B idle data sequence. Here, the even data sequence refers to the data sequence that starts at even data and is followed by odd data, even data, odd data, and so on. The odd data sequence refers to the data sequence that starts at odd data and is followed by even data, odd data, even data, and so on. For each data pattern in column 1610, earlier bits are to the left of later bits. A blank cell in either column 1620 or column 1630 represents a zero probability of observing the associated data pattern in the associated data sequence.

As illustrated in distribution 1600, four data patterns—000010, 111010, 000101, and 111101—are observed in both even and odd 8B10B idle data sequences. These four patterns are also equally distributed in both sequences, each pattern observed 4.796% of the time. In addition, these four patterns have a transition between the last two bits. Thus, in particular embodiments, these data patterns may be selected as filter patterns using method 1400, and adaptive control actions may be applied only when these filter patterns are observed. Using these filter patterns, the negative effects of duty-cycle distortion may be reduced. In addition, the control behavior for the 8B10B idle data sequences may be consistent with the control behavior for well-randomized data sequences.

It should be noted that, in particular embodiments, independent control parameters may be used to adjust the gain applied to first-order and second-order derivative components of an input signal (e.g., in a second-order derivative equalizer). In such cases, particular ones of the observed and equally distributed filter patterns may be better suited for the independent control parameters when receiving 8B10B idle data sequences. For example, well-suited filter patterns may include those having a boundary value between successive data values comprising a transition that is relatively sensitive to the gain applied to either the first-order or second-order derivative components. Thus, in this example, well-suited filter patterns include those that cause the adaptive controller to effectively equalize either the first-order or second-order derivative component of the signal.

For the 8B10B idle data sequences, well-suited filter patterns may include 000010 and 111101 for applying gain to the first-order derivative component. In particular embodiments, adaptive control actions may thus be applied to the first-order derivative component only when data values corresponding to these filter patterns are observed at the equalizer. In this manner, the first-order derivative component of the signal may be effectively equalized. For applying gain to the second-order derivative component (in the context of 8B10B idle data sequences), well-suited filter patterns may include 000101 and 111010. In particular embodiments, adaptive control actions may thus be applied to the second-order derivative component only when data values corresponding to these filter patterns are observed at the equalizer. In this manner, the second-order derivative component of the signal may be effectively equalized.

FIG. 14 is a table 1700 illustrating an example gain control scheme associated with using the example filter patterns derived from FIG. 13 to adjust the gain applied to unmodified, first-order derivative, and second-order derivative components of an input signal. The input signal may be, for example, an 8B10B idle data signal, another (quasi-) periodic signal (where the filter patterns of FIG. 13 are substantially equally distributed), or a well-randomized signal. Each row 1702 corresponds to a particular pattern of values for which a particular adaptive equalizer control action is performed. Each of the data patterns in rows 1702 corresponds to one of the selected filter patterns described above in conjunction with FIG. 13.

Column 1710 includes patterns of sampled data and boundary values, where a value may have a high ("1") or a low ("0") value. Column "D0" includes a zeroeth sampled data value of an output signal, column "D1" includes a first sampled data value of the output signal, column "D2" includes a second sampled data value of the output signal, column "D3" includes a third sampled data value of the output signal, column "D4" includes a fourth data value of the output signal, column "D5" includes a fifth sampled data value of the output signal, and column "E4" includes the boundary value between the fourth and fifth data values. As can be observed, a transition occurs between data values in columns "D4" and "D5" in each pattern.

It should be noted that the pattern of values in each row 1702 may be sampled by sampler 104 and sent to adaptive controller 102. Adaptive controller 102 may compare the sampled values to one or more pre-determined filter patterns. In particular embodiments, upon detecting a match, adaptive controller 102 may take an associated set of one or more adaptive equalizer actions as described herein.

It should further be noted that in particular embodiments, adaptive controller 102 may receive a greater number of values than that illustrated, including, for example, the boundary values between data values in columns "D0" through "D4." Alternatively, as discussed above, adaptive controller 102 may receive only sampled data values and other phase information, and particular boundary values (including, for example, boundary values in column E4) may be derived from the data values and other phase information (and may not be sampled by sampler 104).

Column 1720 includes alternative boundary values at column "E4" for each row 1702. Column 1724 includes, for particular patterns, particular compensation levels and adaptive equalizer actions associated with the unmodified component of the input signal. The adaptive equalizer actions may be controlled in any suitable manner, including, for example, by analyzing particular values. Column 1730 includes, for particular patterns, particular compensation levels and adaptive equalizer actions associated with the first-order derivative component of the input signal. These adaptive equalizer actions may also be controlled in any suitable manner, including, for example, by analyzing particular values. Column 1740 includes, for particular patterns, particular compensation levels and adaptive equalizer actions associated with the second-order derivative component of the input signal. These adaptive equalizer actions may also be controlled in any suitable manner, including, for example, by analyzing particular values.

FIG. 15 is a table illustrating an example distribution 1800 of 6-bit data patterns in even and odd 8B10B CJPAT data sequences. Column 1810 includes the 6-bit data patterns, column 1820 includes the probability of observing a particular pattern in the even 8B10B CJPAT data sequence, and column 1830 includes the probability of observing a particular pattern in the odd 8B10B CJPAT data sequence. Here, the even data sequence refers to the data sequence that starts at even data and is followed by odd data, even data, odd data, and so on. The odd data sequence refers to the data sequence that starts at odd data and is followed by even data, odd data, even data, and so on. For each data pattern in column 1810, earlier bits are to the left of later bits. A blank cell in either column 1820 or column 1830 represents a zero probability of observing the associated data pattern in the associated data sequence. It should be noted that distribution 1800 is a distribution of data patterns in a "CJPAT-like" data sequence. The CJPAT-like data sequence is the same as the 8B10B CJPAT data sequence of the IEEE 802.3ae standard, excluding lane-to-lane difference such as the start-up, preamble, CRC, and IPG sequences. The overall characteristics of the CJPAT-like data sequence are relatively similar to the actual 8B10B CJPAT data sequence.

As illustrated in distribution 1800, patterns 001110 and 110001 are observed in both even and odd 8B10B CJPAT test sequences. Furthermore, these two patterns are also substantially equally distributed in both sequences. Pattern 001110 is observed 7.340% in the even sequence and 7.394% in the odd sequence. Pattern 110001 is observed 7.394% in the even sequence and 7.394% in the odd sequence. In addition, these two patterns have a transition between the last two bits. Thus, in particular embodiments, these data patterns may be selected as filter patterns using method 1400, and adaptive control actions may be applied only when these filter patterns are observed. Using these filter patterns, the negative effects of duty-cycle distortion may be reduced. In addition, the control behavior for the 8B10B CJPAT data sequences may be consistent with the control behavior for well-randomized data sequences.

It should be noted that, in particular embodiments, the filter patterns selected for the 8B10B idle data sequences and for the 8B10B CJPAT data sequences may be used concurrently by an equalizer receiving 8B10B idle data sequences, 8B10B CJPAT data sequences, and random sequences. As can be observed in the 8B10B CJPAT data sequence distribution 1800, the 8B10B idle filter patterns—000010, 111101, 000101, and 111010—arise disproportionately in the even and odd sequences. However, because these unbalanced filter patterns are observed only at relatively low probabilities during receipt of the 8B10B CJPAT data sequences, using them during receipt of the 8B10B CJPAT data sequences typically would not create a bad result in the adaptive control. As can be observed in the 8B10B idle data sequence distribution 1600, use of the 8B10B CJPAT filter patterns 001110 and 110001 during receipt of 8B10B idle data sequences would not create a bad result in the adaptive control, as these filter patterns are never observed in 8B10B idle data sequences.

It should further be noted that, in particular embodiments, independent control parameters may be used to adjust the gain applied to first-order and second-order derivative components of an input signal (e.g., in a second-order derivative equalizer).

In such cases, particular ones of the observed and equally distributed filter patterns may be better suited for the independent control parameters when receiving 8B10B CJPAT data sequences.

For the 8B10B CJPAT data sequences, well-suited filter patterns for applying gain to the first-order derivative component may include 110001 and 001110. In particular embodiments, adaptive control actions may thus be applied to the first-order derivative component only when data values corresponding to these filter patterns are observed at the equalizer. In this manner, the first-order derivative component of the signal may be effectively equalized. In embodiments where, as described above, 8B10B idle filter patterns are also being used, well-suited filter patterns for applying gain to the first-order derivative component may also include 000010 and 111101.

For applying gain to the second-order derivative component (in the context of 8B10B CJPAT data sequences), well-suited filter patterns may include 000101 and 111010. It should be noted that these filter patterns are the same as those used by the equalizer to apply gain to the second-order derivative component in 8B10B idle data sequences. It should further be noted that these two filter patterns arise disproportionately in the even and odd data sequences in the 8B10B CJPAT data sequence. However, because these unbalanced filter patterns are observed only at relatively low probabilities, using them during receipt of an 8B10B CJPAT data sequence does not create a bad result in the adaptive control.

FIG. 16 is a table 1900 illustrating an example gain control scheme associated with using the example filter patterns derived from FIG. 15 to adjust the gain applied to unmodified, first-order derivative, and second-order derivative components of an input signal. The input signal may be, for example, an 8B10B CJPAT data signal, another (quasi-) periodic signal (where the filter patterns of FIG. 15 are substantially equally distributed), or a well-randomized signal. Each row 1902 corresponds to a particular pattern of values for which a particular adaptive equalizer control action is performed. Each of the data patterns in rows 1902 corresponds to one of the selected filter patterns described above in conjunction with FIG. 15.

Column 1910 includes patterns of sampled data and boundary values, where a value may have a high ("1") or a low ("0") value. Column "D0" includes a zeroeth sampled data value of an output signal, column "D1" includes a first sampled data value of the output signal, column "D2" includes a second sampled data value of the output signal, column "D3" includes a third sampled data value of the output signal, column "D4" includes a fourth sampled data value of the output signal, column "D5" includes a fifth sampled data value of the output signal, and column "E4" includes the boundary value between the fourth and fifth data values. As can be observed, a transition occurs between data values in columns "D4" and "D5" in each pattern.

It should be noted that the pattern of values in each row 1902 may be sampled by sampler 104 and sent to adaptive controller 102. Adaptive controller 102 may compare the sampled values to one or more pre-determined filter patterns. In particular embodiments, upon detecting a match, adaptive controller 102 may take an associated set of one or more adaptive equalizer actions as described herein.

It should further be noted that in particular embodiments, adaptive controller 102 may receive a greater number of values than that illustrated, including, for example, the boundary values between data values in columns "D0" through "D4." Alternatively, as discussed above, adaptive controller 102 may receive only sampled data values and other phase information, and particular boundary values (including, for example, boundary values in column E4) may be derived from the data values and other phase information (and may not be sampled by sampler 104).

Column 1920 includes alternative boundary values at column "E4" for each row 1902. Column 1924 includes, for particular patterns, particular compensation levels and adaptive equalizer actions associated with the unmodified component of the input signal. The adaptive equalizer actions may be controlled in any suitable manner, including, for example, by analyzing particular values. Column 1930 includes, for particular patterns, particular compensation levels and adaptive equalizer actions associated with the first-order derivative component of the input signal. These adaptive equalizer actions may also be controlled in any suitable manner, including, for example, by analyzing particular values. Column 1940 includes, for particular patterns, particular compensation levels and adaptive equalizer actions associated with the second-order derivative component of the input signal. These adaptive equalizer actions may also be controlled in any suitable manner, including, for example, by analyzing particular values.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

Filter patterns may be used in particular embodiments to reduce the negative effects of duty-cycle distortion and particular (quasi-) periodic signals. As discussed above, a filter pattern may be selected based on the well-balanced appearance of the pattern in a set of even and odd sequences in one or more (quasi-) periodic signals. In particular embodiments, filter patterns may be selected specifically for particular pre-defined signals, such as an 8B10B idle signal or an 8B10B CJPAT signal. These filter patterns may then be used to cause the adaptive control to take action only when these filter patterns are detected. During an equalizer's receipt of the particular pre-defined, periodic signals for which the filter patterns were specifically selected, use of the filter patterns may reduce the negative effects of duty-cycle distortion. However, during the equalizer's receipt of other periodic signals for which the filter patterns were not specifically selected, use of the filter patterns may lead to an unacceptable result of adaptive equalizer control, as these filter patterns may not be well-balanced for these other periodic signals.

One solution to the limited applicability of selected filter patterns is to freeze (stop or otherwise not use) the adaptive equalizer control when a determination cannot be made that the filter pattern is compatible with an incoming signal. For example, the adaptive equalizer control may be frozen for incoming data sequences that are identified as not being well-randomized or as not being the (quasi-) periodic data sequences used to select the filter pattern(s). The adaptive equalizer may additionally or alternatively be frozen for incoming data sequences that cannot be identified as either being compatible or incompatible. For example, the adaptive equalizer may be frozen for seemingly well-randomized sequences if it cannot be determined whether incompatible (quasi-) periodic sequences are included in the seemingly well-randomized sequences.

Temporarily freezing the adaptive equalizer control may be acceptable because channel characteristics are not likely to change in the short-term. However, freezing the equalizer control for relatively long periods of time may be disadvantageous because the channel characteristics affecting inter-symbol interference may change. For example, environmental changes, such as temperature drift or cable movement, may take place that affect inter-symbol interference. If channel characteristics change and inter-symbol interference is affected, the equalizer's adaptive control may be needed to compensate for the changed signal attenuation. Thus, freezing the adaptive control for long periods of time while waiting for data sequences compatible with selected filter patterns may be disadvantageous in particular circumstances.

A second solution is to select a set (or list) of useful filter patterns that are compatible with any (quasi-) periodic data signal when applied in a balanced manner by the equalizer control. In particular embodiments, these filter patterns need not depend on their distribution in particular (quasi-) periodic signals. Thus, one or more filter patterns in the list may not appear equally in the even and odd sequences in a particular (quasi-) periodic data signal; however, balanced application of the various potentially unequally distributed filter patterns may cancel out the biases of the unequally distributed filter patterns. Balanced application may result in even patterns and odd patterns being observed and acted upon substantially equally, canceling their adaptive biases and reducing the negative effect of duty cycle distortion and any type of incoming (quasi-) periodic signal.

In addition to canceling the adaptive biases due to duty-cycle distortion, balanced application of filter patterns may provide consistent results of adaptive control for any (quasi-) periodic or well randomized data, by canceling various adaptive biases that may occur in (quasi-) periodic data signal. In other words, if application of filter patterns is not balanced, the adaptive control results may be strongly biased to the dominant filter patterns that may vary among various (quasi-) periodic or well randomized data sequence, and thus, the adaptive control results may depend on the incoming data sequence. For example, if the incoming data sequence is low-frequency oriented, the adaptive control may be biased to low-frequency patterns, and the adaptive control results may be high-frequency oriented. If the incoming data sequence is high-frequency oriented, the adaptive control may be biased to high-frequency patterns, and the adaptive control results may be low-frequency oriented. If application of filter pattern is balanced, adaptive control takes an action for each filter pattern at substantially equal probabilities, and thus, the adaptive control results may become consistent for any (quasi-) periodic or well randomized data.

In particular embodiments, a list of useful filter patterns may be generated initially and remain unmodified (i.e., "fixed") during operation of the equalizer adaptive control. If the list comprises six-bit filter patterns, the list may include all possible variations of six-bit patterns. Alternatively, the list may include all possible variations of six-bit patterns with a data transition between a certain consecutive two data bits such as the last two data bits. In yet alternative embodiments, the list may include only a subset of all possible variations of six-bit patterns, and the generator of the list may determine that the particular subset is useful. In any case, the adaptive control may cycle through the fixed list of useful filter patterns in any suitable manner. For example, the adaptive control may cycle through the fixed list as discussed below in conjunction with FIGS. 20-22.

Although fixed lists may be used in particular embodiments, in alternative embodiments, it may be advantageous to use dynamic lists that are adaptable to incoming sequences. In particular embodiments, using a dynamic list adaptable to incoming sequences may increase the frequency of adaptive control actions, addressing changing channel characteristics more quickly. The adaptive control may cycle through the dynamic list in any suitable manner. For example, the adaptive control may cycle through the dynamic list as discussed below in conjunction with FIGS. 20-22. It should be noted that, in particular embodiments, the equalizer adaptive control may constantly be enabled while using a fixed or dynamic list. It should further be noted that, if there is more than one independent control parameter, a separate list (fixed or dynamic) of useful filter patterns may be used for each independent control parameter in particular embodiments.

On the other hand, fixed lists may be more advantageous than dynamic lists regarding to the consistency of adaptive control results among various (quasi-) periodic or well randomized data, because dynamic lists may compromise on some inconsistency of adaptive control results by dynamically changing the list of filter patterns, whereas the fixed list may not compromise on any inconsistency of adaptive control results by insisting on the fixed list of filter patterns.

FIG. 17 is a flowchart illustrating an example method 2000 for generating a list of useful filter patterns dynamically according to a particular embodiment of the invention. Method 2000 may be performed, for example, to update a list of useful filter patterns to include useful patterns observed in incoming sequences and to remove patterns that are no longer useful. Method 2000 begins at step 2010, where a new list of useful filter patterns is used. In particular embodiments, the new list of useful filter patterns may be used in a balanced manner, as discussed below in conjunction with FIGS. 20 and 21. Also, undetected filter patterns may be skipped, as discussed in conjunction with FIG. 22 below.

At step 2020, data patterns in the incoming sequence(s) are monitored, and useful and not useful data patterns may be detected. In particular embodiments, only data patterns of a certain bit size (corresponding to the size of the applied filter patterns) are monitored. A useful data pattern may include, for example, a data pattern that is observed frequently in the incoming sequence(s) and that comprises at least one transition between successive data values in the pattern. In particular embodiments, a data pattern may also only be useful if the transition occurs between certain two data values such as the last two data values in the pattern. A data pattern may also be useful, for example, if the data pattern enhances the sensitivity of the controlled parameter on the boundary value. For instance, a data pattern with the same data value 1.5 bits before the boundary as the data value 2.5 bits before the boundary may be useful to control the gain of the first-order derivative component of the analog second-order derivative equalizer, whereas a data pattern with a different data value 1.5 bits before the boundary than the data value 2.5 bits before the boundary may be useful to control the gain of the second-order derivative component of the analog second-order derivative equalizer. Patterns that are not useful may include those that are not observed or are rarely observed, those that do not include at least one transition between successive data values in the pattern, or those that reduce the sensitivity of the controlled parameter on the boundary value. For example, a data pattern with a different data value 1.5 bits before the boundary than the data value 2.5 bits before the boundary may not be useful to control the gain of the first-order derivative component of the analog second-order derivative equalizer, and a data pattern with the same data value 1.5 bits before the boundary as the data value 2.5 bits before the boundary may not be useful to control the gain of the second-order derivative component of the analog second-order derivative equalizer. These patterns may not be useful because they would not increase the frequency of adaptive control action, a goal of using a dynamic list, or would not effectively contribute adaptive control. After being detected, useful patterns may be compiled in a list or otherwise stored. In particular embodiments, patterns that are not useful may also be compiled in a list or otherwise stored.

At step 2030, a determination is made whether enough of the incoming sequence(s) has been monitored. If not enough of the incoming sequence(s) has been monitored, the method returns to step 2020. If enough of the incoming sequence(s) has been monitored, the method proceeds to step 2040. Enough of the incoming sequence(s) may have been monitored, for example, after a certain number or type of useful data patterns has been detected or after a certain amount of time has passed.

At step 2040, the list of useful filter patterns is updated using, for example, the compiled list of useful patterns detected in the incoming data sequence(s). In particular embodiments, one or more (or all of the) useful patterns detected in the incoming data sequence(s) may be added to or may replace the list of useful filter patterns. Alternatively, the list of useful filter patterns may already include the detected patterns and thus need not be modified to include the detected patterns. In either case, filter patterns that are not useful may be deleted from the list of useful filter patterns. In particular embodiments, the compiled list of detected patterns that are not useful may also be deleted. After updating the list of useful filter patterns, the method returns to step 2010, where the new list of useful filter patterns is used.

FIG. 18 is a flowchart illustrating another example method 2100 for generating a list of useful filter patterns dynamically according to a particular embodiment of the invention. Like method 2000, method 2100 may be performed to update a list of useful filter patterns to include useful patterns observed in incoming sequences and to remove patterns that are no longer useful. Method 2100 may further create separate dynamic lists for the even and odd data sequences. Method 2100 may also optionally edit these lists such that neither even nor odd sequences dominate the adaptive control. Doing so may reduce the negative effects of duty cycle distortion.

Method 2100 begins at step 2110, where a new list of useful filter patterns is used. In particular embodiments, the new list of useful filter patterns may be used in a balanced manner, as discussed below in conjunction with FIGS. 20 and 21. The new list of filter patterns may also be used in conjunction with timeout detection to skip undetected filter patterns after a period of time, as discussed further below in conjunction with FIG. 22.

At step 2120, data patterns in the even and odd data sequences, which either start at even bit and are followed by odd bit, even bit, odd bit and so on, or start at odd bit and are followed by even bit, odd bit, even bit and so on, respectively, are monitored, and useful and not useful data patterns in each data sequence are detected. A useful data pattern may include, for example, a data pattern that is observed frequently in an incoming data sequence and that comprises at least one transition between successive data values in the pattern. In particular embodiments, a data pattern may also only be useful if the transition occurs between certain two data values in the pattern. A data pattern may also be useful, for example, if the data pattern enhances the sensitivity of the controlled parameter on the boundary value. For example, a data pattern with the same data value 1.5 bits before the boundary as the data value 2.5 bits before the boundary may be useful to control the gain of the first-order derivative component of the analog second-order derivative equalizer, whereas a data pattern with a different data value 1.5 bits before the boundary than the data value 2.5 bits before the boundary may be useful to control the gain of the second-order derivative component of the analog second-order derivative equalizer. Patterns that are not useful may include those that are not observed or are rarely observed, that do not include at least one transition between successive data values in the pattern, or that reduce the sensitivity of the controlled parameter on the boundary value. For example, a data pattern with a different data value 1.5 bits before the boundary than the data value 2.5 bits before the boundary may not be useful to control the gain of the first-order derivative component of the analog second-order derivative equalizer, and a data pattern with the same data value 1.5 bits before the boundary as the data value 2.5 bits before the boundary may not be useful to control the gain of the second-order derivative component of the analog second-order derivative equalizer. The detected, useful patterns may be compiled in separate lists for the even and odd data sequences or otherwise stored separately. In particular embodiments, patterns that are not useful may also be compiled in separate lists for the even and odd data sequences or otherwise stored separately.

At step 2130, a determination is made whether enough of the incoming even and odd sequences has been monitored. If not enough of the sequences has been monitored, the method returns to step 2120. If enough of the sequences has been monitored, the method proceeds to step 2140. Enough of the incoming sequences may have been monitored, for example, after a certain number or type of useful data patterns has been detected or after a certain amount of time has passed.

At step 2140, of those useful patterns that are detected, the patterns that appear only in one of the even sequence and the odd sequence are disregarded. In particular embodiments, the useful patterns detected in the even data sequence may be compared to the useful patterns detected in the odd data sequence, and those patterns that were observed only in one of the even and odd sequences are removed from consideration as filter patterns in the new list of filter patterns. These patterns may be disregarded, for example, by removing them from the compiled even or odd lists of detected useful patterns. In particular embodiments, these patterns may be placed in the compiled even or odd lists of detected patterns that are not useful.

At step 2150, the list of useful filter patterns is updated. In particular embodiments, after those patterns that appear only in one of the even sequence and the odd sequence have been removed from the compiled lists of detected patterns, one or more (or all of the) useful patterns in the compiled lists of detected patterns may be added to or may replace the list of useful filter patterns. Alternatively, the list may already include the detected patterns and thus need not be modified to include the detected patterns. In either case, filter patterns that are not useful may be deleted from the list of useful filter patterns. In particular embodiments, the compiled even or odd lists of detected patterns that are not useful may also be deleted. After updating the list of useful filter patterns, the method returns to step 2110, where the new list of useful filter patterns is used.

FIG. 19 is a flowchart illustrating yet another example method 2200 for generating a list of useful filter patterns dynamically according to a particular embodiment of the invention. Like methods 2000 and 2100, method 2200 may update a list of useful filter patterns to include useful patterns observed in incoming sequences and to remove patterns that are no longer useful. Like method 2100, method 2200 may also create separate dynamic lists for data sequences starting at the even bit and odd bit (i.e., an even list and an odd list), editing these lists such that neither even nor odd sequences dominates the adaptive control. Method 2200 may do so by counting the number of patterns in the even list and the number of patterns in the odd list, comparing the two numbers, and removing patterns from the list with a greater number of patterns until the number of patterns in the even list equals the number of patterns in the odd list. In this way, the effects of duty cycle distortion may be reduced. Also, method 2200 may be relatively less dependent on the incoming data sequences.

Method 2200 begins at step 2210, where a new list of useful filter patterns is used. In particular embodiments, the new list of useful filter patterns may be used in a balanced manner, as discussed below in conjunction with FIGS. 20 and 21. The new list of filter patterns may also be used in conjunction with timeout detection to skip undetected filter patterns after a period of time, as discussed further below in conjunction with FIG. 22.

At step 2220, data patterns in the even data sequence (that starts at even bit and is followed by odd bit, even bit, odd bit and so on) and data patterns in the odd data sequence (that starts at odd bit and is followed by even bit, odd bit, even bit and so on) are monitored, and useful and not useful patterns in each data sequence are detected. A useful pattern may include, for example, a data pattern that is observed frequently in an incoming data sequence and that comprises at least one transition between successive data values in the pattern. In particular embodiments, a data pattern may also only be useful if the transition occurs between certain two data values such as the last two data values in the pattern. A data pattern may also be useful, for example, if the data pattern enhances the sensitivity of the controlled parameter on the boundary value. For example, a data pattern with the same data value 1.5 bits before the boundary as the data value 2.5 bits before the boundary may be useful to control the gain of the first-order derivative component of the analog second-order derivative equalizer, whereas a data pattern with a different data value 1.5 bits before the boundary than the data value 2.5 bits before the boundary may be useful to control the gain of the second-order derivative component of the analog second-order derivative equalizer. Patterns that are not useful may include those that are not observed or are rarely observed, that do not include at least one transition between successive data values in the pattern, or that reduce the sensitivity of the controlled parameter on the boundary value. For example, a data pattern with a different data value 1.5 bits before the boundary than the data value 2.5 bits before the boundary may not be useful to control the gain of the first-order derivative component of the analog second-order derivative equalizer, and a data pattern with the same data value 1.5 bits before the boundary as the data value 2.5 bits before the boundary may not be useful to control the gain of the second-order derivative component of the analog second-order derivative equalizer. The detected, useful patterns may be compiled in separate lists (an "even" list and an "odd" list) or otherwise stored for the even and odd sequences. In particular embodiments, patterns that are not useful may also be compiled in separate lists for the even and odd data sequences or otherwise stored separately.

At step 2230, a determination is made whether enough of the incoming even and odd sequences has been monitored. If not enough of the sequences has been monitored, the method returns to step 2220. If enough of the sequences has been monitored, the method proceeds to step 2240. Enough of the incoming sequences has been monitored, for example, after a certain number or type of useful data patterns has been detected or after a certain amount of time has passed.

At step 2240, the detected patterns in the even and odd lists are compared, and the number of patterns appearing only in the even list and the number of patterns appearing only in the odd list are counted. At step 2250, a determination is made whether the number of patterns appearing only in the even list is the same as the number of patterns appearing only in the odd list. If the numbers are different, the method proceeds to step 2260. If the numbers are the same, the method proceeds to step 2270.

At step 2260, if the number of patterns appearing only in the even list is different than the number of patterns appearing only in the odd list, one of the patterns is removed from the list with the greater number of patterns. In particular embodiments, any suitable pattern may be removed in any suitable manner from the list with the greater number of patterns. For example, in particular embodiments, the pattern appearing most frequently in either the even or odd data sequences may be removed. After removing the pattern from the list with the greater number of patterns, the method returns to step 2240, and the number of patterns appearing only in the even list and the number of patterns appearing only in the odd list are counted and compared.

At step 2270, if the number of patterns appearing only in the even list is the same as the number of patterns appearing only in the odd list, the list of useful filter patterns is updated using, for example, the edited lists of detected patterns. In particular embodiments, one or more (or all of the) useful patterns in the edited lists of detected patterns may be added to or may replace the list of useful filter patterns. Alternatively, the list of useful filter patterns may already include the detected patterns and thus need not be modified to include the detected patterns. In either case, filter patterns that are not useful may be deleted from the list of useful filter patterns. In particular embodiments, the compiled even or odd lists of detected patterns that are not useful may also be deleted. After updating the list of useful filter patterns, the method returns to step 2210, where the new list of useful filter patterns is used.

Modifications, additions, or omissions may be made to the methods described without departing from the scope of the invention. The components of the methods described may be integrated or separated according to particular needs. Moreover, the operations of the methods described may be performed by more, fewer, or other components.

As discussed above, a list of useful filter patterns may be fixed or dynamic. Filter patterns in either type of list may be used in a balanced manner by the equalizer control to reduce the negative effects of duty cycle distortion. Using filter patterns in a balanced manner may generally refer to using each filter pattern in a list of filter patterns equally or giving each filter pattern in the list equal weight or probability of selection.

FIG. 20 is a flowchart illustrating an example method 2300 for using filter patterns in a balanced manner according to a particular embodiment of the invention. Method 2300 begins at step 2310, where a filter pattern is selected from a list of useful filter patterns. The list of useful filter patterns may be fixed or dynamic. Filter patterns may be selected from the list of useful filter patterns in any suitable manner. In particular embodiments, filter patterns may be selected sequentially from the list. In alternative embodiments, filter patterns may be selected randomly at equal probability from the list. It should be noted that filter patterns may include, for example, six-bit patterns, and may have a transition between particular two bits such as the last two bits.

At step 2320, an incoming signal's data sequence(s) may be monitored for the selected filter pattern. At step 2330, if the selected filter pattern is not detected, the incoming signal's data sequence(s) may continue to be monitored. If the selected filter pattern is detected, the method proceeds to step 2340.

At step 2340, an appropriate control action is taken to control equalizer parameters. In particular embodiments, the detected pattern's data and boundary value information may be analyzed and an appropriate control action may be taken as discussed above. Example methods for interpreting output signal values are discussed above in conjunction with FIGS. 5, 7, and 9. After analyzing the output signal values, the equalizer may apply a suitable control action to the signal. In another embodiment of the invention, the adaptive control action taken at step 2340 may be any suitable adaptive control action in various conventional adaptive control algorithms. For instance, the adaptive control action at step 2340 may be based on conventional adaptive control algorithms, such as the Least-Mean-Square (LMS) algorithm, the Sign-Sign-Least-Mean-Square (SS-LMS) algorithm, the Zero-Forcing (ZF) algorithm, and so on. These conventional adaptive control algorithms generally require that the incoming data be well randomized, and may produce an unacceptable result if the incoming data is a (quasi-) periodic data. In particular embodiments, balanced application of adaptive control actions using filter patterns enables these conventional adaptive control algorithms to provide consistent adaptation results among various (quasi-) periodic and well randomized data sequences. Since these conventional adaptive control algorithms do not necessarily require a data transition to take an adaptive control action, a filter pattern need not include a data transition in particular embodiments. After a control action is applied, the method returns to step 2310, where a new filter pattern is selected. In this way, filter patterns are used in a balanced manner, reducing the negative effects of duty cycle distortion and providing consistent adaptation results among various (quasi-) periodic and well randomized data sequences.

FIG. 21 is a flowchart illustrating another example method 2400 for using filter patterns in a balanced manner according to a particular embodiment of the invention. In method 2400, the filter patterns in a list are monitored for simultaneously, those filter patterns that have been detected and for which an adaptive action has been taken are flagged or otherwise identified and are no longer monitored for, and the flags are cleared when all the filter patterns have been detected. In this way, filter patterns are used in a balanced manner, reducing the negative effects of duty cycle distortion.

Method 2400 begins at step 2410. At step 2410, every flag is cleared such that none of the patterns are flagged. The absence of a flag associated with a pattern indicates that the incoming data sequence(s) may be monitored for the pattern (because the pattern has not yet been detected). A flag indicates that the incoming data sequence(s) may no longer be monitored for the flag's corresponding pattern (because the pattern has already been detected). It should be noted that although flags are used in this embodiment, in alternative embodiments, any suitable technique for indicating when a pattern has been detected may be implemented. It should further be noted that the list of useful filter patterns may be fixed or dynamic.

At step 2420, the incoming data sequence(s) are monitored for those filter pattern(s) that have not yet been flagged. Thus, immediately after all flags are cleared, the incoming data sequence(s) are monitored for all of the filter patterns in the list of useful filter patterns. In particular embodiments, all of the unflagged filter patterns may be monitored for simultaneously. As filter patterns are detected, acted upon, and flagged, the incoming data sequence(s) are monitored for fewer filter patterns (the unflagged ones).

At step 2430, a determination is made whether any of the monitored for filter patterns have been detected in the incoming data sequence(s). If none of the filter patterns have been detected, the incoming data sequence(s) may continue to be monitored for the filter patterns, and each filter pattern's corresponding flag remains unchecked. If one of the filter patterns has been detected, the method proceeds to step 2440.

At step 2440, an appropriate control action is taken to control equalizer parameters. In particular embodiments, the detected pattern's data and boundary value information may be analyzed, and a control action may be taken. Example methods for interpreting output signal values are discussed above in conjunction with FIGS. 5, 7, and 9. After analyzing the output signal values, the equalizer may apply a suitable control action to the signal. In alternative embodiments, the adaptive control action taken at step 2440 may be any suitable adaptive control action in various conventional adaptive control algorithms. For example, the adaptive control action at step 2440 may be based on the Least-Mean-Square (LMS) algorithm, the Sign-Sign-Least-Mean-Square (SS-LMS) algorithm, or the Zero-Forcing (ZF) algorithm. These conventional adaptive control algorithms generally require that the incoming data be well randomized, and may not produce a good result if the incoming data is a (quasi-) periodic data. Balanced application of adaptive control actions using filter patterns may enable these conventional adaptive control algorithms to provide consistent adaptation results among various (quasi-) periodic and well randomized data sequences. After the filter pattern is detected (and optionally after the control action is taken), the detected filter pattern is flagged.

At step 2450, a determination is made whether all of the filter patterns in the list of useful filter patterns have been flagged. If not, the method returns to step 2420, and the incoming data sequence(s) are monitored for those filter pattern(s) that have not yet been flagged. If all of the filter patterns in the list of useful filter patterns have been flagged, then the method proceeds to step 2410, where all of the flags are cleared. In this way, filter patterns are used in a balanced manner, reducing the negative effects of duty cycle distortion and providing consistent adaptation results among various (quasi-) periodic and well-randomized data sequences.

Modifications, additions, or omissions may be made to the methods described without departing from the scope of the invention. The components of the methods described may be integrated or separated according to particular needs. Moreover, the operations of the methods described may be performed by more, fewer, or other components.

As discussed above, filter patterns may be used in a balanced manner to reduce the negative effects of duty cycle distortion and provide consistent adaptation results among various (quasi-) periodic and well randomized data sequences, and example methods for using filter patterns in a balanced manner are discussed in conjunction with FIGS. 20 and 21. However, when making a determination about whether a filter pattern has been detected in step 2330 of method 2300 or in step 2430 of method 2400, the methods may stall if, for example, a desired filter pattern is not detected. In other words, no further adaptive actions may be taken if a particular filter pattern is not detected. Having the adaptive control freeze in this manner may not be disadvantageous in, for example, the short-term because channel characteristics may not be likely to change. However, even in the short-term and especially in the long-term, forcing the method to skip an undetected filter pattern after a certain period of time may allow the equalizer to more quickly adapt to changing conditions. By allowing more frequent adaptive control actions, skipping undetected filter patterns may prevent the adaptive control from stalling when channel characteristics change.

FIG. 22 is a flowchart illustrating an example method 2500 for skipping an undetected filter pattern after a period of time according to a particular embodiment of the invention. In method 2500, a timeout may be detected after a certain period of time during which a filter pattern is not detected in an incoming data sequence(s). After the timeout is detected, the filter pattern may be skipped (e.g., in step 2330 of method 2300) or flagged (e.g., in step 2430 of method 2400 above).

It should be noted that timeout detection may be used in conjunction with fixed or dynamic lists of useful filter patterns. However, timeout detection may occur less when using a dynamic list than when using a fixed list because filter patterns in a dynamic list are updated based on their frequency in the incoming sequence. In other words, if frequently observed patterns in an incoming sequence are being included in the list of useful filter patterns and infrequently observed patterns are being removed, there is less of a chance that a timeout will be detected. Method 2500 may nonetheless be used in conjunction with a dynamic list to compensate for any delay in updating the dynamic list after a change in the incoming sequence.

Method 2500 begins at step 2510, where a timer is reset. In conjunction with method 2300, the timer may be reset after the next filter pattern is selected at step 2310. In conjunction with method 2400, the timer may be reset, for example, after all flags are initially cleared at step 2410 and/or after detection of a filter pattern at step 2430. The timer may set the period of time after which the filter pattern (or filter patterns in method 2400) is to be skipped. The period of time set by the timer may include any suitable period of time.

At step 2520, a determination is made whether a filter pattern has been detected in an incoming data sequence(s). If the filter pattern has been detected, the method returns to step 2510 and the timer is reset. If the filter pattern has not been detected, the method proceeds to step 2530.

At step 2530, a determination is made whether a timeout has occurred. A timeout refers to the running out of time set by the timer. If a timeout has not occurred, the method returns to step 2520. If a timeout has occurred, the method proceeds to step 2540.

After a timeout occurs, the undetected filter pattern(s) is skipped at step 2540. In conjunction with method 2300, the filter pattern is skipped and the next filter pattern is selected at step 2310. In conjunction with method 2400, all of the remaining unflagged filter patterns are skipped (e.g., they may all be flagged) and all flags are cleared at step 2410 so that the process can be restarted. In particular embodiments, any skipped pattern(s) may be removed from the list of useful filter patterns (to prevent the skipped pattern(s) from stalling the adaptive equalizer again). Method 2500 then returns to step 2510, where the timer is reset. In this way, an undetected filter pattern may be skipped, and adaptive control actions may be taken more frequently, preventing the adaptive control from stalling for undetected filter patterns.

On the other hand, in particular embodiments, not implementing the detection of timeout may be more advantageous with respect to the consistency of adaptive control results among various (quasi-) periodic or well randomized data because detection of timeout may compromise on some inconsistency of adaptive control results by skipping undetected filter patterns, whereas not implementing timeout may not compromise on any inconsistency of adaptive control results by insisting on all filter patterns, even if it stalls. In particular embodiments, stalling may not be a problem or may even be the most favorable scheme for certain data sequences such as a continuous 0101 data sequence because such a highly periodic data sequence lacks for spectrum in the frequency domain and may not include enough information for the adaptive control. If the adaptive control does not stall for a highly periodic data sequence such as continuous 0101, the control parameters may drift to bad values. Therefore, in particular embodiments, stalling may be the most favorable scheme for such a highly periodic data sequence. Not implementing the detection of timeout may allow for stalling for such a highly periodic data sequence.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

Much of the discussion above has focused on a type of signal distortion known as residual inter-symbol interference. Another type of signal distortion arising in electrical communication is residual DC offset in a signal. Residual DC offset, if not cancelled (i.e., compensated), can reduce input sensitivity at a receiver. Thus, it is beneficial to cancel residual DC offset at a receiver. Canceling residual DC offset may be especially beneficial if the receiver has an analog front end circuit such as an equalizer or a limiting amplifier before its decision circuit because these components can add offset to the signal.

Referring back to FIGS. 1-3, a signal transmitted over communication channel 30 may experience DC offset distortion in addition to inter-symbol interference, and DC offset distortion may be further enhanced at receiver equalizer 42. Receiver equalizer 42 may apply a DC offset compensation (i.e., correction) to the received input signal to cancel the DC offset exhibited by the signal. Receiver logic 47 may then analyze the adjusted output signal for residual DC offset. Specifically, sampler 104 may receive equalizer output signal 46 (the adjusted input signal) and a clock signal. Sampler 104 may then sample the output signal at particular points determined by the clock signal to generate data values and boundary values. Sampler 104 may forward these data and boundary values to offset controller 106 for suitable analysis (as described below). Based on this analysis, offset controller 106 of receiver logic 47 and equalizer 42 may correct for the DC offset distortion in the incoming input signal.

Figure 23A:
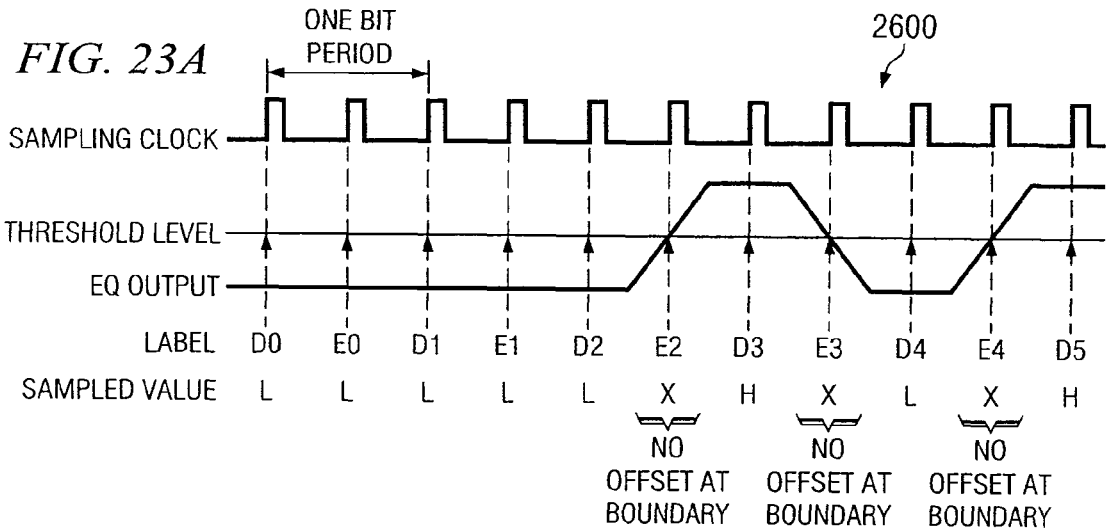
FIGS. 23A, 23B, and 23C illustrate examples of a clock signal in comparison with an equalizer output signal exhibiting types of residual DC offset.
Figure 23B:
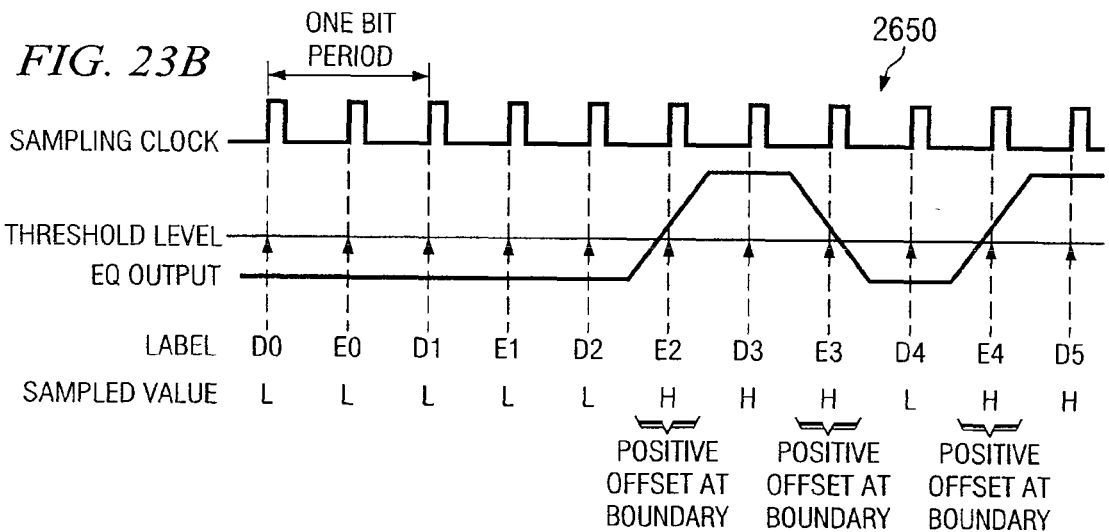
Figure 23C:
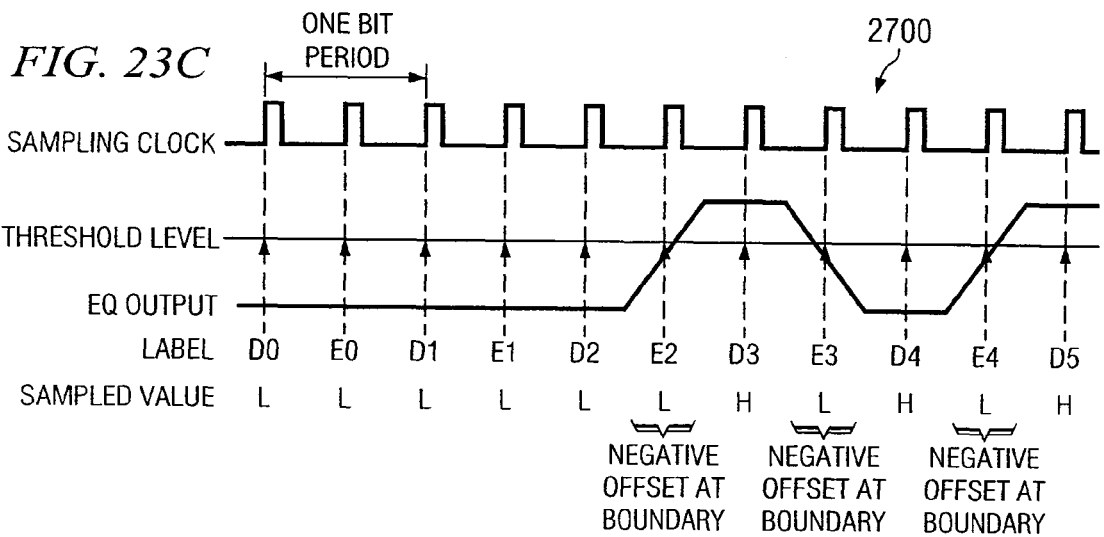

FIGS. 23A, 23B, and 23C illustrate examples of a clock signal in comparison with an equalizer output signal 46 exhibiting types of residual DC offset. In particular embodiments, sampler 104 may receive equalizer output signals 46 such as those illustrated in these figures and sample the equalizer output signal 46 according to a 2× over-sampling clock and data recovery (CDR) scheme. In such a scheme, sampler 104 may sample the equalizer output signal 46 two times per data bit period, which may be defined by the clock signal. For one data bit period, sampler 104 may, for example, sample the equalizer output signal 46 once at a point in the equalizer output signal 46 that should correspond to a data value and once at a point in the equalizer output signal 46 that should correspond to a boundary value. Sampler 104 may then forward these data and boundary values to offset controller 106. Based on an analysis of particular data and boundary values, as described further below, offset controller 106 may adjust the DC offset compensation applied to the signal received by equalizer 42. It should be noted that, in particular embodiments, the same data and boundary value information forwarded to offset controller 106 may also be forwarded to adaptive controller 102, described above, and used in conjunction with adaptive gain control.

FIG. 23A illustrates an example 2600 of a clock signal in comparison with an equalizer output signal 46 exhibiting no residual DC offset. Example 2600 is similar to example 200 described above in conjunction with FIG. 4A and thus will not be described again in detail. However, it should be noted that in a signal exhibiting no residual DC offset, such as in example 2600, each boundary value between two successive data values comprising a transition (e.g., boundary values at E2, E3, and E4) randomly comprises either a high or a low value (illustrated as "X"), as discussed above. For such a signal, offset controller 106 may adjust the DC offset compensation applied to the input signal up or down randomly, as DC offset distortion is already being fully compensated or does not exist. If the numbers of up adjustments and down adjustments are substantially equal, the DC offset compensation applied to the input signal remains on average at the same level. If the numbers of up adjustments and down adjustments are not substantially equal, the DC offset compensation applied to the input signal may drift slightly from the initial level. Such drift of the DC offset compensation level may produce slight DC offset distortion. The equalizer receiver may detect this distortion and correct the DC offset compensation back to the average initial level, as illustrated below.

FIG. 23B illustrates an example 2650 of a clock signal in comparison with an equalizer output signal 46 exhibiting positive residual DC offset. An equalizer output signal 46 exhibiting positive residual DC offset has drifted upwardly (as in the example figure) relative to a signal exhibiting no residual DC offset. Also, the value of the boundary values before (e.g., E2) and after (e.g., E3) a high pulse (e.g., the pulse at D3) will likely be the same as the data value at the pulse (e.g., D3). The value of the boundary values before and after a low pulse will likely be different than (opposite to) the data value at the pulse. Thus, as described further below, upon analyzing particular data values and boundary value(s), offset controller 106 may decrease the DC offset compensation applied to the input signal to cancel the positive residual DC offset. It should be noted that in particular embodiments and as described below, offset controller 106 may not be able to cancel positive residual DC offset exhibited by the output signal until a transition (e.g., between D2 and D3) occurs.

FIG. 23C illustrates an example 2700 of a clock signal in comparison with an equalizer output signal 46 exhibiting negative residual DC offset. An equalizer output signal 46 exhibiting negative residual DC offset has drifted downwardly (as in the example figure) relative to a signal exhibiting no residual DC offset. Also, the value of the boundary values before (e.g., E2) and after (e.g., E3) a high pulse (e.g., the pulse at D3) will likely be different than (opposite to) the data value at the pulse. The value of the boundary values before and after a low pulse will likely be the same as the data value at the pulse. Thus, as described further below, upon analyzing particular data values and boundary value(s), offset controller 106 may increase the DC offset compensation applied to the input signal to cancel the negative residual DC offset. It should be noted that in particular embodiments and as described below, offset controller 106 may not be able to cancel negative residual DC offset exhibited by the output signal until a transition (e.g., between D2 and D3) occurs.

FIG. 24 is a flowchart illustrating a method 2800 for interpreting output signal values to cancel residual DC offset according to a particular embodiment of the invention. Method 2800 begins at step 2810, where an output signal 46 is sampled using a clock signal. The output signal 46 may be the output of an equalizer, and the output signal may be sampled according to a clock signal, as described above in conjunction with FIG. 3.

In particular embodiments, the output signal may be sampled at reference data points and boundary points determined by the clock signal. Alternatively, the output signal may not be sampled at boundary points, and boundary values corresponding to these non-sampled points may be derived. In particular embodiments, offset controller 106 may derive boundary values from sampled data values and other phase information (e.g., whether the phase of the output signal is early or late). For example, if the phase of the output signal is early, offset controller 106 may determine that the high or low value of the boundary value is the same as the high or low value of the data value immediately preceding the boundary value. If the phase of the output signal is late, offset controller 106 may determine that the high or low value of the boundary value is the same as the high or low value of the data value immediately after the boundary value.

At step 2820, after the output signal is sampled, the sampled data values may be analyzed to determine if a transition has occurred in the values. At step 2830, if a transition is not detected, the method returns to step 2820. If a transition is detected between successive data values, the method proceeds to step 2840. It should be noted that, in particular embodiments, a transition may be detected by comparing the received data values to each other directly. In alternative embodiments, a transition may be detected by comparing the received data values and boundary values to pre-defined value patterns that comprise a transition (and that correspond to particular offset cancellation actions). It should further be noted that, in particular embodiments, an offset cancellation action may take place after detecting only one transition.

If a transition is detected, at step 2840, the value (high or low) of the boundary value between the data values comprising the transition is identified. At step 2850, if the boundary value is high, the method proceeds to step 2860, and a negative offset cancellation action is taken to adjust the signal downwardly (because the residual DC offset is positive). If the boundary value is low, the method proceeds to step 2870, and a positive offset cancellation action is taken to adjust the signal upwardly (because the residual DC offset is negative). In particular embodiments, the boundary value may be identified and an offset cancellation action may be taken by comparing the boundary value to a pre-defined pattern (that corresponds to a particular offset cancellation action).

It should be noted that, in particular embodiments, steps 2820-2870 may be performed by offset controller 106, and DC offset cancellation actions may be applied using, for example, variable gain amplifiers 116. Also, in particular embodiments, if DC offset compensation is applied to more than one signal path (e.g., to paths 101 in example equalizer 42), the applied DC offset compensation may be adjusted in one path and fixed for the other paths. In alternative embodiments, an independent control variable may be mapped to the plurality of paths using a particular function, and DC offset compensation may be applied to the paths according to the mapping. Alternatively, DC offset compensation may be adjusted independently for each path, as discussed further below in conjunction with FIGS. 30-40.

FIG. 25 is a table illustrating an example DC offset control scheme 2900 associated with the method 2800 of FIG. 24. Each row 2902 corresponds to a particular pattern of values for which a particular offset canceller action is performed. Column 2910 includes a high or low value ("1" or "0") for each of a series of sampled data and boundary values. Column "D1" includes a first sampled data value of an output signal, column "D2" includes a second sampled data value of the output signal, and column "E1" includes the boundary value between the first and second data values. These values are similar to those illustrated in FIGS. 23A-23C. As can be observed, a transition occurs between data values in columns "D1" and "D2" in each pattern.

It should be noted that the pattern of values in each row 2902 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 2912 includes alternative boundary values at column "E1" for each row 2902. Column 2914 includes, for particular patterns, particular residual DC offset levels. Column 2916 includes, for particular patterns, particular actions to the offset cancellation setting to compensate for the particular residual DC offset levels. The actions to the offset cancellation setting may be applied as discussed above in method 2800.

It should be noted that, in particular embodiments, offset controller 106 may receive a stream of sampled values and select appropriate ones of these values (e.g., the boundary value between two data values comprising a transition). Offset controller 106 may then apply a suitable offset cancellation action based on the boundary value. Alternatively, offset controller 106 may compare the sampled values to pre-defined patterns of values (that correspond to particular offset cancellation actions). Based on the particular pre-defined pattern of values to which the sampled values corresponds, offset controller 106 may apply the corresponding offset cancellation action.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

One challenge arising from using output signal values to assess residual DC offset is the false-locking problem. The false-locking problem occurs when a clock signal and an offset canceller interact improperly, producing a false-locking state. The false-locking state may arise, for example, if the initial residual offset is as high as the input signal amplitude. In the false-locking state, the sampling phases for the boundary and data values are interchanged. The offset is also largely shifted from the real center, locking the boundary sampling at the cross point above or below the real eye opening. The false-locking problem distorts the assessment of residual DC offset using output signal values.

FIG. 26 is a flowchart illustrating a method 3000 for correcting for false locking in canceling residual DC offset according to a particular embodiment of the invention. Method 3000 corrects for the false locking problem by adjusting DC offset compensation based on the value (high or low) of each boundary value. Thus, unlike in method 2800, DC offset compensation may be adjusted based on boundary values that are between data values having the same value (in addition to those that are between data values comprising a transition). As a result, transitions need not be identified in method 3000 before adjusting the DC offset compensation. By adjusting the DC offset compensation in this manner, method 3000 may nudge a signal that is in a false-locking state out of the false-locking state. It should be noted that method 3000 may be similar to method 2800 of FIG. 24, described above, excluding steps 2820 and 2830.

Method 3000 begins at step 3010, where an output signal is sampled using a clock signal. The output signal may be the output of an equalizer, and the output signal may be sampled according to a clock signal, as described above in conjunction with FIG. 3. In particular embodiments, the output signal may be sampled at reference data points and boundary points determined by the clock signal. Alternatively, the output signal may not be sampled at boundary points, and boundary values corresponding to these non-sampled points may be derived. It should be noted that, at this point, the signal may be in a false-locking state.

After the output signal is sampled, at step 3020, the values (high or low) of the boundary values are identified. At step 3030, if a boundary value is high, the method proceeds to step 3040, and a negative offset cancellation action is taken to adjust the signal downwardly. If a boundary value is low, the method proceeds to step 3050, and a positive offset cancellation action is taken to adjust the signal upwardly. In particular embodiments, the boundary value may be identified and an offset cancellation action may be taken by comparing the boundary value to a pre-defined pattern (that corresponds to a particular offset cancellation action).

By taking offset cancellation actions based on any boundary value (i.e., regardless of whether a transition has been identified), a signal in a false-locking state may be nudged out of the false-locking state. In addition, since some of the boundary values used may arise between successive data values comprising a transition, offset adjustments may also cancel residual DC offset.

FIG. 27 is a table 3100 illustrating an example offset control scheme associated with the method 3000 of FIG. 26. Each row 3102 corresponds to a particular pattern of values for which a particular offset canceller action is performed. Column 3110 includes a high or low value ("1" or "0") for each of a series of sampled data and boundary values. Column "D1" includes a first sampled data value of an output signal, column "D2" includes a second sampled data value of the output signal, and column "E1" includes the boundary value between the first and second data values. These values are similar to those illustrated in FIGS. 23A-23C. As can be observed, a transition does not necessarily occur between data values in columns "D1" and "D2" in each pattern.

It should be noted that the pattern of values in each row 3102 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 3112 includes alternative boundary values at column "E1" for each row 3102. Column 3114 includes, for particular patterns, particular residual DC offset levels. Column 3116 includes, for particular patterns, particular actions to the offset cancellation setting. The actions to the offset cancellation setting may be applied as discussed above in method 3000.

It should be noted that particular boundary values in column 3112 are placed in parentheses. Boundary values in parentheses are those with a high or low value different than the high or low value of the two data values immediately around the boundary value. Such a case may be atypical in particular embodiments. Nonetheless, offset canceller actions may be taken based on the high or low value of the boundary value in particular embodiments.

Method 3000 may provide an effective solution to the false-locking problem, especially when applied to random signals or where re-sampling (sampling at a lower rate than the data rate) is not used. If, however, the incoming signal is a (quasi-) periodic signal and re-sampling is used, method 3000 may not prevent systematic residual offset from arising in the signal in certain circumstances. This may be so if, for example, the cycle of the re-sampling locks to the cycle of the periodic signal. Thus, an offset canceller that can correct for the false locking problem and adjust residual DC offset suitably in a (quasi-) periodic signal where re-sampling is used may be useful in particular circumstances.

Figure 28:
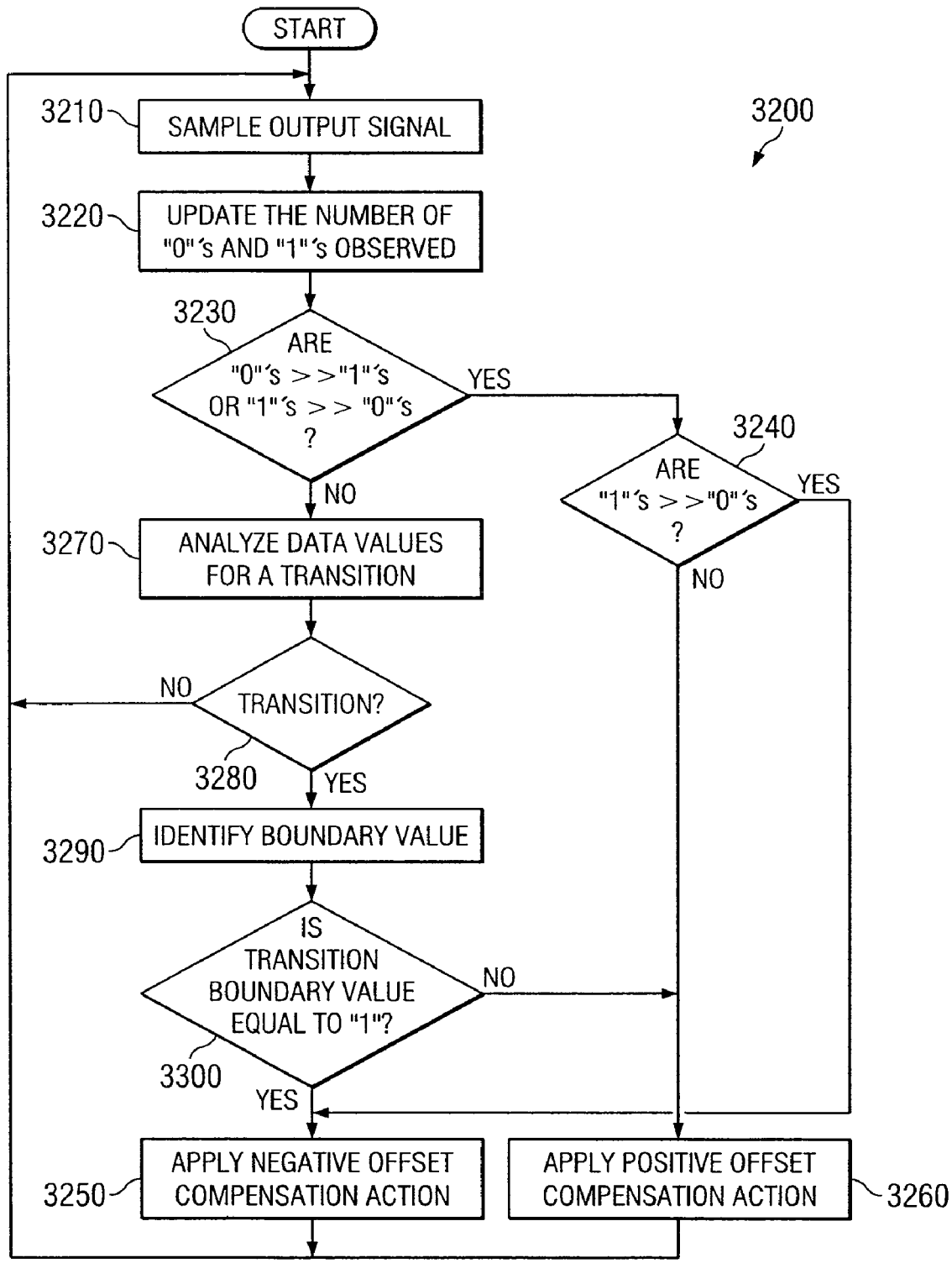
FIG. 28 is a flowchart illustrating another method for correcting for false locking in canceling residual DC offset according to a particular embodiment of the invention.

FIG. 28 is a flowchart illustrating another method 3200 for correcting for false locking in canceling residual DC offset according to a particular embodiment of the invention. Method 3200 corrects for the false locking problem in periodic signals by first monitoring for data DC imbalance (a proxy for the false locking problem) using output signal values. If an imbalance is detected, DC offset compensation is adjusted based on the detected imbalance. If an imbalance is not detected, DC offset compensation is adjusted based on the values (high or low) of only those boundary values between successive data values that comprise transitions (similarly to method 2800, described above). Using method 3200, data DC imbalance may be controlled to be within an acceptable range, even when re-sampling is used to sample a (quasi-) periodic data signal.

Method 3200 begins at step 3210, where an output signal is sampled using a clock signal. The output signal may be the output of an equalizer, and the output signal may be sampled according to a clock signal, as described above in conjunction with FIG. 3. In particular embodiments, the output signal may be sampled at reference data points and boundary points determined by the clock signal. Alternatively, the output signal may not be sampled at boundary points, and boundary values corresponding to these non-sampled points may be derived. In particular embodiments, offset controller 106 may derive boundary values from sampled data values and other phase information (e.g., whether the phase is early or late).

At step 3220, as the output signal is sampled, the number of low data values (i.e., "0") and the number of high data values (i.e., "1") are counted, and this count is updated as the signal is sampled. In particular embodiments, the number of data values in each count (low and high) may include only a certain number of previous data values observed. In alternative embodiments, the number of data values in each count may include only those previous data values observed during a certain period of time. Any suitable counter(s) may store the number of high data values and the number of low data values observed, and this counter(s) may be updated based on the high or low values of incoming data values.

At step 3230, the count of the high data values is compared to the count of the low data values, and a determination is made whether one type of data value is observed much more frequently than the other (to determine whether the signal is in a false-locking state). If one type of data value is observed much more frequently than the other (as an example only, greater than three times more frequently), method 3200 proceeds to step 3240. If neither type of data value is observed much more frequently than the other data value, method 3200 proceeds to step 3270. In particular embodiments, the difference between the numbers of each type of data value or the ratio of the numbers of each type of data value may be compared to a pre-determined number or ratio, respectively.

At step 3240, a determination is made whether high data values have been observed much more frequently than low data values. If high data values have been observed much more frequently than low data values, method 3200 proceeds to step 3250, and a negative offset cancellation action is taken to adjust the signal downwardly. If low data values have been observed much more frequently than high data values, method 3200 proceeds to step 3260, and a positive offset cancellation action is taken to adjust the signal upwardly. By adjusting the DC offset compensation applied in this manner, a signal in a false-locking state may be nudged out of the false-locking state.

It should be noted that, although method 3200 monitors for data DC imbalance by counting and comparing output data values, in alternative embodiments, output data values and/or boundary values may be counted and compared in a similar manner to monitor for data DC imbalance. The counts of data values and/or boundary values may also be analyzed in a similar manner to adjust the offset compensation applied to the input data signal.

If, at step 3230, neither type of data value is observed much more frequently than the other data value, method 3200 proceeds to step 3270. At step 3270, the sampled data values may be analyzed to determine if a transition has occurred in the values. At step 3280, if a transition is not detected, the method returns to step 3210, and the output signal is sampled. If a transition is detected between successive data values, the method proceeds to step 3290. It should be noted that, in particular embodiments, a transition may be detected by comparing the received data values to each other directly. In alternative embodiments, a transition may be detected by comparing the received data values and boundary values to pre-defined value patterns that comprise a transition (and that correspond to particular offset cancellation actions). It should further be noted that, in particular embodiments, an offset cancellation action may take place after detecting only one transition.

If a transition is detected, at step 3290, the value (high or low) of the boundary value between the data values comprising the transition is identified. At step 3300, if the boundary value is high, the method proceeds to step 3250, and a negative offset cancellation action is taken to adjust the signal downwardly (because the residual DC offset is positive). If the boundary value is low, the method proceeds to step 3260, and a positive offset cancellation action is taken to adjust the signal upwardly (because the residual DC offset is negative). In particular embodiments, the boundary value may be identified and an offset cancellation action may be taken by comparing the boundary value to a pre-defined pattern (that corresponds to a particular offset cancellation action). Method 3200 then returns to steps 3210 and 3220 to sample the output signal and update the number of low and high data values counted.

It should be noted that, in particular embodiments, steps 3220-3300 may be performed by offset controller 106, and DC offset cancellation actions may be applied using, for example, variable gain amplifiers 116. Also, in particular embodiments, if DC offset compensation is applied to more than one signal path (e.g., to paths 101 in example equalizer 42), the applied DC offset compensation may be adjusted in one path and fixed for the other paths. In alternative embodiments, an independent control variable may be mapped to the plurality of paths using a particular function, and DC offset compensation may be applied to the paths according to the mapping. Alternatively, DC offset compensation may be adjusted independently for each path, as discussed further below in conjunction with FIGS. 30-40.

As can be observed, method 3200 bifurcates the manner in which DC offset compensation is adjusted based on the relative frequency that particular data values are observed. If one type of data value is observed much more frequently than the other type, method 3200 corrects for this imbalance, which presumably arises due to false-locking. If neither type of data value is observed much more frequently than the other type, method 3200 assumes that the signal is not in a false-locking state and analyzes only those boundary values between successive data values comprising a transition to correct for residual DC offset. In this manner, method 3200 may cause any data DC imbalance to remain in an acceptable range. In particular embodiments, data DC imbalance may remain in an acceptable range even when the incoming signal is a (quasi-) periodic signal and re-sampling is used.

FIG. 29 is a table 3400 illustrating an example offset control scheme associated with the method 3200 of FIG. 28. Each row 3402 corresponds to a particular pattern of values for which a particular offset canceller action is performed. Column 3410 includes a high or low value ("1" or "0") for each of a series of sampled data and boundary values. Column "D1" includes a first sampled data value of an output signal, column "D2" includes a second sampled data value of the output signal, and column "E1" includes the boundary value between the first and second data values. These values are similar to those illustrated in FIGS. 23A-23C. As can be observed, a transition need not occur between data values in columns "D1" and "D2" in each pattern.

It should be noted that the pattern of values in each row 3402 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 3412 includes alternative transition boundary values at column "E1" for rows 3402a and 3402b. For rows 3402c and 3402d, "X"'s are included in column 3412 because, for successive data values having the same value, boundary values are not considered when taking an offset canceller action. Instead, only the relative frequencies of high or low data values are considered, as described above in method 3200. Column 3414 includes, for particular patterns, particular residual DC offset levels. Column 3416 includes, for particular patterns, particular actions to the offset cancellation setting. The actions to the offset cancellation setting may be applied as discussed above in method 3200.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

In particular embodiments, an equalizer, such as equalizer 42 of FIG. 3, may apply DC offset cancellation actions to more than one signal path, such as, for example, the unmodified (DC), first-order, and second-order components of a signal. Examples of equalizers that may apply DC offset cancellation actions to more than one signal path include second-order derivative equalizers. In some equalizers, DC offset cancellation actions may be applied to the multiple signal paths in a set manner. Applying DC offset cancellation actions in a set manner includes adjusting DC offset compensation in one path and fixing DC offset compensation for the other paths. Alternatively, applying DC offset cancellation actions in a set manner includes mapping an independent control variable to the plurality of paths using a particular function and adjusting DC offset compensation in the paths according to the mapping.

Applying DC offset cancellation actions to multiple signal paths in a set manner may be disadvantageous in particular circumstances. For example, if the multiple signal paths have residual DC offsets in opposite directions (i.e., such that they cancel each other out when combined at combiner 118), the equalizer may not correct for residual DC offset in each signal path, and the DC offset may saturate the signal component in one or more of the paths. Allowing residual DC offset to persist in one or more signal paths may degrade the performance of the equalizer, limiting, for example, the range of linear operation of the equalizer circuit.

FIG. 30 illustrates examples 3500 of a DC path output 3510 exhibiting negative residual DC offset, a first-order derivative path output 3520 exhibiting positive residual DC offset, and an equalizer output signal 3530 exhibiting mostly zero residual DC offset of an example first-order derivative equalizer in comparison with a clock signal. It should be noted that, although DC path output 3510 and first-order derivative path output 3520 are illustrated in comparison with a clock signal, a receiver may not individually monitor outputs 3510 and 3520 or sample outputs 3510 and 3520 using a clock signal. In the illustrated example, equalizer output 3530 is the sum of the DC path output 3510 and the first-order derivative path output 3520. As can be observed, although equalizer output 3530 exhibits mostly zero overall DC offset, DC path output 3510 is saturated and exhibits negative offset, and first-order derivative path output 3520 exhibits positive offset. Thus, an equalizer that applies DC offset cancellation actions in a set manner to the paths may not correct for residual offset in the individual paths, and the residual offset may degrade equalizer performance. Thus, an equalizer that can cancel residual offset in each of a signal's constituent paths is advantageous in particular circumstances.

It should be noted that the equalizer output 3530 may exhibit mostly cancelled overall offset at the boundary E3 and the boundary E4, but it may exhibit slightly positive offset at the boundary E2, that is in the same polarity as the offset of the first-order derivative path output 3520. This may be caused by saturation of the DC path output 3510. In other words, if the DC path output 3510 and the first-order derivative path output 3520 have residual offset in the same magnitude in the opposite polarities, they may be completely cancelled with each other at the equalizer output 3530 at boundaries after multiple consecutive transitions, such as at E3 and E4, because the DC path output 3510 may not be saturated after multiple consecutive transitions. On the other hand, even if the DC path output 3510 and the first-order derivative path output 3520 have residual DC offset in the same magnitude in the opposite polarities, they may not be completely cancelled with each other at the equalizer output 3530 at boundaries after several data bits of the same value, such as at E2, and the equalizer output 3530 may tend to have the same polarity offset as the first-order derivative path output 3520, because the DC path output 3510 may have slightly smaller magnitude of offset than the first-order derivative path output 3520 due to the effect of saturation of the DC path output 3510 which may have occurred after the continuous data bits of the same value. In this way, the residual offset in an individual path such as the first-order derivative path output 3520 may be detected from the overall equalizer output 3530 by selecting the boundary value according to the data pattern preceding the boundary.

Figure 31:
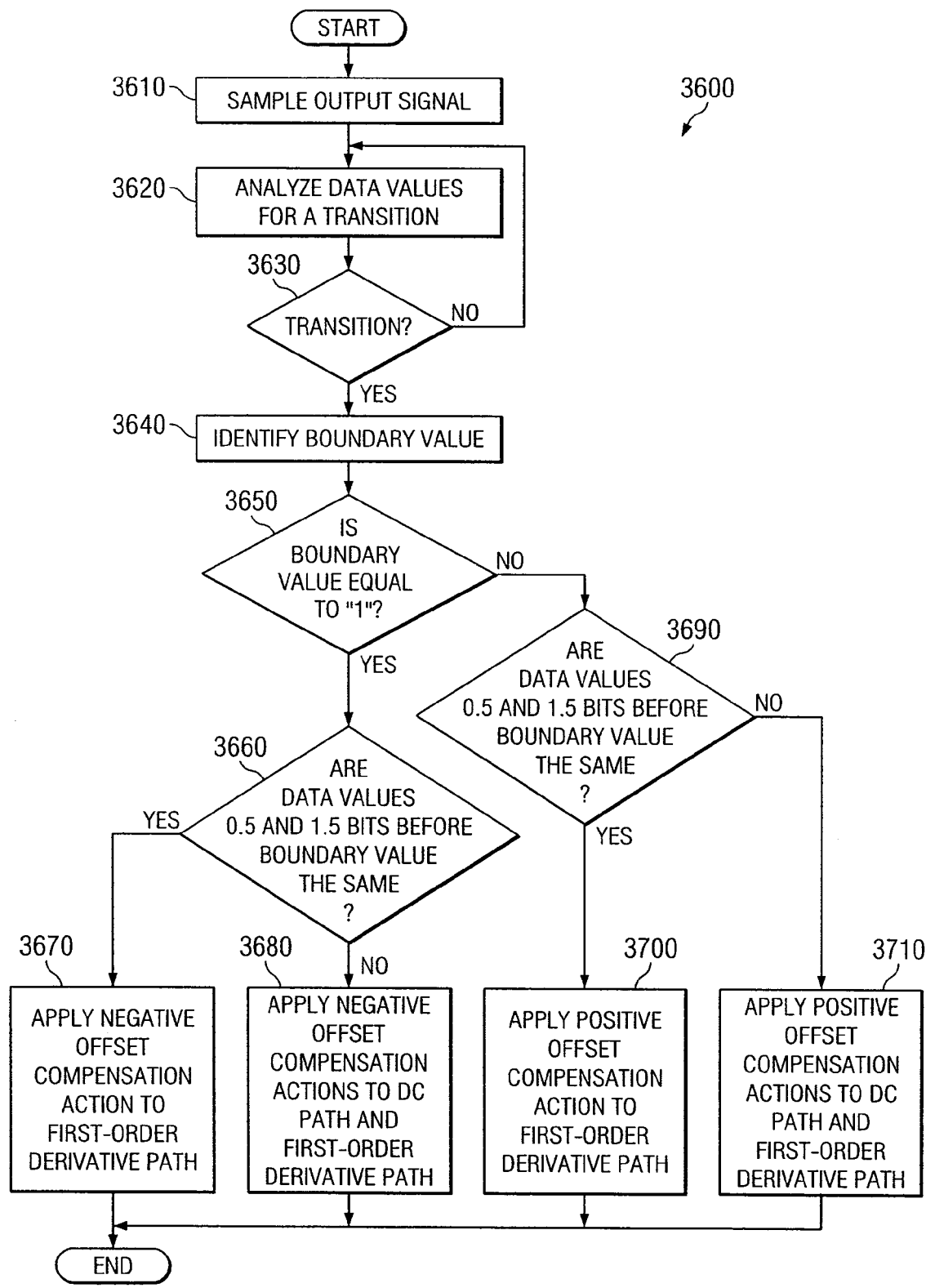
FIG. 31 is a flowchart illustrating an example method for canceling residual DC offset in a first-order derivative analog equalizer according to a particular embodiment of the invention.

FIG. 31 is a flowchart illustrating an example method 3600 for canceling residual DC offset in a first-order derivative analog equalizer according to a particular embodiment of the invention. Method 3600 may cancel residual DC offset in the unmodified DC path and in the first-order derivative path of the first-order derivative equalizer by applying offset cancellation actions to one or both of the paths in particular circumstances.

For example, offset cancellation actions may be applied only to the first-order derivative path when successive data values having the same high or low value are observed before a transition. Successive data values having the same value may suggest that the DC path is saturated (assuming that the overall offset of the signal is substantially cancelled). Thus, the value (high or low) of the boundary value between the data values comprising the transition likely corresponds to the residual DC offset in the first-order derivative path. Offset cancellation actions may be applied to both the first-order derivative and DC paths when successive data values having different high or low values are observed before a transition. By applying offset cancellation actions in such a manner, even if the unmodified DC and first-order derivative paths exhibit residual offsets in opposite directions, method 3600 may correct for residual offset in each signal path.

Method 3600 begins at step 3610, where an output signal is sampled using a clock signal. The output signal may be the output of an equalizer, and the output signal may be sampled according to a clock signal, as described above in conjunction with FIG. 3. In particular embodiments, the output signal may be sampled at reference data points and boundary points determined by the clock signal. Alternatively, the output signal may not be sampled at boundary points, and boundary values corresponding to these non-sampled points may be derived. In particular embodiments, offset controller 106 may derive boundary values from sampled data values and other phase information (i.e., whether the phase of the output signal is early or late).

At step 3620, after the output signal is sampled, the sampled data values may be analyzed to determine if a transition has occurred in the data values. At step 3630, if a transition is not detected, the method returns to step 3620. If a transition is detected between successive data values, the method proceeds to step 3640. It should be noted that, in particular embodiments, a transition may be detected by comparing the received data values to each other directly. In alternative embodiments, a transition may be detected by comparing the received data values and boundary values to pre-defined value patterns that comprise a transition (and that correspond to particular offset cancellation actions). It should further be noted that, in particular embodiments, an offset cancellation action may take place after detecting a single transition.

If a transition is detected, at step 3640, the boundary value between the successive data values comprising the transition is identified. At step 3650, if the boundary value is high, the method proceeds to step 3660. If the boundary value is low, the method proceeds to step 3690.

At step 3660, a determination is made whether the data values 0.5 and 1.5 bits before the boundary value are the same. If so, the DC path may be saturated, and the value of the boundary value may reflect the residual DC offset in the first-order derivative path. Thus, if the data values 0.5 and 1.5 bits before the boundary value are the same, method 3600 proceeds to step 3670, and a negative offset cancellation action is applied to the first-order derivative path to adjust the signal downwardly (because the residual first-order derivative path offset is positive). If the data values 0.5 and 1.5 bits before the boundary value are different, method 3600 proceeds to step 3680, and a negative offset cancellation action is applied to the unmodified DC path and the first-order derivative path to adjust the signal downwardly (because the residual equalizer offset is positive). It should be noted that, in particular embodiments, the boundary value may be identified, the comparison of data values may be made, and an offset cancellation action may be taken by comparing the boundary value and data values to pre-defined patterns (that correspond to particular offset cancellation actions).

If, at step 3650, the boundary value is low, method 3600 proceeds to step 3690. At step 3690, a determination is made whether the data values 0.5 and 1.5 bits before the boundary value are the same. If so, the DC path may be saturated, and the value of the boundary value may reflect the residual DC offset in the first-order derivative path. Thus, if the data values 0.5 and 1.5 bits before the boundary value are the same, method 3600 proceeds to step 3700, and a positive offset cancellation action is applied to the first-order derivative path to adjust the signal upwardly (because the residual first-order derivative path offset is negative). If the data values 0.5 and 1.5 bits before the boundary value are different, method 3600 proceeds to step 3710, and a positive offset cancellation action is applied to the unmodified DC path and the first-order derivative path to adjust the signal upwardly (because the residual equalizer offset is negative). It should be noted that, in particular embodiments, the boundary value may be identified, the comparison of data values may be made, and an offset cancellation action may be taken by comparing the boundary value and data values to pre-defined patterns (that correspond to particular offset cancellation actions).

It should also be noted that, in particular embodiments, steps 3620-3710 may be performed by offset controller 106, and DC offset cancellation actions may be applied using, for example, variable gain amplifiers 116. It should further be noted that, although the relationship between the data values 0.5 and 1.5 bits before the boundary value is used to determine to what set of paths to apply the offset compensation, the relationship between or among any suitable data values may be used (e.g., taking into account the data value 2.5 bits before the boundary value). It should also be noted that method 3600 may be generalized to apply to equalizers associated with any suitable number of signal paths.

FIG. 32 is a table 3800 illustrating an example offset control scheme associated with the method 3600 of FIG. 31. Each row 3802 corresponds to a particular pattern of values for which a particular offset canceller action is performed (to either the first-order derivative path or to both the first-order derivative path and the unmodified DC path). Column 3810 includes a high or low value ("1" or "0") for each of a series of sampled data and boundary values. Column "D0" includes a zeroeth sampled data value of an output signal, column "D1" includes a first sampled data value of the output signal, column "D2" includes a second sampled data value of the output signal, and column "E1" includes the boundary value between the first and second data values. These values are similar to those illustrated in FIGS. 23A-23C. As can be observed, a transition occurs between data values in columns "D1" and "D2" in each pattern.

It should be noted that the pattern of values in each row 3802 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 3812 includes alternative boundary values at column "E1" for each row 3802. Column 3814 includes, for particular patterns, particular residual DC offset levels and DC offset cancellation actions associated with the unmodified DC path of the input signal. The DC offset cancellation actions may be applied as discussed above in method 3600. Column 3816 includes, for particular patterns, particular residual DC offset levels and DC offset cancellation actions associated with the first-order derivative path of the input signal. The DC offset cancellation actions may be applied as discussed above in method 3600.

Figure 33:
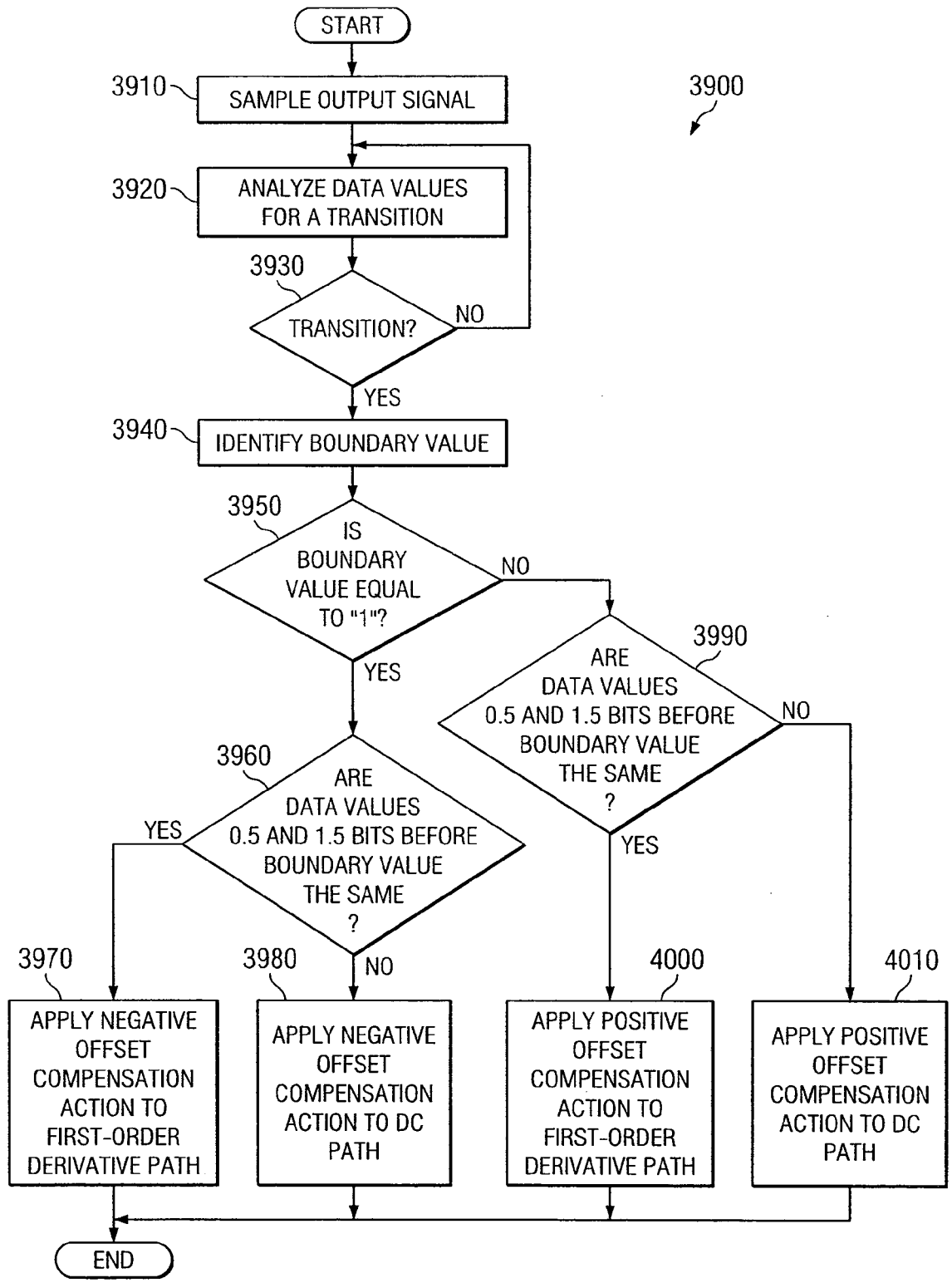
FIG. 33 is a flowchart illustrating another example method for canceling residual DC offset in a first-order derivative analog equalizer according to a particular embodiment of the invention.

FIG. 33 is a flowchart illustrating another example method 3900 for canceling residual DC offset in a first-order derivative analog equalizer according to a particular embodiment of the invention. Like method 3600 in FIG. 31, method 3900 may cancel residual DC offset in the unmodified DC path and in the first-order derivative path of the first-order derivative equalizer by applying offset cancellation actions to either of the paths in particular circumstances.

In method 3900, offset cancellation actions may be applied only to the first-order derivative path when successive data values having the same high or low value are observed before a transition. Successive data values having the same value may suggest that the DC path is saturated (assuming that the overall offset of the signal is substantially cancelled). Thus, the value (high or low) of the boundary value between the data values comprising the transition likely corresponds to the residual DC offset in the first-order derivative path. Offset cancellation actions may be applied only to the unmodified DC path when successive data values having different high or low values are observed before a transition. By applying offset cancellation actions in such a manner, even if the unmodified DC and first-order derivative paths exhibit residual offsets in opposite directions, method 3900 may correct for residual offset in each signal path.

Method 3900 begins at step 3910, where an output signal is sampled using a clock signal. Because steps 3910-3960 and 3990 may be the same as steps 3610-3660 and 3690, respectively, steps 3910-3960 and 3990 will not be described in detail. After a determination is made at step 3960 whether the data values 0.5 and 1.5 bits before the boundary value are the same, method 3900 proceeds to step 3970 if the values are the same or to step 3980 if the values are different. At step 3970, a negative offset cancellation action is applied to the first-order derivative path to adjust the signal downwardly (because the residual first-order derivative path offset is positive). At step 3980, if the data values 0.5 and 1.5 bits before the boundary value are different, a negative offset cancellation action is applied to the unmodified DC path to adjust the signal downwardly (because the residual equalizer offset is positive). It should be noted that, in particular embodiments, the boundary value may be identified, the comparison of data values may be made, and an offset cancellation action may be taken by comparing the boundary value and data values to pre-defined patterns (that correspond to particular offset cancellation actions).

After a determination is made at step 3990 whether the data values 0.5 and 1.5 bits before the boundary value are the same, method 3900 proceeds to step 4000 if the values are the same or to step 4010 if the values are different. At step 4000, a positive offset cancellation action is applied to the first-order derivative path to adjust the signal upwardly (because the residual first-order derivative path offset is negative). At step 4010, if the high or low values of the data values 0.5 and 1.5 bits before the boundary value are different, a positive offset cancellation action is applied to the unmodified DC path to adjust the signal upwardly (because the residual equalizer offset is negative). It should be noted that, in particular embodiments, the boundary value may be identified, the comparison of data values may be made, and an offset cancellation action may be taken by comparing the boundary value and data values to pre-defined patterns (that correspond to particular offset cancellation actions).

It should also be noted that, in particular embodiments, steps 3920-4010 may be performed by offset controller 106, and DC offset cancellation actions may be applied using, for example, variable gain amplifiers 116. It should further be noted that, although the relationship between the data values 0.5 and 1.5 bits before the boundary value is used to determine to what set of paths to apply the offset compensation, the relationship between or among any suitable data values may be used (i.e., taking into account the data value 2.5 bits before the transition boundary value). It should also be noted that method 3900 may be generalized to apply to equalizers associated with any suitable number of signal paths.

FIG. 34 is a table 4100 illustrating an example offset control scheme associated with the method 3900 of FIG. 33. Each row 4102 corresponds to a particular pattern of values for which a particular offset canceller action is performed (to either the first-order derivative path or the unmodified DC path). Column 4110 includes a high or low value ("1" or "0") for each of a series of sampled data and boundary values. Column "D0" includes a zeroeth sampled data value of an output signal, column "D1" includes a first sampled data value of the output signal, column "D2" includes a second sampled data value of the output signal, and column "E1" includes the boundary value between the first and second data values. These values are similar to those illustrated in FIGS. 23A-23C. As can be observed, a transition occurs between data values in columns "D1" and "D2" in each pattern.

It should be noted that the pattern of values in each row 4102 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 4112 includes alternative boundary values at column "E1" for each row 4102. Column 4114 includes, for particular patterns, particular residual DC offset levels and DC offset cancellation actions associated with the unmodified DC path of the input signal. The DC offset cancellation actions may be applied as discussed above in method 3900. Column 4116 includes, for particular patterns, particular residual DC offset levels and DC offset cancellation actions associated with the first-order derivative path of the input signal. The DC offset cancellation actions may be applied as discussed above in method 3900.

Figure 35:
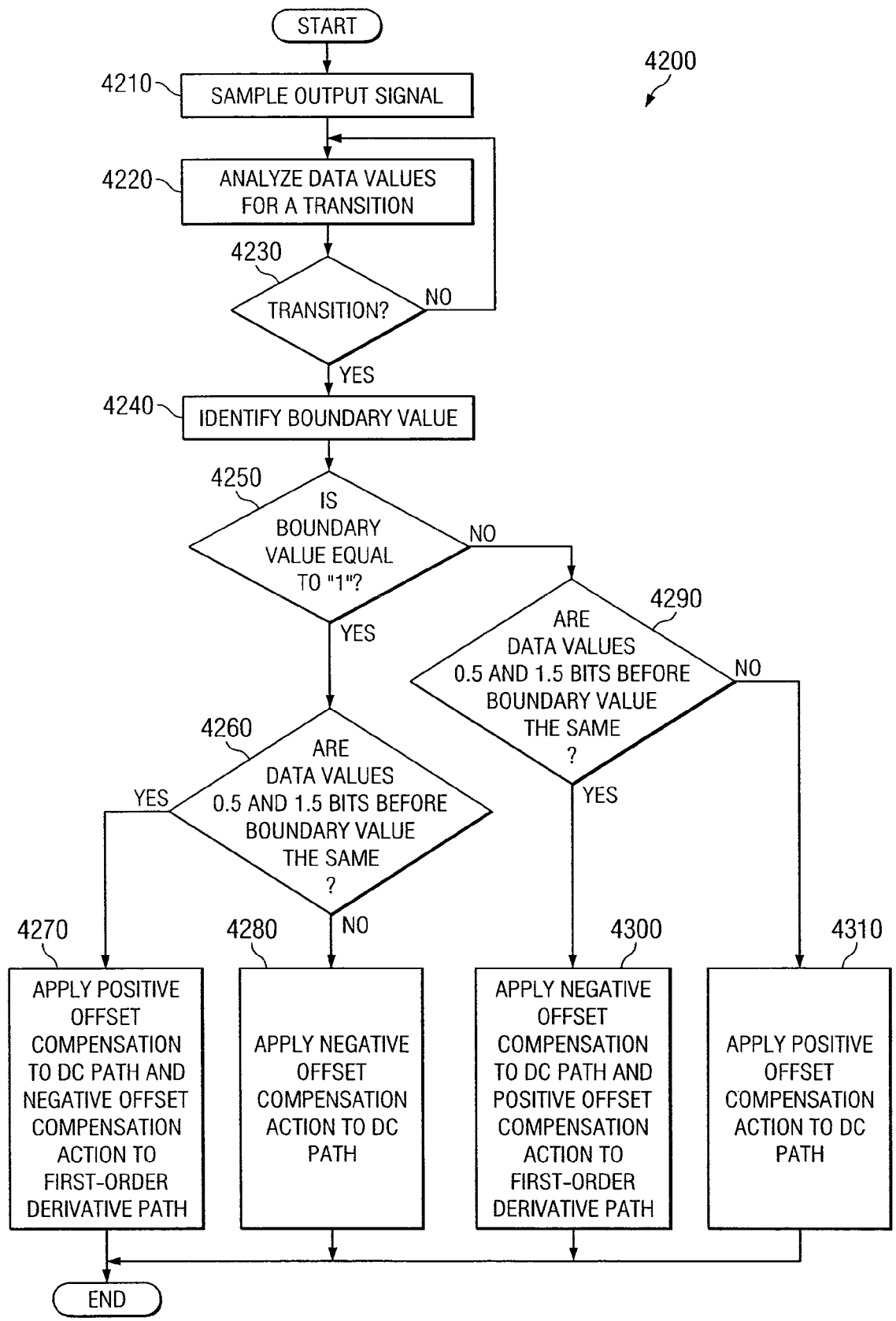
FIG. 35 is a flowchart illustrating yet another example method for canceling residual DC offset in a first-order derivative analog equalizer according to a particular embodiment of the invention.

FIG. 35 is a flowchart illustrating yet another example method 4200 for canceling residual DC offset in a first-order derivative analog equalizer according to a particular embodiment of the invention. Like method 3600 in FIG. 31, method 4200 may, under certain conditions, apply offset cancellation actions to one or both of the unmodified DC and first-order derivative paths of the first-order derivative analog equalizer to cancel residual offset in the paths. Method 4200 may do so by applying offset cancellation actions to both the unmodified DC and first-order derivative paths when successive data values having the same high or low value are observed before a transition. Offset cancellation actions may be applied only to the unmodified DC path when successive data values having different high or low values are observed before a transition. By applying offset cancellation actions in such a manner, method 4200 may correct for residual offset in each signal path.

Method 4200 begins at step 4210, where an output signal is sampled using a clock signal. Because steps 4210-4260 and 4290 may be the same as steps 3610-3660 and 3690, respectively, steps 4210-4260 and 4290 will not be described. After a determination is made at step 4260 whether the data values 0.5 and 1.5 bits before the boundary value are the same, method 4200 proceeds to step 4270 if the values are the same or to step 4280 if the values are different. At step 4270, a positive offset cancellation action is applied to the unmodified DC path to adjust the unmodified DC path upwardly, and a negative offset cancellation action is applied to the first-order derivative path to adjust the first-order derivative path downwardly (because the residual first-order derivative path offset is positive). The offset of the unmodified DC path may be adjusted upwardly in an opposite manner as the first-order derivative path in order to keep the overall offset correction at the same level, while the offset of the first-order derivative path is adjusted downwardly. At step 4280, if the data values 0.5 and 1.5 bits before the boundary value are different, a negative offset cancellation action is applied to the unmodified DC path to adjust the signal downwardly (because the residual equalizer offset is positive). It should be noted that, in particular embodiments, the boundary value may be identified, the comparison of data values may be made, and an offset cancellation action may be taken by comparing the boundary value and data values to pre-defined patterns (that correspond to particular offset cancellation actions).

After a determination is made at step 4290 whether the data values 0.5 and 1.5 bits before the boundary value are the same, method 4200 proceeds to step 4300 if the values are the same or to step 4310 if the values are different. At step 4300, a negative offset cancellation action is applied to the unmodified DC path to adjust the unmodified DC path downwardly, and a positive offset cancellation action is applied to the first-order derivative path to adjust the first-order derivative path upwardly (because the residual first-order derivative path offset is negative). The offset of the unmodified DC path may be adjusted downwardly in an opposite manner as the first-order derivative path in order to keep the overall offset correction at the same level, while the offset of the first-order derivative path is adjusted upwardly. At step 4310, if the data values 0.5 and 1.5 bits before the boundary value are different, a positive offset cancellation action is applied to the unmodified DC path to adjust the signal upwardly (because the residual equalizer offset is negative). It should be noted that, in particular embodiments, the boundary value may be identified, the comparison of data values may be made, and an offset cancellation action may be taken by comparing the boundary value and data values to pre-defined patterns (that correspond to particular offset cancellation actions).

It should also be noted that, in particular embodiments, steps 4220-4310 may be performed by offset controller 106, and DC offset cancellation actions may be applied using, for example, variable gain amplifiers 116. It should further be noted that, although the relationship between the data values 0.5 and 1.5 bits before the boundary value is used to determine to what set of paths to apply the offset compensation, the relationship between or among any suitable data values may be used (e.g., taking into account the data value 2.5 bits before the transition boundary value). It should also be noted that method 4200 may be generalized to apply to equalizers associated with any suitable number of signal paths.

FIG. 36 is a table 4400 illustrating an example offset control scheme associated with the method 4200 of FIG. 35. Each row 4402 corresponds to a particular pattern of values for which a particular offset canceller action is performed (to either the first-order derivative and DC paths or the DC path only). Column 4410 includes a high or low value ("1" or "0") for each of a series of sampled data and boundary values. Column "D0" includes a zeroeth sampled data value of an output signal, column "D1" includes a first sampled data value of the output signal, column "D2" includes a third sampled data value of the output signal, and column "E1" includes the boundary value between the first and second data values. These values are similar to those illustrated in FIGS. 23A-23C. As can be observed, a transition occurs between data values in columns "D1" and "D2" in each pattern.

It should be noted that the pattern of values in each row 4402 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 4412 includes alternative boundary values at column "E1" for each row 4402. Column 4414 includes, for particular patterns, particular residual DC offset levels and DC offset cancellation actions associated with the unmodified DC path of the input signal. The DC offset cancellation actions may be applied as discussed above in method 4200. Column 4416 includes, for particular patterns, particular residual DC offset levels and DC offset cancellation actions associated with the first-order derivative path of the input signal. The DC offset cancellation actions may be applied as discussed above in method 4200.

Figure 37:
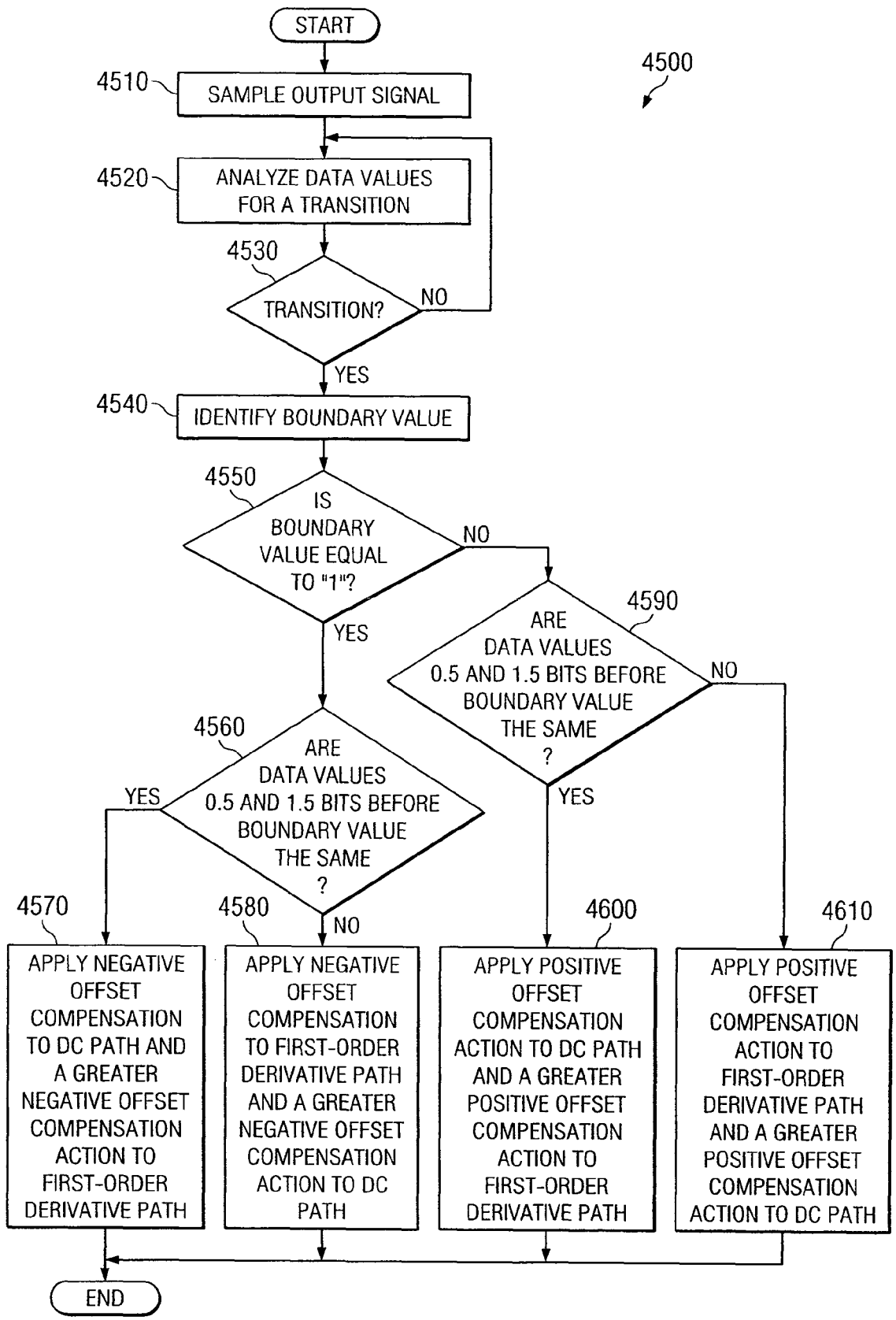
FIG. 37 is a flowchart illustrating yet another example method for canceling residual DC offset in a first-order derivative analog equalizer according to a particular embodiment of the invention.

FIG. 37 is a flowchart illustrating yet another example method 4500 for canceling residual DC offset in a first-order derivative analog equalizer according to a particular embodiment of the invention. Like method 3600 in FIG. 31, method 4500 may, under certain conditions, apply offset cancellation actions to both of the unmodified DC and first-order derivative paths of the first-order derivative analog equalizer in biased manners to cancel residual offset in the paths. Method 4500 may do so by applying offset cancellation actions to both the DC and first-order derivative paths with a bias on first-order derivative path when successive data values having the same high or low value are observed before a transition. Offset cancellation actions may also be applied to both the DC and first-order derivative paths with a bias on the DC path when successive data values having different high or low values are observed before a transition. By applying offset cancellation actions in such a biased manner, even if the unmodified DC and first-order derivative paths exhibit residual offsets in opposite directions, method 4500 may correct for residual offset in each signal path.

Method 4500 begins at step 4510, where an output signal is sampled using a clock signal. Because steps 4510-4560 and 4590 may be the same as steps 3610-3660 and 3690, respectively, steps 4510-4560 and 4590 will not be described. After a determination is made at step 4560 whether the data values 0.5 and 1.5 bits before the boundary value are the same, method 4500 proceeds to step 4570 if the values are the same or to step 4580 if the values are different. At step 4570, a negative offset cancellation action is applied to the unmodified DC path to adjust the unmodified DC path downwardly, and a greater negative offset cancellation action is applied to the first-order derivative path to adjust the first-order derivative path downwardly (because the residual first-order derivative path offset is positive). At step 4580, if the data values 0.5 and 1.5 bits before the boundary value are different, a negative offset cancellation action is applied to the first-order derivative path to adjust the first-order derivative path downwardly, and a greater negative offset cancellation action is applied to the unmodified DC path to adjust the unmodified DC path downwardly (because the residual equalizer offset is positive). It should be noted that, in particular embodiments, the boundary value may be identified, the comparison of data values may be made, and an offset cancellation action may be taken by comparing the boundary value and data values to pre-defined patterns (that correspond to particular offset cancellation actions).

After a determination is made at step 4590 whether the data values 0.5 and 1.5 bits before the boundary value are the same, method 4500 proceeds to step 4600 if the values are the same or to step 4610 if the values are different. At step 4600, a positive offset cancellation action is applied to the unmodified DC path to adjust the unmodified DC path upwardly, and a greater positive offset cancellation action is applied to the first-order derivative path to adjust the first-order derivative path upwardly (because the residual first-order derivative path offset is negative). At step 4610, if the data values 0.5 and 1.5 bits before the boundary value are different, a positive offset cancellation action is applied to the first-order derivative path to adjust the first-order derivative path upwardly, and a greater positive offset cancellation action is applied to the unmodified DC path to adjust the DC path upwardly (because the residual equalizer offset is negative). It should be noted that, in particular embodiments, the boundary value may be identified, the comparison of data values may be made, and an offset cancellation action may be taken by comparing the boundary value and data values to pre-defined patterns (that correspond to particular offset cancellation actions).

It should also be noted that, in particular embodiments, steps 4520-4610 may be performed by offset controller 106, and DC offset cancellation actions may be applied using, for example, variable gain amplifiers 116. It should further be noted that, although the relationship between the data values 0.5 and 1.5 bits before the boundary value is used to determine to what set of paths to apply the offset compensation, the relationship between or among any suitable data values may be used (e.g., taking into account the data value 2.5 bits before the boundary value). It should also be noted that method 4500 may be generalized to apply to equalizers associated with any suitable number of signal paths.

FIG. 38 is a table 4700 illustrating an example offset control scheme associated with the method 4500 of FIG. 37. Each row 4702 corresponds to a particular pattern of values for which a particular offset canceller action is performed (to both the first-order derivative and DC paths). Column 4710 includes a high or low value ("1" or "0") for each of a series of sampled data and boundary values. Column "D0" includes a zeroeth sampled data value of an output signal, column "D1" includes a first sampled data value of the output signal, column "D2" includes a second sampled data value of the output signal, and column "E1" includes the boundary value between the first and second data values. These values are similar to those illustrated in FIGS. 23A-23C. As can be observed, a transition occurs between data values in columns "D1" and "D2" in each pattern.

It should be noted that the pattern of values in each row 4702 may be sampled by sampler 104 and sent to offset controller 106. Alternatively, offset controller 106 may receive only sampled data values and other phase information, and particular boundary values (including, for example, boundary values in column E1) may be derived from the data values and phase information (and may not be sampled by sampler 104).

Column 4712 includes alternative boundary values at column "E1" for each row 4702. Column 4714 includes, for particular patterns, particular residual DC offset levels and DC offset cancellation actions associated with the unmodified DC path of the input signal. The DC offset cancellation actions may be applied as discussed above in method 4500. Column 4716 includes, for particular patterns, particular residual DC offset levels and DC offset cancellation actions associated with the first-order derivative path of the input signal. The DC offset cancellation actions may be applied as discussed above in method 4500.

Figure 39B:
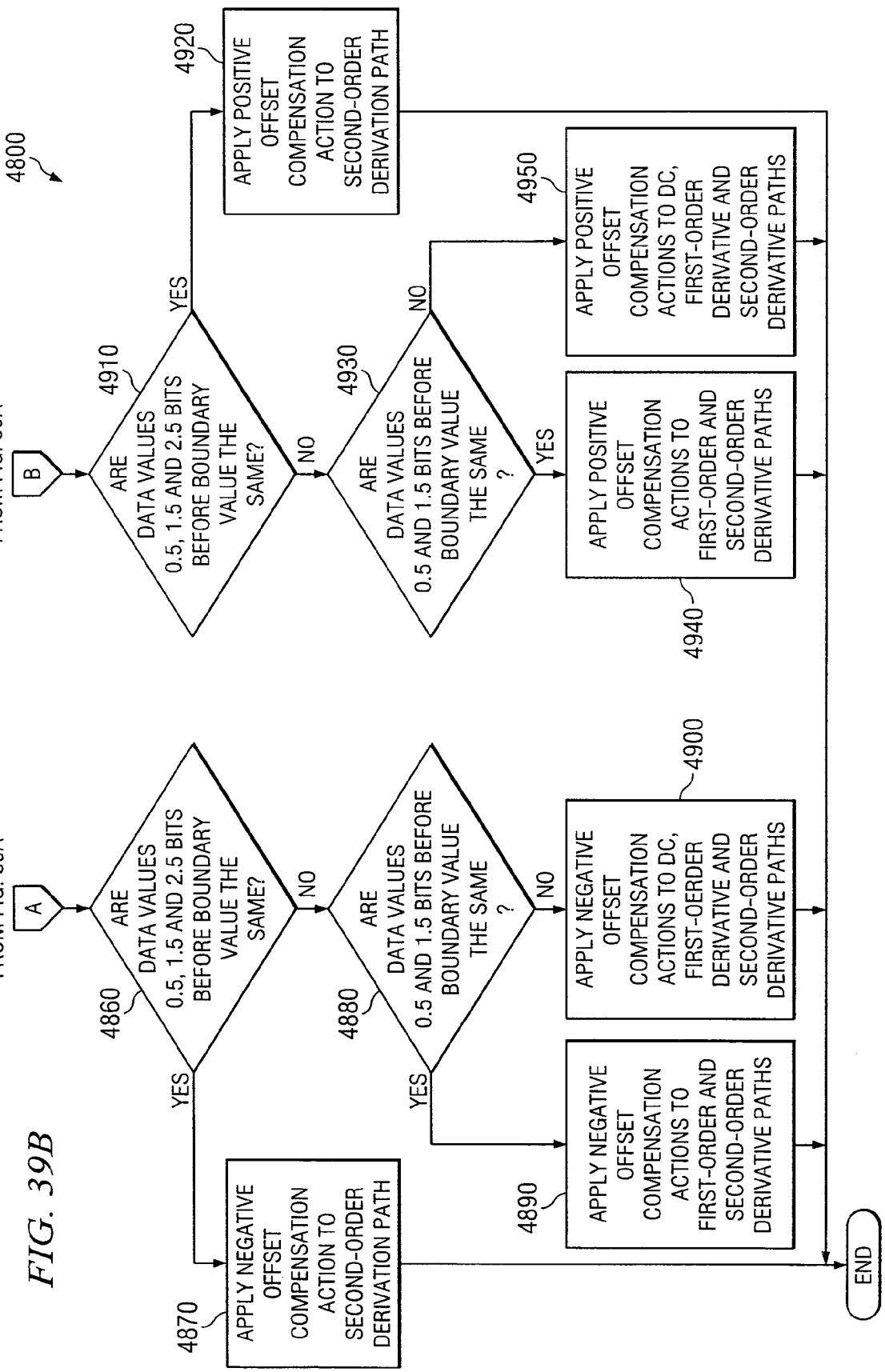
FIG. 39 is a flowchart illustrating an example method for canceling residual DC offset in a second-order derivative analog equalizer according to a particular embodiment of the invention.

FIG. 39 is a flowchart illustrating an example method 4800 for canceling residual DC offset in a second-order derivative analog equalizer according to a particular embodiment of the invention. Method 4800 may, under certain conditions, apply offset cancellation actions to one or more of the DC, first-order, and second-order derivative paths of the second-order derivative analog equalizer to cancel residual offset in the paths. Method 4800 may do so by applying offset cancellation actions to only the second-order derivative path when three successive data values having the same high or low value are observed before a transition. Method 4800 may apply offset cancellation actions to both the first-order and second-order derivative paths when two successive data values having the same high or low value are observed before a transition. When two data values having opposite high or low values are observed before a transition, method 4800 may apply offset cancellation actions to all three paths. By applying offset cancellation actions in such a manner, method 4800 may correct for residual offset in each signal path, even if the residual offsets of the three paths cancel each other out.

Method 4800 begins at step 4810, where an output signal is sampled using a clock signal. Because steps 4810-4850 may be the same as steps 3610-3650, respectively, steps 4810-4850 will not be described. After a determination is made at step 4850 whether the boundary value is high (i.e., equal to "1"), method 4800 proceeds to step 4860 if the boundary value is high or to step 4910 if the boundary value is low (i.e., equal to "0").

At step 4860, a determination is made whether the data values 0.5, 1.5, and 2.5 bits before the boundary value are the same. If the values are the same, method 4800 proceeds to step 4870, and a negative offset cancellation action is applied to adjust the second-order derivative path downwardly (because the residual second-order derivative path offset is positive). If, at step 4860, a determination is made that the data values are not the same, method 4800 proceeds to step 4880. It should be noted that, in particular embodiments, the boundary value may be identified, the comparison of data values may be made, and an offset cancellation action may be taken by comparing the boundary value and data values to pre-defined patterns (that correspond to particular offset cancellation actions).

At step 4880, a determination is made whether the data values 0.5 and 1.5 bits before the boundary value are the same. Method 4800 proceeds to step 4890 if the values are the same or to step 4900 if the values are different. At step 4890, a negative offset cancellation action is applied to each of the first-order and second-order derivative paths to adjust each of the first-order and second-order derivative paths downwardly (because the residual first-order and/or second-order derivative path offset is positive). At step 4900, if the data values 0.5 and 1.5 bits before the boundary value are different, a negative offset cancellation action is applied to each of the three paths to adjust each of the three paths downwardly (because the residual equalizer offset is positive). It should be noted that, in particular embodiments, the boundary value may be identified, the comparison of data values may be made, and an offset cancellation action may be taken by comparing the boundary value and data values to pre-defined patterns (that correspond to particular offset cancellation actions).

If a determination is made at step 4850 that the boundary value is low, method 4800 proceeds to step 4910. At step 4910, a determination is made whether the data values 0.5, 1.5, and 2.5 bits before the boundary value are the same. If the values are the same, method 4800 proceeds to step 4920, and a positive offset cancellation action is applied to the second-order derivative path to adjust the signal upwardly (because the residual second-order derivative path offset is negative). If, at step 4910, a determination is made that the data values are not the same, method 4800 proceeds to step 4930. It should be noted that, in particular embodiments, the boundary value may be identified, the comparison of data values may be made, and an offset cancellation action may be taken by comparing the boundary value and data values to pre-defined patterns (that correspond to particular offset cancellation actions).

At step 4930, a determination is made whether the data values 0.5 and 1.5 bits before the boundary value are the same. If these values are the same, method 4800 proceeds to step 4940. If these values are different, method 4800 proceeds to step 4950. At step 4940, a positive offset cancellation action is applied to each of the first-order and second-order derivative paths to adjust each of the first-order and second-order derivative paths upwardly (because the residual first-order and/or second-order derivative path offset is negative). At step 4950, if the data values 0.5 and 1.5 bits before the boundary value are different, a positive offset cancellation action is applied to each of the three paths to adjust each of the three paths upwardly (because the residual equalizer offset is negative). It should be noted that, in particular embodiments, the boundary value may be identified, the comparison of data values may be made, and an offset cancellation action may be taken by comparing the boundary value and data values to pre-defined patterns (that correspond to particular offset cancellation actions).

It should also be noted that, in particular embodiments, steps 4820-4950 may be performed by offset controller 106, and DC offset cancellation actions may be applied using, for example, variable gain amplifiers 116. It should further be noted that, although the relationship among the data values 0.5, 1.5 and 2.5 bits before the boundary value is used to determine to what set of paths to apply the offset compensation, the relationship between or among any suitable data values may be used (e.g., taking into account the data value 3.5 bits before the boundary value). It should also be noted that method 4800 may be generalized to apply to equalizers associated with any suitable number of signal paths.

FIG. 40 is a table 5000 illustrating an example offset control scheme associated with the method 4800 of FIG. 39. Each row 5002 corresponds to a particular pattern of values for which a particular offset canceller action is performed (to a set of one or more of the DC, first-order derivative, and second-order derivative paths). Column 5010 includes a high or low value ("1" or "0") for each of a series of sampled data and boundary values. An "X" indicates that the value may be either a "0" or "1." Column "D0" includes a zeroeth sampled data value of an output signal, column "D1" includes a first sampled data value of the output signal, column "D2" includes a second sampled data value of the output signal, column "D3" includes a third sampled data value of the output signal, and column "E2" includes the boundary value between the second and third data values. These values are similar to those illustrated in FIGS. 23A-23C. As can be observed, a transition occurs between data values in columns "D2" and "D3" in each pattern.

It should be noted that the pattern of values in each row 5002 may be sampled by sampler 104 and sent to offset controller 106. Alternatively, offset controller 106 may receive only sampled data values and other phase information, and particular boundary values (including, for example, boundary values in column E2) may be derived from the data values and phase information (and may not be sampled by sampler 104).

Column 5012 includes alternative boundary values at column "E2" for each row 5002. Column 5014 includes, for particular patterns, particular residual DC offset levels and DC offset cancellation actions associated with the unmodified DC path of the input signal. The DC offset cancellation actions may be applied as discussed above in method 4800. Column 5016 includes, for particular patterns, particular residual DC offset levels and DC offset cancellation actions associated with the first-order derivative path of the input signal. The DC offset cancellation actions may be applied as discussed above in method 4800. Column 5018 includes, for particular patterns, particular residual DC offset levels and DC offset cancellation actions associated with the second-order derivative path of the input signal. The DC offset cancellation actions may be applied as discussed above in method 4800.

It should be noted that the embodiments illustrated in FIGS. 30-40 may be merged together in particular embodiments. For example, in particular embodiments, steps 4280 and 4310 in method 4200 may be replaced with steps 3680 and 3710 in method 3600, respectively. In other embodiments, methods 3600, 3900, 4200, or 4500 may be applied to the second-order derivative analog equalizer by applying the same offset compensation to the second-order derivative path as the first-order derivative path since it may be difficult to effectively distinguish residual offset of individual paths between the first-order and second-order derivative paths using method 4800 and independent offset controls for the first-order and second-order derivative paths may become out of control. In such embodiments, residual offset of the first-order and second-order derivative paths may not be completely cancelled, if they are in opposite polarity. However, in particular embodiments, binding them together may be more beneficial than letting them change randomly and become out of control due to ineffective detection of individual residual offset between the first-order and second-order derivative paths using method 4800.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

As discussed above in conjunction with FIG. 11, duty cycle distortion may affect the adaptive gain control for periodic or quasi-periodic data sequence. Duty cycle distortion may also affect the offset cancellation control for periodic or quasi-periodic data sequence. If the period of the data is an even number of data values, "even" or "odd" boundary values which dominate transitions in the data sequence may be heavily biased to "early" or "late" phases by duty cycle distortion. Because of the bias, equalizer compensation may also be biased, e.g., towards increasing or decreasing gain or offset in the signal, potentially making the adaptive gain control and offset control out of acceptable operating condition.

As discussed above in conjunction with FIGS. 12-22, particular patterns may be selected as filter patterns to reduce the negative effect of duty cycle distortion and provide consistent results among (quasi-) periodic signals. In particular embodiments, these filter patterns may be specific to particular (quasi-) periodic signals. As discussed above, one drawback of using filter patterns specific to particular (quasi-) periodic signals is their limited applicability. For example, these filter patterns may not be substantially equally distributed between even and odd data sequences in other (quasi-) periodic signals and thus may lead to unacceptable operating condition if used with these other (quasi-) periodic signals.

Another potential drawback of using filter patterns specific to a particular (quasi-) periodic signal is that these filter patterns may not be substantially equally distributed between even and odd sequences when re-sampling is used. Here, re-sampling refers to "vector re-sampling" which starts "vector sampling" periodically at a lesser rate than the bare channel speed, but each "re-sampled" vector refers to a segment of data and boundary values that are sampled continuously at the bare channel speed for the same length as the filter pattern. Note that "re-sampled" vectors may overlap with each other, if "re-sampling" period is shorter than the length of the filter pattern. When re-sampling is done in a period that is harmonic with (quasi-) periodic signal, patterns may arise at different probabilities than they would in the entire (quasi-) periodic signal.

Some methods to address these types of distortions have been discussed above in conjunction with FIGS. 17-22. For example, instead of being selected specifically for a particular (quasi-) periodic signal, filter patterns may be selected sequentially, randomly, or simultaneously from a static or dynamic list of useful filter patterns and used in a balanced manner. There are, however, other methods for reducing the negative effects of duty cycle distortion and/or re-sampling and (quasi-) periodic signal that may be alternatives to or used in conjunction with the filter pattern techniques discussed above.

FIG. 41 is a flowchart illustrating an example method 5100 for reducing the effects of duty-cycle distortion according to a particular embodiment of the invention. Method 5100 reduces the effects of duty-cycle distortion and/or re-sampling and (quasi-) periodic signal by monitoring and taking adaptive gain control actions and/or offset cancellation actions in a balanced manner between the even data sequence that starts with even data followed by odd data, even data, odd data, and so on, and odd data sequence that starts with odd data followed by even data, odd data, even data, and so on. Method 5100 may be used in conjunction with or as an alternative to the filter pattern techniques discussed above in conjunction with FIGS. 17-22.

Method 5100 begins at step 5110. At step 5110, a logic (for example, receiver logic 47) receives an incoming signal comprising even data and odd data in turn. The incoming signal may be a (quasi-) periodic signal in particular embodiments. The logic monitors the even data sequence that starts at even data (and not the odd data sequence that starts at odd data) for the condition to take a control action. In particular embodiments, the logic may monitor the even data sequence that starts at even data using one or more filter patterns. It should be noted that, although the even data sequence is monitored first in method 5100, in alternative embodiments, the odd data sequence may be monitored first.

At step 5120, a determination is made whether the condition to take a control action has been detected. Alternatively, a determination may be made whether a particular data pattern corresponding to a filter pattern has been detected. If the condition has not been detected, method 5100 returns to step 5110, and the logic continues to monitor the even data sequence that starts at even data for the condition. If the condition has been detected, method 5100 proceeds to step 5130. At step 5130, a first control action is taken. The first control action may be an adaptive gain control action and/or an offset cancellation action. The first control action may be based, for example, on a sampled boundary value and/or one or more data values, as described above in conjunction with FIGS. 5-10, 24-29, and 31-40 or using other suitable techniques such as conventional adaptive control algorithms including the Least-Mean-Square (LMS) algorithm, the Sign-Sign-Least-Mean-Square (SS-LMS) algorithm, and the Zero-Forcing (ZF) algorithm.

After the first control action is taken, method 5100 proceeds to step 5140. At step 5140, the logic monitors the odd data sequence that starts at odd data (and not the even data sequence that starts at even data) for the condition to take a control action. In particular embodiments, the logic may monitor the odd data sequence that starts at odd data using one or more filter patterns. At step 5150, a determination is made whether the condition to take a control action has been detected. Alternatively, a determination may be made whether a particular data pattern corresponding to a filter pattern has been detected. If the condition has not been detected, method 5100 returns to step 5140, and the logic continues to monitor the odd data sequence that starts at odd data for the condition. If the condition has been detected, method 5100 proceeds to step 5160. At step 5160, a second control action is taken. The second control action may be an adaptive gain control action and/or an offset cancellation action. The second control action may be based, for example, on a sampled boundary value and/or one or more data values, as described above in conjunction with FIGS. 5-10, 24-29, and 31-40 or using other suitable techniques such as conventional adaptive control algorithms including the Least-Mean-Square (LMS) algorithm, the Sign-Sign-Least-Mean-Square (SS-LMS) algorithm, and the Zero-Forcing (ZF) algorithm. After the second control action is taken, method 5100 returns to step 5110. By monitoring the even and odd data sequences in turn, method 5100 balances the "early" or "late" phase biases due to duty-cycle distortion and reduces the negative effect of duty-cycle distortion and/or re-sampling and (quasi-) periodic signal.

In particular embodiments, method 5100 may be used in conjunction with a randomizer technique to avoid phase locking to the cycle of the (quasi-) periodic signal, thereby avoiding other possible distortions. Randomizer techniques include, for example, method 2300's random filter pattern selection embodiment, discussed above, and methods 5300 and 5400, discussed below. Also, as discussed above, method 5100 may be used in conjunction with an adaptive gain control and/or an offset cancellation control and may be used as an alternative to or in conjunction with the filter pattern techniques discussed above.

FIG. 42 is a flowchart illustrating another example method 5200 for reducing the effects of duty-cycle distortion according to a particular embodiment of the invention. Method 5200 begins at step 5210. At step 5210, a logic (for example, receiver logic 47) receives an incoming signal comprising even and odd data in turn. The incoming signal may be (quasi-) periodic signal in particular embodiments. The logic randomly selects, at equal probability, either the even data sequence that starts with even data followed by odd data, even data, odd data, and so on or the odd data sequence that starts with odd data followed by even data, odd data, even data, and so on to monitor. In particular embodiments, the logic may, for example, generate a one-bit random number (e.g., a "1" or "0") and select either the even data sequence or the odd data sequence based on the value of the random number.

At step 5220, a determination is made whether the even or odd data sequence has been selected. This determination may be based, for example, on the value of the generated random number. If a determination is made that the even data sequence has been selected, method 5200 proceeds to step 5230. If a determination is made that the odd data sequence has been selected, method 5200 proceeds to step 5260.

If the even data sequence is selected, at step 5230, the logic monitors the even data sequence that starts at received even data (and not the odd data sequence that starts at received odd data) for the condition to take a control action. In particular embodiments, the logic may monitor the even data sequence that starts at even data using one or more filter patterns.

At step 5240, a determination is made whether the condition to take a control action has been detected. Alternatively, a determination may be made whether a particular data pattern corresponding to a filter pattern has been detected. If the condition has not been detected, method 5200 returns to step 5230, and the logic continues to monitor the even data sequence that starts at even data for the condition. If the condition has been detected, method 5200 proceeds to step 5250. At step 5250, a control action is taken. The control action may be an adaptive gain control action and/or an offset cancellation action. The control action may be based, for example, on a sampled boundary value and/or one or more data values, as described above in conjunction with FIGS. 5-10, 24-29, and 31-40 or using other suitable techniques such as conventional adaptive control algorithms including the Least-Mean-Square (LMS) algorithm, the Sign-Sign-Least-Mean-Square (SS-LMS) algorithm, and the Zero-Forcing (ZF) algorithm. After a control action is taken, method 5200 returns to step 5210.

If, at step 5220, the odd data sequence is selected, method 5200 proceeds to step 5260. At step 5260, the logic monitors the odd data sequence that starts at odd data (and not the even data sequence that starts at even data) for the condition to take a control action. In particular embodiments, the logic may monitor the odd data sequence that starts at odd data using one or more filter patterns.

At step 5270, a determination is made whether the condition to take a control action has been detected. Alternatively, a determination may be made whether a particular data pattern corresponding to a filter pattern has been detected. If the condition has not been detected, method 5200 returns to step 5260, and the logic continues to monitor the odd data sequence that starts at odd data for the condition. If the condition has been detected, method 5200 proceeds to step 5280. At step 5280, a control action is taken. The control action may be an adaptive gain control action and/or an offset cancellation action. The control action may be based, for example, on a sampled boundary value and/or one or more data values, as described above in conjunction with FIGS. 5-10, 24-29, and 31-40 or using other suitable techniques such as conventional adaptive control algorithms including the Least-Mean-Square (LMS) algorithm, the Sign-Sign-Least-Mean-Square (SS-LMS) algorithm, and the Zero-Forcing (ZF) algorithm. After a control action is taken, method 5200 returns to step 5210.

By selecting in a random manner at equal probability one of the data sequences that start with even or odd data to monitor, method 5200 may balance the "early" or "late" phase biases due to duty-cycle distortion and reduce the negative effect of duty-cycle distortion and/or re-sampling and (quasi-) periodic signal, especially in the long-term. In the short term, however, method 5200 may be less effective than method 5100 at reducing the negative effect of duty-cycle distortion and/or re-sampling and (quasi-) periodic signal (e.g., because the same even or odd data sequence may be consecutively selected at random using method 5200). However, an advantage of method 5200 over method 5100 is that method 5200's random selection of data sequences avoids phase locking to the cycle of the (quasi-) periodic signal, thereby reducing other possible distortions. It should be noted that method 5200 may be used in conjunction with an adaptive gain control and/or an offset cancellation control. In addition, method 5200 may be used as an alternative to or in conjunction with the filter pattern techniques discussed above.

It should be noted that, in addition to the adaptive gain control and/or the offset cancel control based on a sampled boundary value and/or one or more data values, as described above in conjunction with FIGS. 5-10, 24-29, and 31-40, methods 5100 and 5200 may be applied to any other suitable control system that utilizes sampler output in order to reduce the negative effects of duty-cycle distortion and/or re-sampling and (quasi-) periodic signal. For example, in particular embodiments, these methods may be applied to conventional adaptive equalizer control based on conventional algorithms such as the Least-Mean-Square (LMS) algorithm, the Sign-Sign-Least-Mean-Square (SS-LMS) algorithm, and the Zero-Forcing (ZF) algorithm. In particular embodiments, these methods may also be applied to the Clock and Data Recovery (CDR) system that adjusts the recovered clock for the sampler based on the sampler output.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

As discussed above, re-sampling here refers to "vector re-sampling" that starts "vector sampling" periodically at a lesser rate than the bare channel speed, but each "re-sampled" vector refers to a segment of data and boundary values that are sampled continuously at the bare channel speed for the same length as the filter pattern. Because the period of re-sampling may be locked with the period of the (quasi-) periodic signal being re-sampled, the data patterns observed in re-sampled data may be different than the data patterns in the entire (quasi-) periodic signal. For example, if re-sampling is performed at a rate of 1/32 for a periodic signal with a period of three hundred and twenty bits, the periodic signal will be repeatedly re-sampled at the same ten points in each period and will never be re-sampled at the other three hundred and ten points. Sampling at only a portion of the total points in the (quasi-) periodic signal may skew the control actions performed by the equalizer.

A solution to counter the locking of the re-sampling period with the period of the (quasi-) periodic signal is to vary the point at which the (quasi-) periodic signal is re-sampled in each re-sampling cycle. For example, if re-sampling is done at a rate of 1/32, the re-sampling cycle is thirty-two bits and there are thirty-two possible points to re-sample the (quasi-) periodic signal in each re-sampling cycle. The point at which re-sampling occurs may be selected to vary for each thirty-two bit re-sampling cycle.

It should be noted that re-sampling in a re-sampling cycle may comprise, for example, sampling a plurality of data bits before, after, or around a particular point in the cycle. For example, if a re-sampling rate of 1/32 is used and a re-sampling comprises sampling six bits, the six bits may be sampled before, after, or around a particular point in each thirty-two bit cycle. Example methods for varying the point at which re-sampling occurs in each re-sampling cycle are discussed below in conjunction with FIGS. 43-45.

An alternative solution to counter the locking of the re-sampling period with the period of the (quasi-) periodic signal is to randomly select the next point at which the (quasi-) periodic signal is re-sampled without being limited to set re-sampling cycles. For example, after a first point is randomly selected and sampled, a next point may be randomly selected and sampled, and so on, without each point necessarily being bounded within a re-sampling cycle. In particular embodiments, a pseudo-random number generator may be used, and the pseudo-random number generator may be weighted in any suitable manner such that an average re-sampling rate is produced. For example, in particular embodiments, the pseudo-random number generator may be capped such that the next randomly selected point may not be beyond a certain number of bits from the previous point. In such embodiments, the cap may act to define an average re-sampling rate. In alternative embodiments, the next point may be selected under various restrictions such that the re-sampling rate is always less than a certain maximum re-sampling rate.

A further alternative solution to counter the locking of re-sampling period with the period of the (quasi-) periodic signal is to take control actions randomly at certain fixed or variable probability based on random number generated for each sampling point instead of randomly selecting re-sampling point or re-sampling period of re-sampling cycle. In particular embodiments, a pseudo-random number generator may be used, and a sample may be taken only when the generated pseudo-random number drops within a certain range. The probability to take a control action may be fixed or variable. In particular embodiments, once a sample is taken, a variable probability may be set to zero for a certain period or until a certain point of time in order to restrict the maximum re-sampling rate to be less than a certain value. In other embodiments, while a sample is not taken, a variable probability may be gradually increased as time passes, and reset to zero or a fixed small value once a control action takes place in order to restrict the average sampling rate and/or the minimum sampling rate to be more than a certain value.

FIG. 43 is a flowchart illustrating an example method 5300 for varying the point at which re-sampling occurs in each re-sampling cycle according to a particular embodiment of the invention. Method 5300 varies the re-sampling point by selecting the point randomly, typically at equal probability, for each re-sampling cycle. Method 5300 begins at step 5310, where a re-sampling point is selected randomly for a re-sampling cycle. The re-sampling point may be randomly selected using, for example, a pseudo-random number generator. If re-sampling is done at a rate of 1/32, for example, the randomly selected re-sampling point may be any one of the thirty-two points in the re-sampling cycle.

At step 5320, the signal is sampled at the selected re-sampling point. As discussed above, sampling at a selected re-sampling point may comprise sampling a plurality of data bits before, after, or around the selected point. For example, in particular embodiments, six bits may be sampled, and the first bit may correspond to the selected point. It should be noted that sampling at the selected re-sampling point may or may not effectuate a control action. For example, a control action may be effectuated if a transition occurs in the sampling, and a control action may not be effectuated if a transition does not occur in the sampling. As another example, in particular embodiments where filter patterns are used, if an appropriate filter pattern is not observed in the sampling, a control action may not be taken. If a filter pattern is observed in the sampling, a control action may be taken. After the signal is sampled at the selected re-sampling point in the cycle, method 5300 returns to step 5310, and a new re-sampling point is randomly selected for the next cycle. In this way, any locking of the re-sampling period with the period of the (quasi-) periodic signal may be avoided.

FIG. 44 is a flowchart illustrating another example method 5400 for varying the point at which re-sampling occurs in each re-sampling cycle according to a particular embodiment of the invention. Method 5400 varies the re-sampling point by selecting the point randomly, typically at equal probability, for a re-sampling cycle following one where a control action has been taken. Method 5400 begins at step 5410, where a re-sampling point is selected randomly for a re-sampling cycle. The re-sampling point may be randomly selected using, for example, a pseudo-random number generator. If re-sampling is done at a rate of 1/32, for example, the randomly selected re-sampling point may be any one of the thirty-two points in the re-sampling cycle.

At step 5420, the signal is sampled at the selected re-sampling point. As discussed above, sampling at a selected re-sampling point may comprise sampling a plurality of data bits before, after, or around the selected point. Sampling at the selected re-sampling point may or may not effectuate a control action. For example, a control action may be effectuated if a transition occurs in the sampling, and a control action may not be effectuated if a transition does not occur in the sampling. As another example, in particular embodiments where filter patterns are used, if an appropriate filter pattern is not observed in the sampling, a control action may not be taken. If a filter pattern is observed in the sampling, a control action may be taken.

At step 5430, a determination is made whether a control action has been taken. If not, method 5400 returns to step 5420, and the signal is sampled at the selected re-sampling point in the next cycle. If a determination is made at step 5430 that a control action has been taken (in the first or a subsequent re-sampling cycle), method 5400 returns to step 5410, and a new re-sampling point is randomly selected. In this way, any locking of the re-sampling period with the period of the (quasi-) periodic signal may be avoided.

It should be noted that, in particular embodiments, control actions may be taken at different times for gain control and offset cancellation. Taking control actions at different times may lead to different rates of selecting re-sampling points for gain control and offset cancellation. In particular embodiments, a selected re-sampling point may be reset for both gain control and offset cancellation when either the gain or offset is adjusted.

FIG. 45 is a flowchart illustrating yet another example method 5500 for varying the point at which re-sampling occurs in each re-sampling cycle according to a particular embodiment of the invention. Method 5500 varies the re-sampling point by sequentially cycling through a list of re-sampling points for a re-sampling cycle following one where a control action has been taken. Method 5500 begins at step 5510, where the next re-sampling point in the list is selected for a re-sampling cycle. Note that the list of re-sampling points is not necessarily in order. For example, if re-sampling is done at a rate of 1/32 and the previous re-sampling point was at point thirteen in the re-sampling cycle, the next re-sampling point may be selected at point four in the re-sampling cycle at step 5510.

At step 5520, the signal is sampled at the selected re-sampling point. As discussed above, sampling at a selected re-sampling point may comprise sampling a plurality of data bits before, after, or around the selected point. Sampling at the selected re-sampling point may or may not effectuate a control action. For example, a control action may be effectuated if a transition occurs in the sampling, and a control action may not be effectuated if a transition does not occur in the sampling. As another example, in particular embodiments where filter patterns are used, if an appropriate filter pattern is not observed in the sampling, a control action may not be taken. If a filter pattern is observed in the sampling, a control action may be taken.

At step 5530, a determination is made whether a control action has been taken. If not, method 5500 returns to step 5520, and the signal is sampled at the selected re-sampling point in the next cycle. If a determination is made at step 5530 that a control action has been taken (in the first or a subsequent re-sampling cycle), method 5500 returns to step 5510, and the next re-sampling point is selected. Cycling through a list of re-sampling points may introduce another level of locking of the entire period to go through the list of re-sampling points with the period of the (quasi-) periodic signal. However, since the entire period to go through the list is much longer than the re-sampling period, it may effectively reduce the possibilities of locking of re-sampling with the period of the (quasi-) periodic signal.

It should be noted that, in particular embodiments, control actions may be taken at different times for gain control and offset cancellation. Taking control actions at different times may lead to different rates of selecting re-sampling points for gain control and offset cancellation. In particular embodiments, a selected re-sampling point may be reset for both gain control and offset cancellation when either the gain or offset is adjusted.

It should also be noted that method 5100 includes a particular embodiment of method 5500, where re-sampling is done at a rate of 1/2, and method 5200 includes a particular embodiment of method 5400, where re-sampling is done at a rate of 1/2.

It should further be noted that, in particular embodiments, methods 5300, 5400, and 5500 may be combined together in various forms. For example, if re-sampling is done at a rate of 1/32, thirty-two possible re-sampling points may be hierarchically divided into eight groups of four re-sampling points. In a particular embodiment, one of eight possible groups of re-sampling points may be selected using method 5300, and one of four possible re-sampling points within each group may be selected using method 5400.

It should further be noted that, in addition to the adaptive gain control and/or the offset cancel control based on a sampled boundary value and/or one or more data values, as described above in conjunction with FIGS. 5-10, 24-29, and 31-40, in particular embodiments, methods 5300, 5400 and 5500 may be applied to any other suitable control system that utilizes sampler output in order to avoid or reduce locking of re-sampling with (quasi-) periodic signal. For example, in particular embodiments, these methods may be applied to conventional adaptive equalizer control based on conventional algorithms such as the Least-Mean-Square (LMS) algorithm, the Sign-Sign-Least-Mean-Square (SS-LMS) algorithm, and the Zero-Forcing (ZF) algorithm. In particular embodiments, these methods may also be applied to the Clock and Data Recovery (CDR) system that adjusts the recovered clock for the sampler based on the sampler output.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

As discussed above, an equalizer may use two or more control loops concurrently to equalize a signal. For example, an equalizer may use an adaptive equalizer control to adjust gain and reduce residual inter-symbol interference. The equalizer may also concurrently use an offset canceller to adjust offset and cancel residual offset.

One challenge arising from using multiple control loops concurrently is the potential coupling between the multiple control loops. Coupling between the multiple control loops may delay convergence time or may even make the control loops unstable. For example, if gain is optimal but residual offset is suboptimal, boundary values are likely to be biased to either high or low values (e.g., high values if residual offset is positive and low values if residual offset is negative). The equalizer gain control may misinterpret the biased boundary values and/or other information as over- or under-compensated situations. If the counts of high and low data values for the equalizer gain control are not balanced, the misinterpretations for over- or under-compensated situations may be unbalanced, shifting the equalizer gain from optimal to suboptimal. In a similar manner, residual offset may shift from optimal to suboptimal if gain is suboptimal.

In particular embodiments, multiple control loops may be decoupled by making the loops insensitive to each other. For example, the adaptive equalizer control may be made insensitive to residual offset, and the offset canceller may be made insensitive to residual inter-symbol interference. To make the adaptive equalizer control and offset canceller insensitive to each other, in particular embodiments, two sets of complement data patterns may be used in a balanced manner by the adaptive equalizer control and the offset canceller. Complement data patterns may comprise, for example, those data patterns having data values of different values (e.g., "0" or "1") at particular bits in the patterns.

For example, where a control action is based on a comparison of a boundary value between successive data values that comprise a transition and the data value 1.5 bits before the boundary value, the adaptive equalizer control and the offset canceller may balance the number of control actions taken when the data value 1.5 bits before the boundary value is high or low. In particular embodiments, the adaptive equalizer control and the offset canceller may do so by alternating use of filter patterns having a high or low data value immediately before the data values comprising a transition in the filter pattern. In this manner, the adaptive equalizer control may be made insensitive (or less sensitive) to residual offset, and the offset canceller may be made insensitive (or less sensitive) to residual inter-symbol interference, thereby decoupling the control loops. Particular embodiments decoupling the control loops are described further below in conjunction with FIGS. 46 and 47.

FIG. 46 is a flowchart illustrating an example method 5600 for decoupling multiple control loops according to a particular embodiment of the invention. Method 5600 may decouple, for example, the adaptive equalizer control and the offset canceller by using two sets of complement data patterns in a balanced manner. Method 5600 may use the two sets of complement data patterns in a balanced manner by alternating between watching an incoming signal for one set and taking a control action based on the one set and then watching an incoming signal for the other set and taking a control action based on the other set. Where, for example, a control action is based on a comparison of a boundary value between successive data values comprising a transition and the data value 1.5 bits before the boundary value, the first set of data patterns may include those with a high data value 1.5 bits before the boundary value (i.e., those with a high data value immediately before the data values comprising the transition), and the second set of data patterns may include those with a low data value 1.5 bits before the boundary value (or vice versa).

Method 5600 begins at step 5610, where a logic, such as, for example, receiver logic 47, monitors an incoming signal for a first set of data patterns. For example, the logic may monitor the incoming signal for successive data values comprising a transition, where the data value immediately before the successive data values comprises a low value. In particular embodiments, the logic may use a filter pattern for such monitoring. Suitable filter patterns may include, for example, particular patterns illustrated and described above in conjunction with FIGS. 6, 8, 10, 14, 16, 32, 34, 36, 38, and 40. At step 5620, if a data pattern in the first set of data patterns is detected, method 5600 proceeds to step 5630. If a data pattern in the first set of data patterns is not detected, method 5600 returns to step 5610, and the logic continues to monitor the incoming signal for the first set of data patterns.

At step 5630, after a data pattern in the first set of data patterns is detected, a suitable control action is taken. In particular embodiments, the control action may be based, for example, on a comparison of the boundary value between successive data values comprising a transition and the data value 1.5 bits before the boundary value. The control action may be an adaptive equalizer action and/or an offset cancellation action. The control action may also be based on a conventional adaptive control algorithm in particular embodiments. After the control action is taken, method 5600 proceeds to step 5640.

At step 5640, the logic monitors the incoming signal for a second set of data patterns. For example, the logic may monitor the incoming signal for successive data values comprising a transition, where the data value immediately before the successive data values comprises a high value. In particular embodiments, the logic may use a filter pattern for such monitoring. Suitable filter patterns may include, for example, particular patterns illustrated and described above in conjunction with FIGS. 6, 8, 10, 14, 16, 32, 34, 36, 38, and 40. At step 5650, if a data pattern in the second set of data patterns is detected, method 5600 proceeds to step 5660. If a data pattern in the second set of data patterns is not detected, method 5600 returns to step 5640, and the logic continues to monitor the incoming signal for the second set of data patterns.

At step 5660, after a data pattern in the second set of data patterns is detected, a suitable control action is taken. In particular embodiments, the control action may be based, for example, on a comparison of the boundary value between successive data values comprising a transition and the data value 1.5 bits before the boundary value. The control action may be an adaptive equalizer action and/or an offset cancellation action. The control action may also be based on a conventional adaptive control algorithm in particular embodiments. After the control action is taken, method 5600 returns to step 5610. By using two sets of complement data patterns in a balanced manner, method 5600 may decouple the adaptive equalizer control and the offset canceller. It should be noted that, to avoid having the alternating cycle using the two sets of data patterns lock with the period of a (quasi-) periodic signal, a randomized balancer may concurrently be used (see, e.g., methods 5300 and 5400 above).

Figure 47:
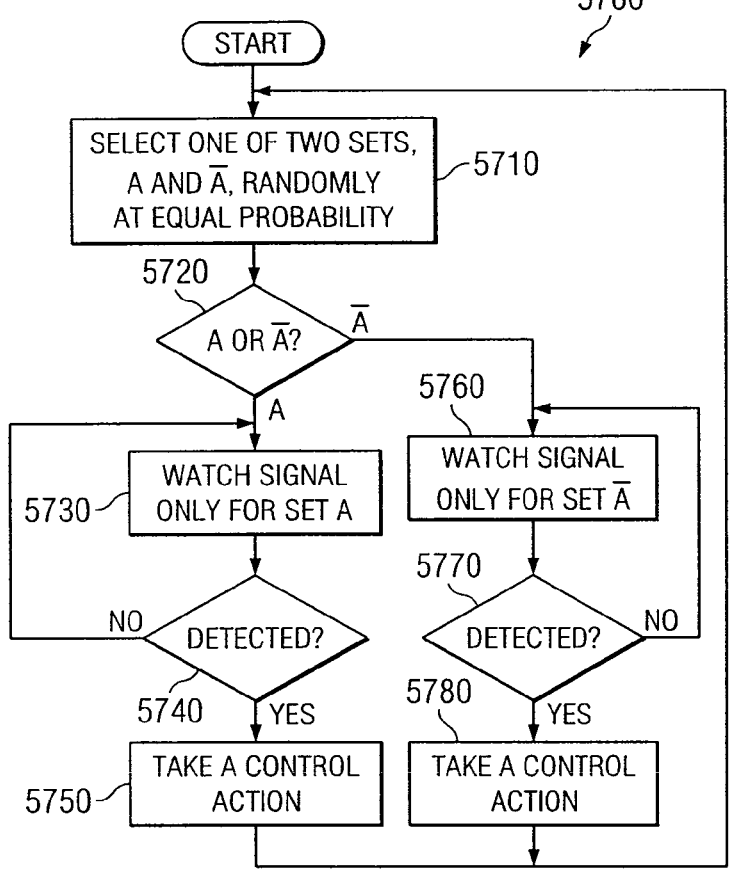
FIG. 47 is a flowchart illustrating another example method for decoupling multiple control loops according a particular embodiment of the invention.

FIG. 47 is a flowchart illustrating another example method 5700 for decoupling multiple control loops according to a particular embodiment of the invention. Method 5700 may decouple, for example, the adaptive equalizer control and the offset canceller by using two sets of complement data patterns in a balanced manner. Method 5700 may use the two sets of complement data patterns in a balanced manner by selecting one of the two sets randomly at equal probability, watching the incoming signal for the selected set, taking a control action based on the selected set, and then again selecting one of the two sets randomly at equal probability. Where, for example, a control action is based on a comparison of a boundary value between successive data values comprising a transition and the data value 1.5 bits before the boundary value, the first set of data patterns may include those with a high data value 1.5 bits before the boundary value (i.e., those with a high data value immediately before the data values comprising the transition), and the second set of data patterns may include those with a low data value 1.5 bits before the boundary value (or vice versa).

Method 5700 begins at step 5710, where a logic, such as, for example, receiver logic 47, selects one of two sets of complement data patterns randomly, typically at equal probability. The logic may select one of the two sets randomly by using, for example, a pseudo random number generator and associating one of the generated numbers with one set and the other generated number with the other set. After selecting one of the two sets of complement data patterns, method 5700 proceeds to step 5720.

At step 5720, if the selected set of data patterns is the first set (e.g., data patterns comprising a low data value immediately before the data values comprising the transition), method 5700 proceeds to step 5730. If the selected set of data patterns is the second set (e.g., data patterns comprising a high data value immediately before the data values comprising the transition), method 5700 proceeds to step 5760.

At step 5730, the logic monitors an incoming signal for the first set of data patterns. For example, the logic may monitor the incoming signal for successive data values comprising a transition, where the data value immediately before the successive data values comprises a low value. In particular embodiments, the logic may use a filter pattern for such monitoring. Suitable filter patterns may include, for example, particular patterns illustrated and described above in conjunction with FIGS. 6, 8, 10, 14, 16, 32, 34, 36, 38, and 40.

At step 5740, if a data pattern in the first set of data patterns is detected, method 5700 proceeds to step 5750. If a data pattern in the first set of data patterns is not detected, method 5700 returns to step 5730, and the logic continues to monitor the incoming signal for the first set of data patterns. At step 5750, after a data pattern in the first set of data patterns is detected, a suitable control action is taken. In particular embodiments, the control action may be based, for example, on a comparison of the boundary value between successive data values comprising a transition and the data value 1.5 bits before the boundary value. The control action may be an adaptive equalizer action and/or an offset cancellation action. The control action may also be based on a conventional adaptive control algorithm in particular embodiments. After the control action is taken, method 5700 returns to step 5710, and one of the two sets of complement data patterns is selected randomly.

If, at steps 5710 and 5720, the selected set of data patterns is the second set (e.g., data patterns comprising a high data value immediately before the data values comprising the transition), method 5700 proceeds to step 5760. At step 5760, the logic monitors the incoming signal for the second set of data patterns. For example, the logic may monitor the incoming signal for successive data values comprising a transition, where the data value immediately before the successive data values comprises a high value. In particular embodiments, the equalizer may use a filter pattern for such monitoring. Suitable filter patterns may include, for example, particular patterns illustrated and described above in conjunction with FIGS. 6, 8, 10, 14, 16, 32, 34, 36, 38, and 40.

At step 5770, if a data pattern in the second set of data patterns is detected, method 5700 proceeds to step 5780. If a data pattern in the second set of data patterns is not detected, method 5700 returns to step 5760, and the incoming signal continues to be monitored for the second set of data patterns. At step 5780, after a data pattern in the second set of data patterns is detected, a suitable control action is taken. In particular embodiments, the control action may be based, for example, on a comparison of the boundary value between successive data values comprising a transition and the data value 1.5 bits before the boundary value. The control action may be an adaptive equalizer action and/or an offset cancellation action. After the control action is taken, method 5700 returns to step 5710, and one of the two sets of complement data patterns is selected randomly. By using two sets of complement data patterns in a balanced manner, method 5700 may decouple the adaptive equalizer control and the offset canceller.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

As discussed above, a logic, such as, for example, receiver logic 47, may, after detecting particular data and boundary values, adjust the gain and/or offset applied to an incoming signal. In particular embodiments, the gain and/or offset may be adjusted with a bang-bang control scheme.

In the bang-bang control scheme, a control variable (e.g. gain or offset) is adjusted based on a binary objective variable (e.g. binary forms of ISI level, EQ level, or residual offset in the above description, or a binary form of residual amplitude error in an Automatic Gain Control (AGC) system) that takes one of two states, "high" or "low", where the "high" state of the objective variable may be due to a "high" value of the control variable, and the "low" state of the objective variable may be due to a "low" value of the control variable. In such circumstances, if the objective variable indicates the "high" state, the control variable may be decreased, and if the objective variable indicates "low" state, the control variable may be increased.

In a conventional bang-bang control system (e.g., an Automatic Gain Control (AGC) system), the control variable (e.g. amplifier gain) is updated in a symmetric way such that an increase in the control variable is of the same magnitude as a decrease in the control variable because the binary objective variable (e.g. a binary form of residual amplitude error) carries only qualitative information. Thus, when the same number of increases and decreases are applied to the control variable, the control variable stays at the same level in average, and the control system reaches the equilibrium state. It should be noted that if the binary objective variable is assigned numeric values, for example, "+1" and "−1" corresponding to "high" and "low" states (in the same way as the ISI level described above in conjunction with FIG. 6), the average of the binary objective variable converges to zero at equilibrium state in a conventional bang-bang control system.

The binary objective variable having zero average at equilibrium state may be desirable in particular systems (e.g. an AGC system). For instance, if the binary objective variable (e.g. a binary form of residual amplitude error) is derived from an output of the comparator which directly compares an analog objective variable (e.g. amplitude of amplifier output)

with control target (e.g. target level of amplitude), the optimal average of the binary objective variable at equilibrium state may be naturally zero, because the comparator is expected to produce the same number of "+1" and "−1" outputs, when the analog objective variable is closest to the control target. Such situation is quite common in applications of the conventional bang-bang control scheme, and thus, the conventional bang-bang control scheme simply uses symmetric update on the control variable.

On the other hand, the binary objective variable having zero average at equilibrium state may not be necessarily optimal in particular systems. For example, the optimal average of the ISI level described above in conjunction with FIG. 6 may be greater or less than zero depending on various conditions, such as, for example, channel loss and the incoming signal itself. In particular embodiments, the optimal average ISI level may be high for a high loss channel and low for a low loss channel. Also, as an example only, the optimal average ISI level may vary from −0.6 to +0.5. For another example, the residual offset described above in conjunction with FIG. 25 may be statistically oriented toward either positive or negative in optimal condition depending on various systematic errors in residual offset measurement, such as, for example, non-cancelled offset in boundary sampler, but not in data sampler. Thus, a non-zero average of the binary objective variable at equilibrium state may be useful in particular circumstances.

In particular embodiments, the average of the binary objective variable (e.g. ISI level) at equilibrium state in a bang-bang control system may be made different than zero by introducing asymmetric update on the control variable as illustrated in the following set of equations. It should be noted, however, that the asymmetric bang-bang control scheme may be used with any suitable control variables (e.g., with offset control if the best residual offset is not zero) and in any suitable context (and not just the one described). In the equations below, $K_p$ and $K_n$ are control step values by which the control variable (e.g., equalizer gain) is increased and decreased, respectively, and $N_p$ and $N_n$ are the number of up and down actions to the control variable per unit time at equilibrium state, respectively, and A is the average of the binary objective variable at equilibrium state. Here, it is assumed that the binary objective variable takes "+1" or "−1" value, when the control variable is "high" or "low", respectively. It should be noted that $N_p$ and $N_n$ are also the number of the binary objective variable having "low" and "high" states per unit time, respectively. As can be observed, the product of $K_p$ and $N_p$ is equal to the product of $K_n$ and $N_n$ in the long term, as the control variable should not change at equilibrium state. It should also be noted that A can be made other than zero by differentiating $K_p$ and $K_n$. For example, in particular embodiments, A may be 0.2, when $K_p$ is 0.3 and $K_n$ is 0.2. It should be noted that A may have any value from −1 (when $K_p=0$ and $K_n>0$) to +1 (when $K_p>0$ and $K_n=0$). It should also be noted that A becomes zero when $K_p=K_n>0$ that is the case of the conventional bang-bang control scheme.

$$K_p \times N_p - K_n \times N_n = 0$$

$$N_n \div N_p = K_p \div K_n$$

$$A = \frac{N_n - N_p}{N_n + N_p} = \frac{K_p - K_n}{K_p + K_n}$$

Figure 48:
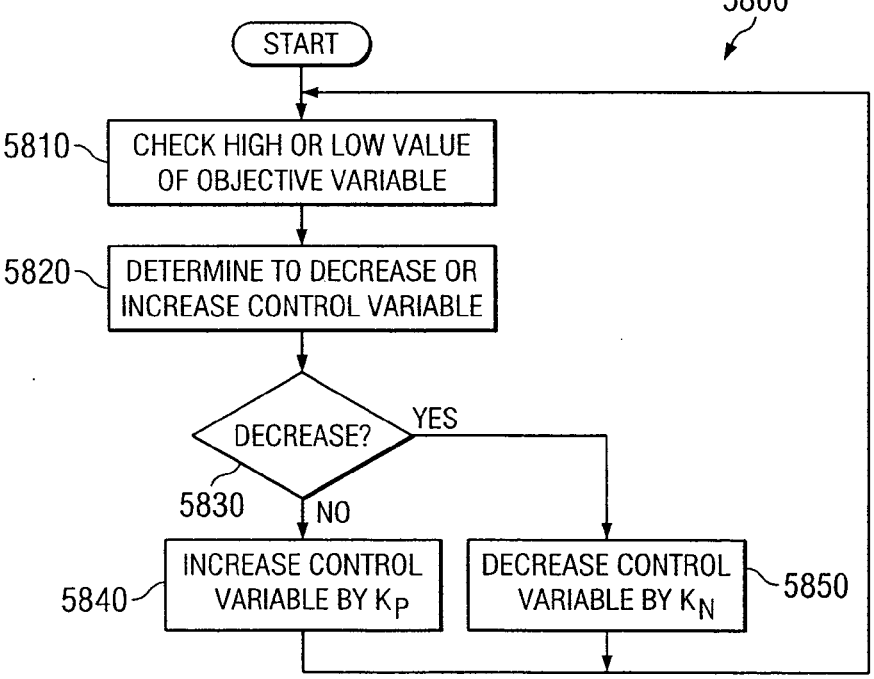
FIG. 48 is a flowchart illustrating an example method for generating a particular average of a binary objective variable (e.g., ISI level, EQ level, or residual offset) in an equilibrium state according to a particular embodiment of the invention.

FIG. 48 is a flowchart illustrating an example method 5800 for generating a particular average value of a binary objective variable (e.g., ISI level, EQ level, or residual offset) in an equilibrium state according to a particular embodiment of the invention. The method begins at step 5810, where objective variable is checked if it is high or low in any suitable manner using, for example, adaptive controller 102. For example, in particular embodiments, the ISI level may be checked if it is "+1" or "−1", or the EQ level may be checked if it is "high" or "low, by applying an inverted correlation function (or correlation function) or an XOR (or XNOR) operation to a boundary value between successive data values comprising a transition and the data value 1.5 bits before the boundary value. In alternative embodiments, it may be checked using filter patterns, such as, for example, particular ones of the patterns described above in conjunction with FIGS. 6, 8, 10, 14, and 16. For another example, the residual offset is checked if it is "positive" or "negative", using tables described above in conjunction with FIGS. 25, 27, 29, 32, 34, 36, 38, and 40.

A determination is then made at steps 5820 and 5830 whether the control variable (e.g., equalizer gain) should be decreased or increased based on the high or low value of the objective variable checked at step 5810. For example, in particular embodiments for equalizer gain control, if the ISI level is "−1" or the EQ level is "low" at step 5810, a determination is made to increase the equalizer gain, and the method proceeds to step 5840. If the ISI level is "+1" or the EQ level is "high" at step 5810, a determination is made to decrease the equalizer gain, and the method proceeds to step 5850. In alternative embodiments that use filter patterns, the particular filter patterns detected may determine whether the equalizer gain will be decreased or increased. As another example, in particular embodiments for equalizer offset control, if the residual offset is "negative" at step 5810, a determination is made to increase the equalizer offset, and the method proceeds to step 5840. If the residual offset is "positive" at step 5810, a determination is made to decrease the equalizer offset, and the method proceeds to step 5850. In alternative embodiments that use filter patterns, the particular filter patterns detected may determine whether the equalizer offset will be decreased or increased.

At step 5840, after determination has been made to increase the control variable, the control variable is increased by Kp. For example, in particular embodiments for equalizer gain control, the equalizer gain is increased by Kp. As another example, in particular embodiments for equalizer offset control, the equalizer offset is increased by Kp. After increasing the control variable, method 5800 returns to step 5810.

At step 5850, after determination has been made to decrease the control variable, the control variable is decreased by Kn. For example, in particular embodiments for equalizer gain control, the equalizer gain is decreased by Kn. As another example, in particular embodiments for equalizer offset control, the equalizer offset is decreased by Kn. After decreasing the control variable, method 5800 returns to step 5810.

Unlike in a conventional bang-bang control system, $K_p$ does not necessarily equal $K_n$. Instead, $K_p$ and $K_n$ may be differentiated based on the following set of equations using a parameter T that is the control target of the average of the binary objective variable at equilibrium state. Any suitable value from −1 to +1 may be selected for T (not necessarily zero), and in particular embodiments, the value of T may depend on various conditions related to, for example, the bit error rate and may correspond to an optimal target value under those conditions. In alternative embodiments, the value of T may be fixed. T may be associated with the ratio of or the difference between $K_p$ and $K_n$ in particular embodiments. For example, in particular embodiments, the control target value T may comprise a target ratio (fixed or variable) of frequencies detecting the objective variable in the second state and the first state.

In the following equations K is a common loop constant for both increases and decreases in the control variable, and defined as the arithmetic average of $K_p$ and $K_n$. As can be observed, when $K_p=K\times(1+T)$ and $K_n=K\times(1-T)$, the average of the binary objective variable, A, will converge to T at equilibrium state.

$$K_p = K \times (1+T)$$
$$K_n = K \times (1-T)$$
$$\frac{K_p + K_n}{2} = \frac{K \times (1+T) + K \times (1-T)}{2} = \frac{2K}{2} = K$$
$$A = \frac{K_p - K_n}{K_p + K_n} = \frac{K \times (1+T) - K \times (1-T)}{K \times (1+T) + K \times (1-T)} = \frac{2KT}{2K} = T$$

By using a control target T that need not be equal to zero, method 5800 may allow the average of the binary objective variable (e.g., ISI level, equalization level, residual offset, or other suitable objective variable) to converge to a point that corresponds more suitably to particular conditions. As discussed above, in particular embodiments, the control target T may be fixed. In alternative embodiments, the control target T may vary dynamically as a function of particular one or more variables.

Figure 49:
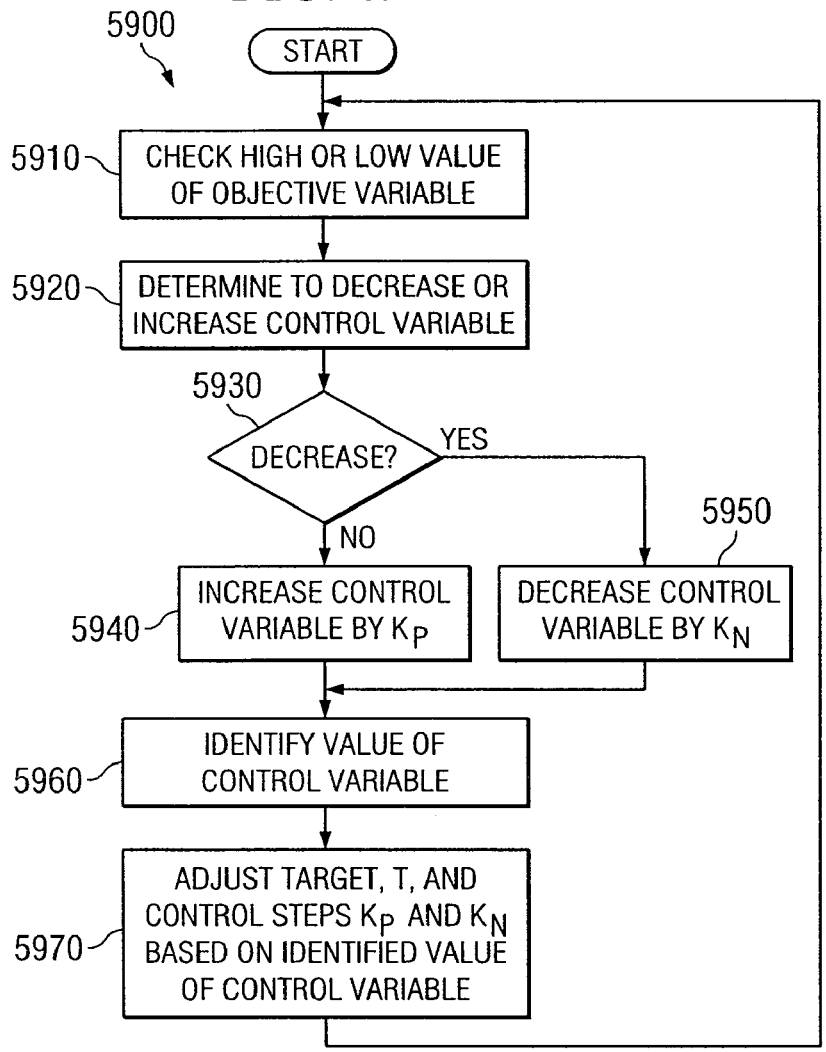
FIG. 49 is a flowchart illustrating an example method for dynamically generating a control target for an average value of a binary objective variable (e.g., ISI level) in an equilibrium state according to a particular embodiment of the invention.

FIG. 49 is a flowchart illustrating an example method 5900 for dynamically generating a control target for an average value of a binary objective variable (e.g., ISI level) in an equilibrium state according to a particular embodiment of the invention. As discussed above, in particular embodiments, the optimal average ISI level is likely to be high for a high loss channel and low for a low loss channel. Thus, a control target for the average of a binary objective variable (e.g., ISI level or other suitable equalization level) that dynamically varies with the value of the control variable (e.g., equalizer gain setting) may be advantageous in particular embodiments.

Method 5900 begins at step 5910, where objective variable is checked if it is high or low in any suitable manner using, for example, adaptive controller 102. Steps 5910-5950 may be the same as steps 5810-5850, described above, and thus will not be described again. After the control variable is increased by $K_p$ at step 5940 or decreased by $K_n$ at step 5950, method 5900 proceeds to step 5960. At step 5960, the value of the control variable (e.g. equalizer gain) is identified. At step 5970, the control target, T, for the average of the binary objective variable (e.g. ISI level or other suitable equalization level) and the control step values, $K_p$ and $K_n$, are adjusted based on the identified value of the control variable (e.g. equalizer gain).

For example, in particular embodiments, the control target T may be adjusted to vary with the control variable (e.g. equalizer gain) within a fixed range. As an example only, the control target T may be set to +0.4 when the value of the control variable is relatively high and may be set to –0.4 when the value of the control variable is relatively low. When the value of the control variable is between the relatively high and low values, the control target T may be set to an interpolated value between +0.4 and –0.4. In this way, $K_p$ and $K_n$ may be generated dynamically from the control variable (e.g. equalizer gain), thereby producing an optimal average of binary objective variable (e.g. ISI level), based on the bit error rate.

In particular embodiments, control target T may be dynamically calculated as a function of the current value of the control variable (e.g., equalizer gain code) using the following set of equations:

$$T(G) = T_H \times \frac{G}{G_C} + T_L \times \frac{G_C - G}{G_C} \quad \ldots \quad G < G_C$$
$$T(G) = T_H \quad \ldots \quad G \geq G_C$$

Here, G (e.g., 0~126) is the current value of the control variable (e.g. equalizer gain code, which indicates the amount of frequency compensation applied by the equalizer). Also, $T_H$ (e.g., –1.0~+1.0) is the value of T for relatively high value of the control variable, $T_L$ (e.g., –1.0~+1.0) is the value of T for relatively low value of the control variable, and $G_C$ (e.g., 0, 1, 2, 4, 8, 16, 32, 64) is the value of G at the corner of the function which has flat value of T when G is above the corner. An adaptive controller, such as, for example, adaptive controller 102, may use the dynamically calculated T and loop constant K (described above) to generate updated values for $K_p$ and $K_n$. After T, $K_p$, and $K_n$ are updated, method 5900 returns to step 5910.

Figure 50:
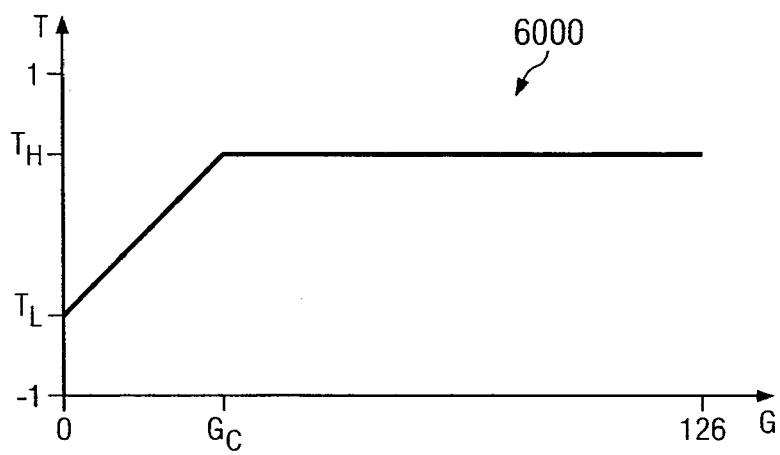
FIG. 50 is a graph illustrating the results of applying an example control target equation to dynamically generate a control target for an average value of a binary objective variable in an equilibrium state in equalizer gain control according to a particular embodiment of the invention.

FIG. 50 is a graph 6000 illustrating the results of applying an example control target equation to dynamically generate a control target for an average value of binary objective variable in an equilibrium state in equalizer gain control according to a particular embodiment of the invention. The example control target equation is the equation listed above for T(G). As can be observed, when the current value of the equalizer gain code, G, is equal to zero, the control target T equals the value for relatively low gain, $T_L$. When G is between 0 and $G_C$, the control target T may be set to an interpolated value between $T_L$ and the value for relatively high gain, $T_H$. When G is greater than $G_C$, the control target T equals $T_H$. It should be noted that, in alternative embodiments, different control target equations may be used, producing graphs that are different than that illustrated in graph 6000. It should also be noted again that although the present discussion describes the control target in terms of an average ISI level, the equalization level may be described and targeted in other suitable manners (and without necessarily tracking an average ISI level).

In particular embodiments, a high-frequency gain code G may be split among two or more of the paths in a multi-dimensional equalizer (e.g., paths 101A-C, above). For example, adaptive controller 102 may convert the high-frequency gain code G into a DC-path gain code and a first-order-path gain code. The high-frequency gain code G may be converted in any suitable manner, such as, for example, as described below in FIGS. 51 and 52.

FIG. 51 is a table illustrating an example scheme 6100 for converting a high-frequency gain code into a DC-path gain code and a first-order-path gain code according to a particular embodiment of the invention. Column 6110 of scheme 6100 includes values of the high-frequency gain code, G, which is to be converted into the DC-path gain code and the first-order-path gain code. Column 6120 includes values of the DC-path gain code, Go, and column 6130 includes values of the first-order-path gain code G. Each row 6140 includes a high-frequency gain code (or range of high-frequency gain codes) and corresponding DC-path and first-order path gain codes. It should be noted that, in scheme 6100, $G_0$MAX is the maximum value of the DC-path gain code specified in a register in adaptive controller 102. Also, the maximum value of the first-order-path gain codes is sixty-three in particular embodiments.

FIGS. 52A and 52B are graphs illustrating the results of applying the example scheme 6100 of FIG. 51 for converting a high-frequency gain code into a DC-path gain code and a first-order-path gain code according to a particular embodiment of the invention. FIG. 52A is a graph 6200 illustrating the DC-path gain code as a function of the high-frequency gain code. FIG. 52B is a graph 6300 illustrating the first-order-path gain code as a function of the high-frequency gain code. It should be noted that, in alternative embodiments, conversion schemes different than scheme 6100 may be used, producing graphs that are different than that illustrated in graphs 6200 and 6300.

Modifications, additions, or omissions may be made to the systems and methods described without departing from the scope of the invention. The components of the systems and methods described may be integrated or separated according to particular needs. Moreover, the operations of the systems and methods described may be performed by more, fewer, or other components.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims. For example, although several embodiments are illustrated and described in the context of gain control, alternative embodiments may additionally or alternatively be implemented in the context of offset control or any other suitable control parameter, where appropriate. Although several embodiments are illustrated and described in the context of offset control, alternative embodiments may additionally or alternatively be implemented in the context of gain control or any other suitable control parameter, where appropriate.

What is claimed is:

1. A method for adjusting a signal, comprising:
using an equalizer, applying at least one of a loss compensation for frequency-dependent distortion and an offset compensation for direct current offset ("DC-offset") distortion to a signal before or after the distortion occurs to generate an output signal, the output signal comprising even phase and odd phase;
using a sampler, selecting either the even phase or the odd phase at which to begin sampling;
using a clock signal, beginning at the selected phase, sampling the output signal at the sampler to generate a plurality of data values and an error value, the error value indicating residue of the distortion based on the sampling of the output signal;
using a controller, adjusting none, one, or more of the loss compensation and the offset compensation applied to the signal based on the sampled error value; and
using the controller, after adjusting the at least one of the loss compensation and the offset compensation applied to the signal based on the sampled error value, selecting either the even phase or the odd phase at which to begin the next sampling.

2. The method of claim 1, wherein the error value comprises either a high value or a low value.

3. The method of claim 1, wherein the error value comprises at least one boundary value sampled at a transition in value between two successive data values.

4. The method of claim 1, wherein the adjustment of compensation applied to the signal is further based on the high or low values of one or more sampled data values.

5. The method of claim 1, wherein:
the error value comprises a pulse-width value;
the pulse-width value is derived from two successive boundary values and an in-between data value in three successive data values with two transitions; and
the loss compensation applied to the data signal is adjusted based on the pulse-width value.

6. The method of claim 1, wherein the even phase and the odd phase are selected in sequence.

7. The method of claim 1, wherein the even phase and the odd phase are selected randomly.

8. A method for adjusting a signal, comprising:
using an equalizer, applying at least one of a loss compensation for frequency-dependent distortion and an offset compensation for direct current offset ("DC-offset") distortion to a signal before or after the distortion to generate an output signal;
using a sampler, selecting, in a random manner, a point in a first re-sampling cycle at which to begin sampling the output signal;
using a clock signal, beginning at the selected point, sampling the output signal at the sampler to generate a first set of data values and an error value, the error value indicating residue of the distortion based on the sampling of the output signal; and
using a controller, adjusting none, one, or more of the loss compensation and the offset compensation applied to the signal based on the sampled error value.

9. The method of claim 8, wherein the error value comprises either a high value or a low value.

10. The method of claim 8, wherein the error value comprises at least one boundary value sampled at a transition in value between two successive data values.

11. The method of claim 8, wherein the adjustment of compensation applied to the signal is further based on the high or low values of one or more sampled data values.

12. The method of claim 8, wherein:
the error value comprises a pulse-width value;
the pulse-width value is derived from two successive boundary values and an in-between data value in three successive data values with two transitions; and
the loss compensation applied to the data signal is adjusted based on the pulse-width value.

13. The method of claim 8, further comprising:
regardless of whether at least one of the loss compensation and the offset compensation is adjusted, selecting, in a random manner, a point in a second re-sampling cycle at which to begin sampling the output signal;
using the clock signal, beginning at the selected point, sampling the output signal in the second re-sampling cycle to generate a second set of data values and an error value; and
adjusting none, one, or more of the loss compensation and the offset compensation applied to the signal based on the error value of the second set.

14. The method of claim 8, wherein:
determining whether at least one of the loss compensation and the offset compensation applied to the signal is adjusted based on the error value of the first set;
if the at least one of the loss compensation and the offset compensation applied to the signal is not adjusted:

using the clock signal, beginning at a point corresponding to the selected point in the first re-sampling cycle, sampling the output signal in a second re-sampling cycle to generate a second set of data values and an error value;

adjusting none, one, or more of the loss compensation and the offset compensation applied to the signal based on the error value of the second set; and if the at least one of the loss compensation and the offset compensation applied to the signal is adjusted:

selecting, in a random manner, a point in the second re-sampling cycle at which to begin sampling the output signal;

using the clock signal, beginning at the selected point, sampling the output signal in the second re-sampling cycle to generate a second set of data values and an error value;

adjusting none, one, or more of the loss compensation and the offset compensation applied to the signal based on the error value of the second set.

15. A method for adjusting a signal, comprising:

using an equalizer, applying at least one of a loss compensation for frequency-dependent distortion and an offset compensation for direct current offset ("DC-offset") distortion to a signal to generate an output signal;

using a sampler, selecting a point in a first re-sampling cycle at which to begin sampling the output signal;

using the sampler, using a clock signal, beginning at the selected point, sampling the output signal in the first re-sampling cycle to generate a first set of data values and an error value, the error value indicating residue of the distortion based on the sampling of the output signal;

using a controller, adjusting none, one, or more of the loss compensation and the offset compensation applied to the signal based on the error value of the first set;

using the controller, determining whether at least one of the loss compensation and the offset compensation applied to the signal is adjusted based on the error value of the first set;

if the at least one of the loss compensation and the offset compensation applied to the signal is not adjusted:

using the clock signal, beginning at a point corresponding to the selected point in the first re-sampling cycle, sampling the output signal at the sampler in a second re-sampling cycle to generate a second set of data values and an error value;

using the controller, adjusting none, one, or more of the loss compensation and the offset compensation applied to the signal based on the error value of the second set; and if the at least one of the loss compensation and the offset compensation applied to the signal is adjusted:

using the clock signal, beginning at a point corresponding to the next point after the selected point in the first re-sampling cycle, sampling the output signal at the sampler in the second re-sampling cycle to generate a second set of data values and an error value; and using the controller, adjusting none, one, or more of the loss compensation and the offset compensation applied to the signal based on the error value of the second set.

16. The method of claim 15, wherein the error value comprises either a high value or a low value.

17. The method of claim 15, wherein the error value comprises at least one boundary value sampled at a transition in value between two successive data values.

18. The method of claim 15, wherein the adjustment of compensation applied to the signal is further based on the high or low values of one or more of the sampled data values.

19. The method of claim 15, wherein:

the error value comprises a pulse-width value;

the pulse-width value is derived from two successive boundary values and an in-between data value in three successive data values with two transitions; and the loss compensation applied to the data signal is adjusted based on the pulse-width value.

20. The method of claim 15, wherein the next point after the selected point in the first re-sampling cycle comprises the next point in a list of re-sampling points.

21. The method of claim 15, wherein the next point after the selected point in the first re-sampling cycle comprises the chronologically former point before the selected point in the first re-sampling cycle.

22. An adaptive equalizer, comprising:

an equalizer configured to apply at least one of a loss compensation for frequency-dependent distortion and an offset compensation for direct current offset ("DC-offset") distortion to a signal before or after the distortion occurs to generate an output signal, the output signal comprising even phase and odd phase;

a sampler configured to:

receive the output signal and a clock signal;

select either the even phase or the odd phase at which to begin sampling; and using the clock signal, beginning at the selected phase, sample the output signal to generate a plurality of data values and an error value, the error value indicating residue of the distortion based on the sampling of the output signal; and a controller configured to:

adjust none, one, or more of the loss compensation and the offset compensation applied to the signal based on the sampled error value; and after adjusting the at least one of the loss compensation and the offset compensation applied to the signal based on the sampled error value, select either the even phase or the odd phase at which to begin the next sampling.

23. The adaptive equalizer of claim 22, wherein the error value comprises either a high value or a low value.

24. The adaptive equalizer of claim 22, wherein the error value comprises at least one boundary value sampled at a transition in value between two successive data values.

25. The adaptive equalizer of claim 22, wherein the controller is further configured to adjust the compensation applied to the signal based on the high or low values of one or more sampled data values.

26. The adaptive equalizer of claim 22, wherein:

the error value comprises a pulse-width value;

the pulse-width value is derived from two successive boundary values and an in-between data value in three successive data values with two transitions; and the loss compensation applied to the data signal is adjusted based on the pulse-width value.

27. The adaptive equalizer of claim 22, wherein the even phase and the odd phase are selected in sequence.

28. The adaptive equalizer of claim 22, wherein the even phase and the odd phase are selected randomly.

29. An adaptive equalizer, comprising:

an equalizer configured to apply at least one of a loss compensation for frequency-dependent distortion and an offset compensation for direct current offset ("DC-offset") distortion to a signal before or after the distortion occurs to generate an output signal;

a sampler configured to:
    receive the output signal and a clock signal;
    select, in a random manner, a point in a first re-sampling cycle at which to begin sampling the output signal; and
    using the clock signal, beginning at the selected point, sample the output signal to generate a first set of data values and an error value, the error value indicating residue of the distortion based on the sampling of the output signal; and a controller configured to adjust none, one, or more of the loss compensation and the offset compensation applied to the signal based on the sampled error value.

30. The adaptive equalizer of claim 29, wherein the error value comprises either a high value or a low value.

31. The adaptive equalizer of claim 29, wherein the error value comprises at least one boundary value sampled at a transition in value between two successive data values.

32. The adaptive equalizer of claim 29, wherein the controller is further configured to adjust the compensation applied to the signal based on the high or low values of one or more sampled data values.

33. The adaptive equalizer of claim 29, wherein:
the error value comprises a pulse-width value;
the pulse-width value is derived from two successive boundary values and an in-between data value in three successive data values with two transitions; and
the loss compensation applied to the data signal is adjusted based on the pulse-width value.

34. The adaptive equalizer of claim 29, wherein:
the sampler is further configured to:
    regardless of whether at least one of the loss compensation and the offset compensation is adjusted, select, in a random manner, a point in a second re-sampling cycle at which to begin sampling the output signal; and
    using the clock signal, beginning at the selected point, sample the output signal in the second re-sampling cycle to generate a second set of data values and an error value; and
the controller is further configured to adjust none, one, or more of the loss compensation and the offset compensation applied to the signal based on the error value of the second set.

35. The adaptive equalizer of claim 29, wherein:
the controller is further configured to determine whether at least one of the loss compensation and the offset compensation applied to the signal is adjusted based on the error value of the first set;
if the at least one of the loss compensation and the offset compensation applied to the signal is not adjusted:
    the sampler is further configured to, using the clock signal and beginning at a point corresponding to the selected point in the first re-sampling cycle, sample the output signal in a second re-sampling cycle to generate a second set of data values and an error value; and
    the controller is further configured to adjust none, one, or more of the loss compensation and the offset compensation applied to the signal based on the error value of the second set; and
if the at least one of the loss compensation and the offset compensation applied to the signal is adjusted:
    the sampler is further configured to:
        select, in a random manner, a point in the second re-sampling cycle at which to begin sampling the output signal; and
        using the clock signal, beginning at the selected point, sample the output signal in the second re-sampling cycle to generate a second set of data values and an error value; and
    the controller is further configured to adjust none, one, or more of the loss compensation and the offset compensation applied to the signal based on the error value of the second set.

36. An adaptive equalizer, comprising:
an equalizer configured to apply at least one of a loss compensation for frequency-dependent distortion and an offset compensation for direct current offset ("DC-offset") distortion to a signal before or after the distortion occurs to generate an output signal;
a sampler configured to:
    receive the output signal and a clock signal;
    select a point in a first re-sampling cycle at which to begin sampling the output signal; and
    using the clock signal, beginning at the selected point in the first re-sampling cycle, sample the output signal to generate a first set of data values and an error value, the error value indicating residue of the distortion based on the sampling of the output signal; and
a controller configured to:
    adjust none, one, or more of the loss compensation and the offset compensation applied to the signal based on the error value of the first set; and
    determine whether at least one of the loss compensation and the offset compensation applied to the signal is adjusted based on the error value of the first set;
wherein if the at least one of the loss compensation and the offset compensation applied to the signal is not adjusted:
    the sampler is further configured to, using the clock signal and beginning at a point corresponding to the selected point in the first re-sampling cycle, sample the output signal in a second re-sampling cycle to generate a second set of data values and an error value; and
    the controller is further configured to adjust none, one, or more of the loss compensation and the offset compensation applied to the signal based on the error value of the second set; and
wherein if the at least one of the loss compensation and the offset compensation applied to the signal is adjusted:
    the sampler is further configured to, using the clock signal and beginning at a point corresponding to the next point after the selected point in the first re-sampling cycle, sample the output signal in the second re-sampling cycle to generate a second set of data values and an error value; and
    the controller is further configured to adjust none, one, or more of the loss compensation and the offset compensation applied to the signal based on the error value of the second set.

37. The adaptive equalizer of claim 36, wherein the error value comprises either a high value or a low value.

38. The adaptive equalizer of claim 36, wherein the error value comprises at least one boundary value sampled at a transition in value between two successive data values.

39. The adaptive equalizer of claim 36, wherein the controller is further configured to adjust the compensation applied to the signal based on the high or low values of one or more sampled data values.

40. The adaptive equalizer of claim 36, wherein:
the error value comprises a pulse-width value;
the pulse-width value is derived from two successive boundary values and an in-between data value in three successive data values with two transitions; and
the loss compensation applied to the data signal is adjusted based on the pulse-width value.

41. The adaptive equalizer of claim 36, wherein the next point after the selected point in the first re-sampling cycle comprises the next point in a list of re-sampling points.

42. The adaptive equalizer of claim 36, wherein the next point after the selected point in the first re-sampling cycle comprises the chronologically former point before the selected point in the first re-sampling cycle.

43. A method for adjusting a signal, comprising:
using an equalizer, applying at least one of a loss compensation for frequency-dependent distortion and an offset compensation for direct current offset ("DC-offset") distortion to a signal before or after the distortion occurs to generate an output signal;
using a sampler, selecting a point in a first re-sampling cycle at which to begin sampling the output signal;
using a clock signal, beginning at the selected point, sampling the output signal at the sampler to generate a first set of data values and an error value, the error value indicating residue of the distortion based on the sampling of the output signal;
randomly generating a number for the selected point using a pseudo-random number generator; and
using a controller, determining whether to adjust at least one of the loss compensation and the offset compensation applied to the signal based on:
one or more of the first set of sampled data values and error value; and
the value of the number randomly generated for the selected point.

44. An adaptive equalizer, comprising:
an equalizer configured to apply at least one of a loss compensation for frequency-dependent distortion and an offset compensation for direct current offset ("DC-offset") distortion to a signal before or after the distortion occurs to generate an output signal;
a sampler configured to:
receive the output signal and a clock signal;
select a point in a first re-sampling cycle at which to begin sampling the output signal; and
using a clock signal, beginning at the selected point, sample the output signal to generate a first set of data values and an error value, the error value indicating residue of the distortion based on the sampling of the output signal;
a pseudo-random number generator configured to randomly generate a number for the selected point; and
a controller configured to determine whether to adjust at least one of the loss compensation and the offset compensation applied to the signal based on:
one or more of the first set of sampled data values and error value; and
the value of the number randomly generated for the selected point.

* * * * *